United States Patent
Weis

(10) Patent No.: US 8,093,641 B2
(45) Date of Patent: *Jan. 10, 2012

(54) STORAGE CAPACITOR AND METHOD OF MANUFACTURING A STORAGE CAPACITOR

(75) Inventor: Rolf Weis, Dresden (DE)

(73) Assignee: Qimonda AG, Munich (DE)

( * ) Notice: Subject to any disclaimer, the term of this patent is extended or adjusted under 35 U.S.C. 154(b) by 1147 days.

This patent is subject to a terminal disclaimer.

(21) Appl. No.: 11/856,409

(22) Filed: Sep. 17, 2007

(65) Prior Publication Data

US 2008/0001201 A1    Jan. 3, 2008

Related U.S. Application Data

(63) Continuation of application No. 11/039,740, filed on Jan. 20, 2005, now Pat. No. 7,271,058.

(51) Int. Cl.
*H01L 21/20* (2006.01)

(52) U.S. Cl. .................. 257/306; 438/253; 438/396

(58) Field of Classification Search .......... 257/71, 257/296, 300, 306, 307, 309, 528 E23.142; 438/396, 253
See application file for complete search history.

(56) References Cited

U.S. PATENT DOCUMENTS

| | | | |
|---|---|---|---|
| 5,434,439 A | 7/1995 | Ajika et al. | |
| 5,561,310 A | 10/1996 | Woo et al. | |
| 5,716,884 A | 2/1998 | Hsue et al. | |
| 5,817,553 A * | 10/1998 | Stengl et al. | 438/253 |
| 5,858,838 A | 1/1999 | Wang et al. | |
| 5,956,594 A * | 9/1999 | Yang et al. | 438/396 |
| 6,127,220 A * | 10/2000 | Lange et al. | 438/254 |
| 6,174,768 B1 * | 1/2001 | Takaishi | 438/253 |
| 6,204,119 B1 * | 3/2001 | Lange et al. | 438/254 |
| 6,300,186 B1 * | 10/2001 | Hirota et al. | 438/239 |
| 6,362,042 B1 | 3/2002 | Hosotani et al. | |
| 6,483,194 B2 | 11/2002 | Sakao | |
| 6,506,645 B2 | 1/2003 | Iyer et al. | |
| 6,597,033 B1 | 7/2003 | Nakamura | |
| 6,670,662 B1 * | 12/2003 | Dehm et al. | 257/296 |
| 6,825,129 B2 | 11/2004 | Hong | |
| 6,844,581 B2 * | 1/2005 | Sitaram et al. | 257/295 |
| 6,878,600 B2 | 4/2005 | Birner et al. | |
| 6,995,416 B2 | 2/2006 | Reisinger et al. | |
| 7,271,058 B2 * | 9/2007 | Weis | 438/253 |
| 7,829,410 B2 * | 11/2010 | Plum | 438/244 |
| 2006/0038217 A1 * | 2/2006 | Mikawa et al. | 257/306 |
| 2006/0063367 A1 * | 3/2006 | Shimada et al. | 438/618 |

OTHER PUBLICATIONS

Jaegoo Lee et al., "Robust Memory Cell Capacitor using Multi-Stack Storage Node for High Performance in 90nm Technology and Beyond", 2003 Symposium on VLSI Technology Digest of Technical Papers (2 pgs).

* cited by examiner

*Primary Examiner* — Steven Loke
*Assistant Examiner* — David Goodwin
(74) *Attorney, Agent, or Firm* — Dicke, Billig & Czaja, PLLC

(57) ABSTRACT

An integrated circuit including a storage capacitor suitable for use in a DRAM cell, as well as to a method of manufacturing such a storage capacitor is disclosed. The storage capacitor is formed at least partially above a semiconductor substrate surface. The invention also includes a memory array employing the storage capacitor.

22 Claims, 55 Drawing Sheets

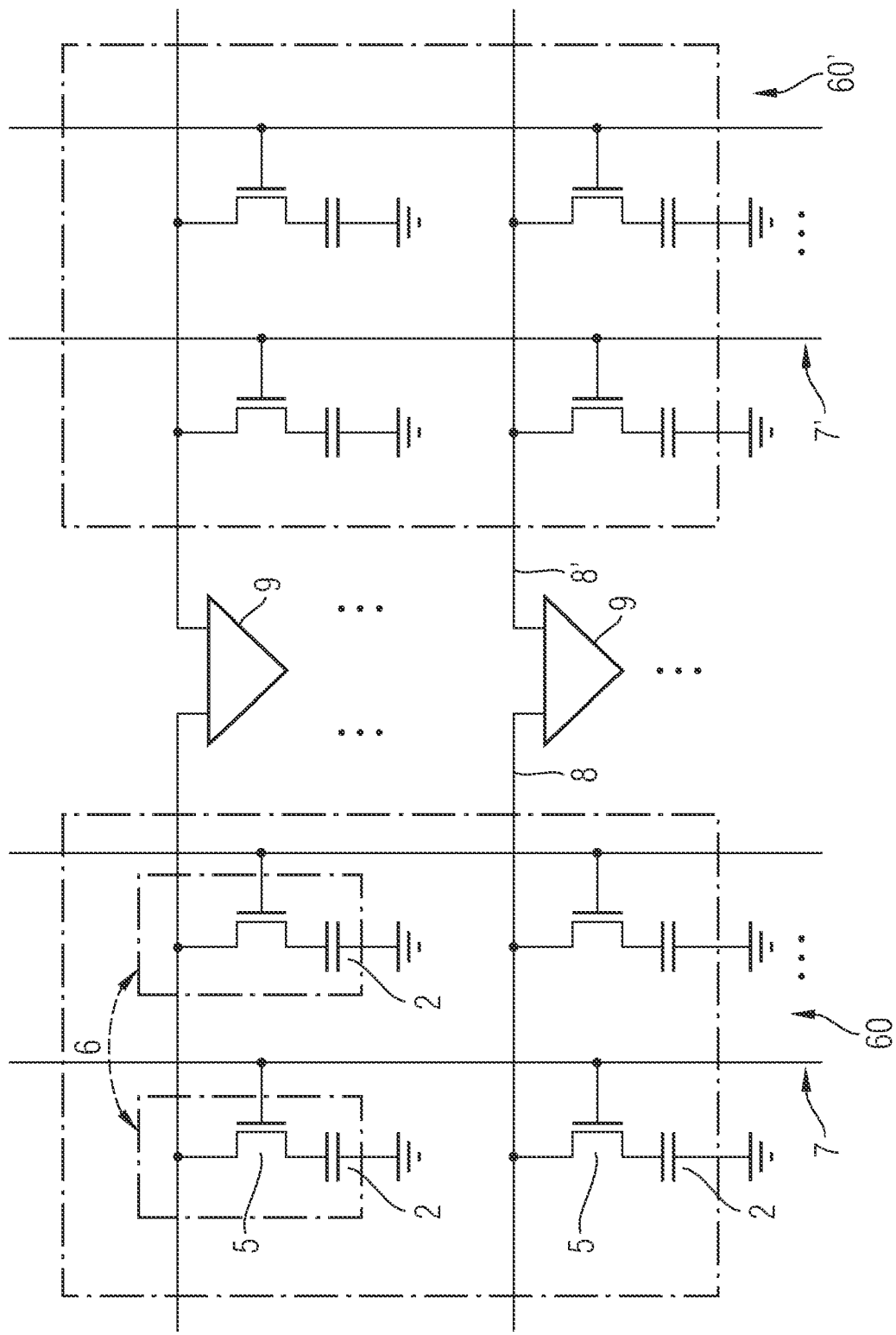

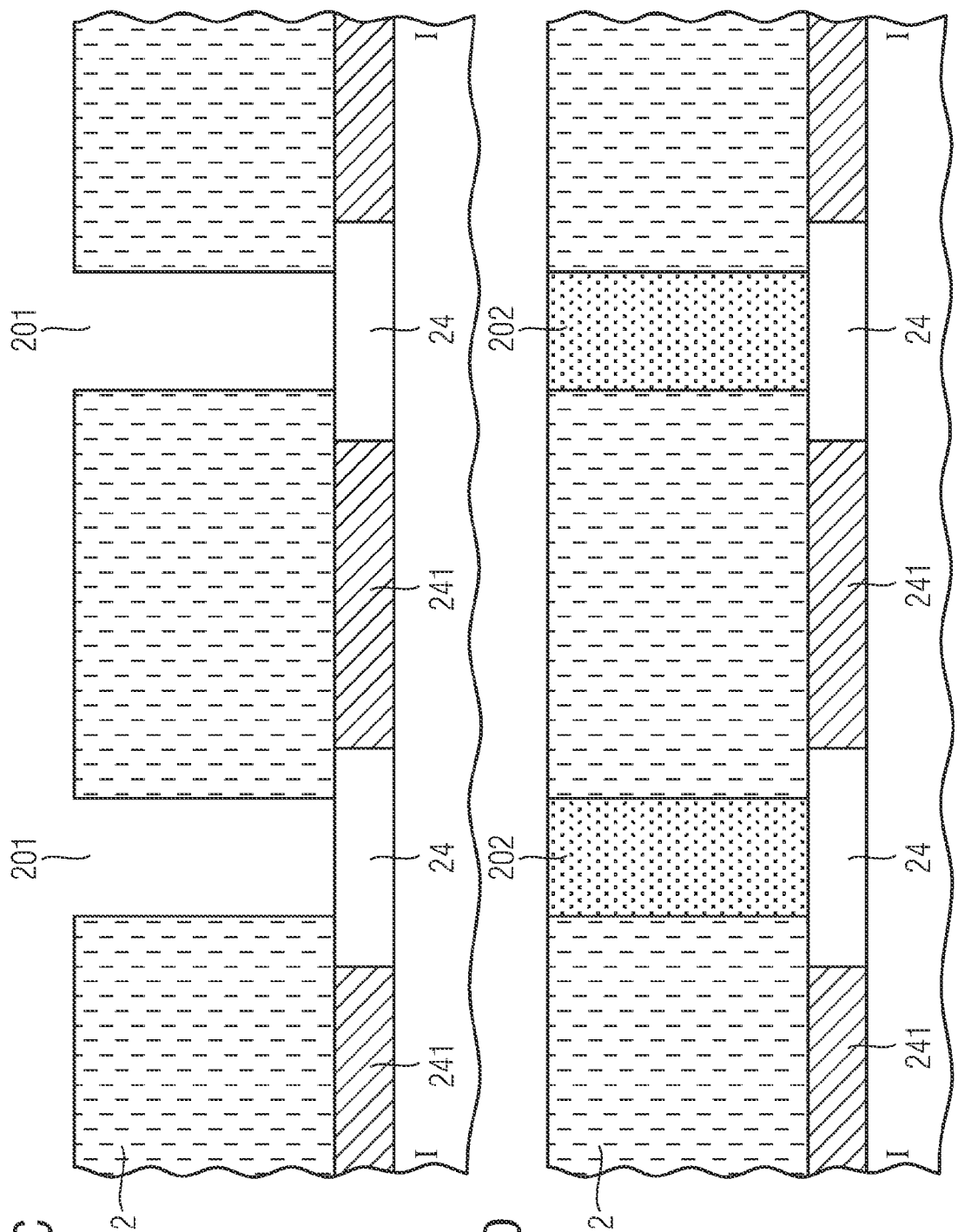

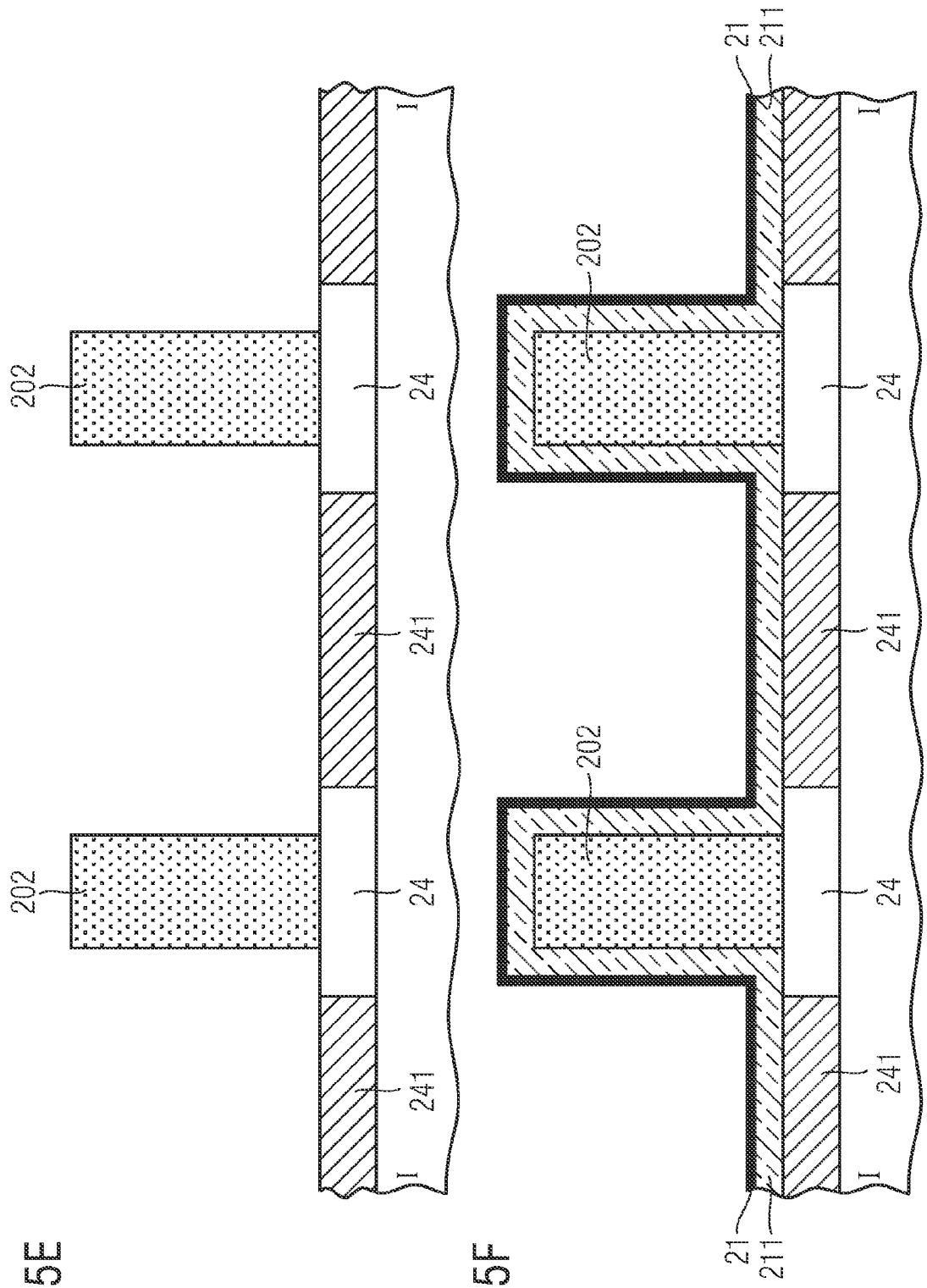

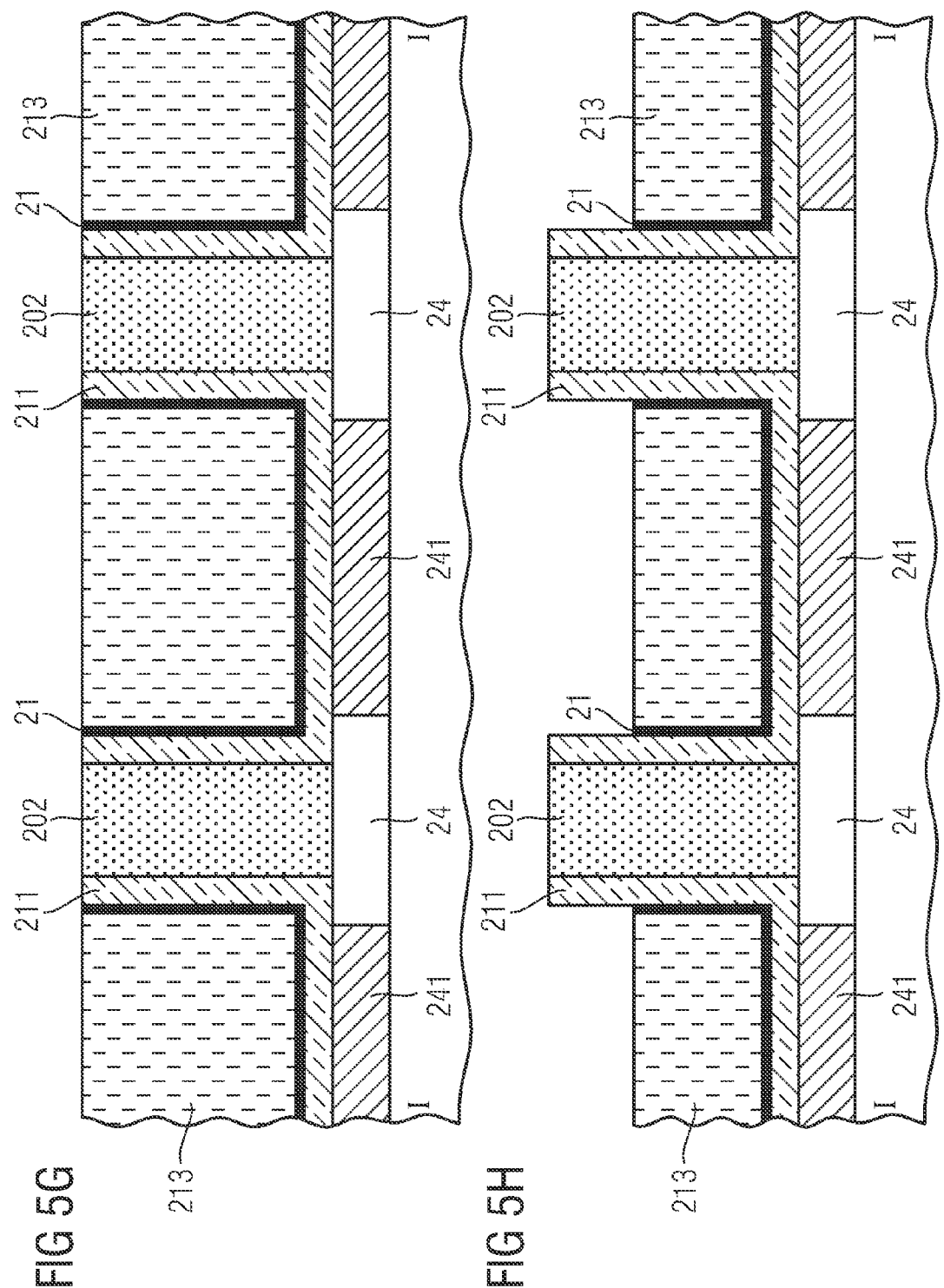

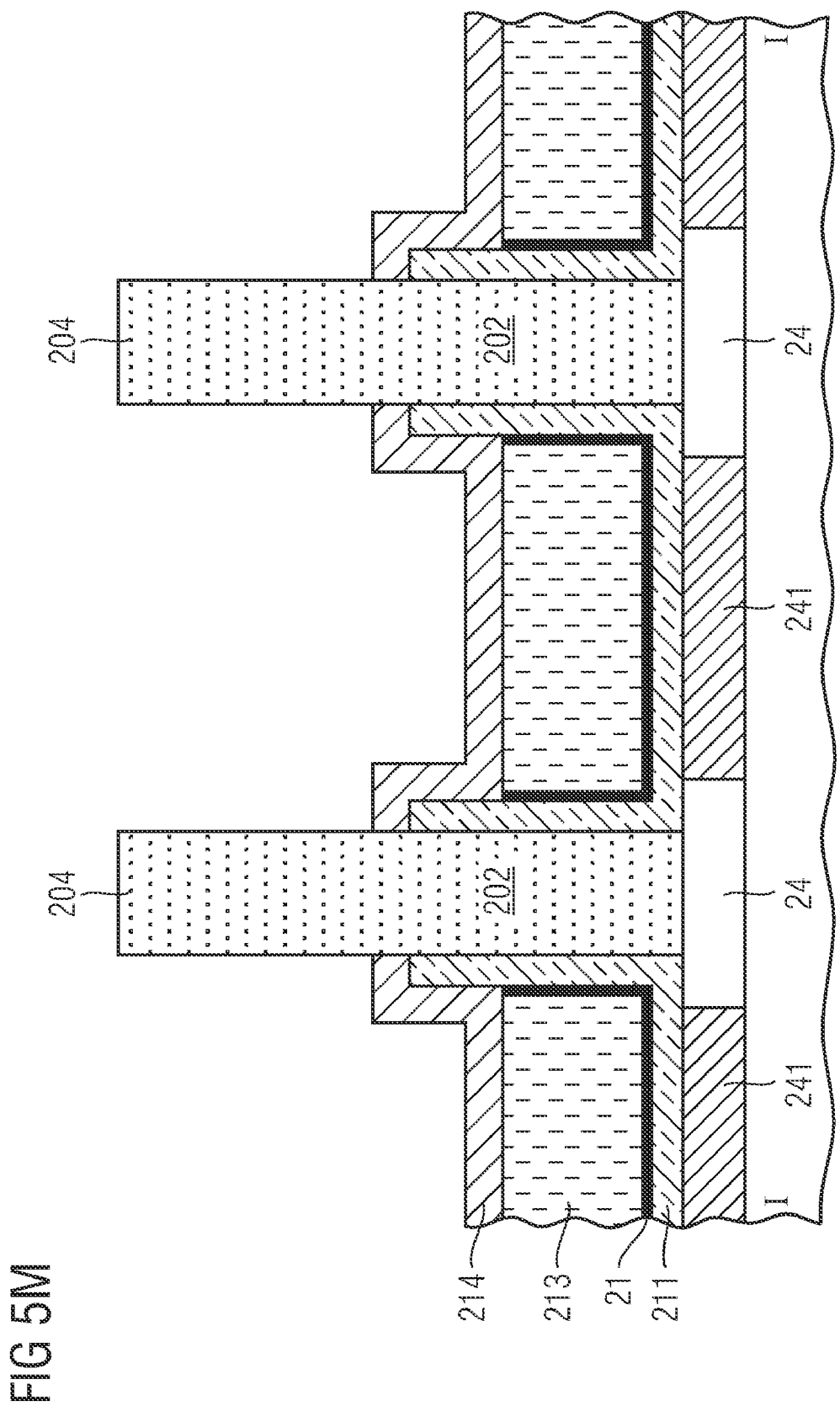

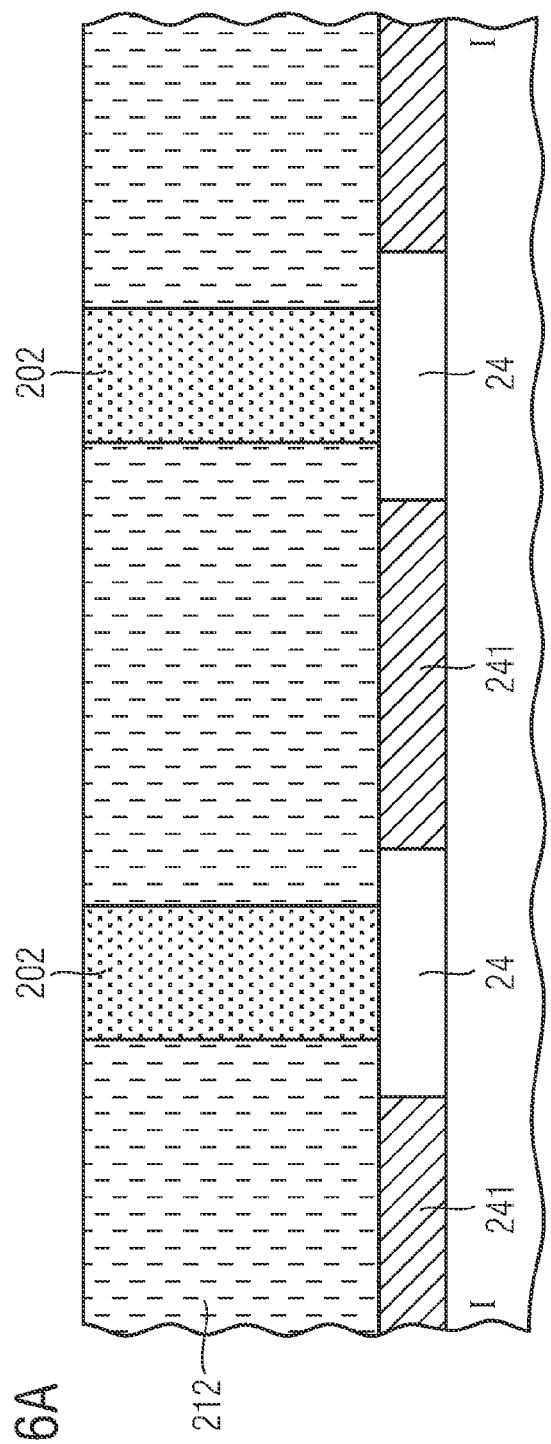
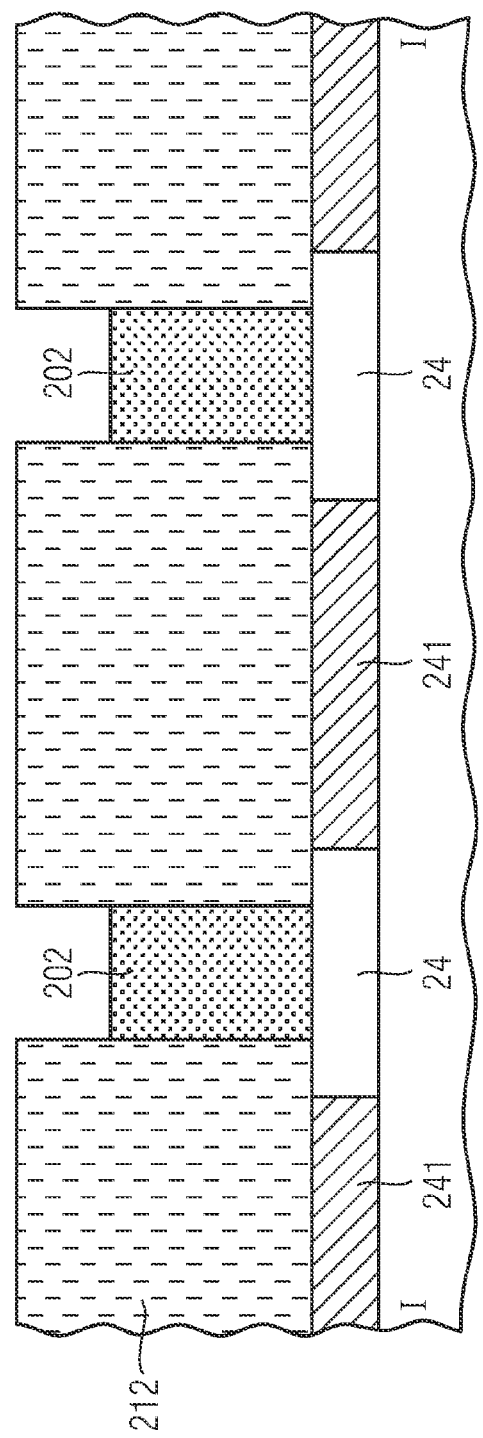

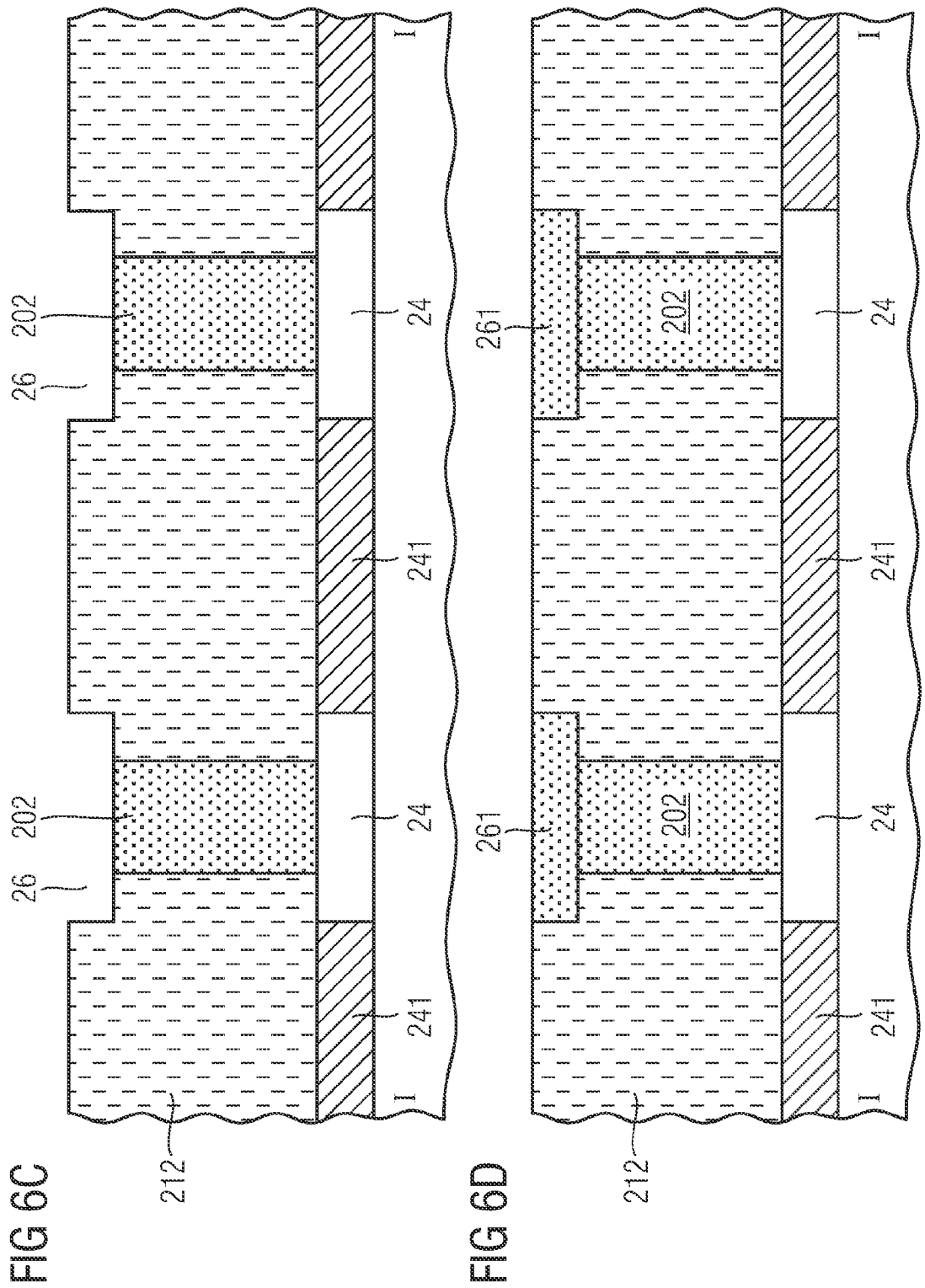

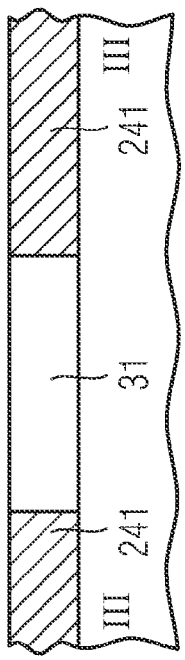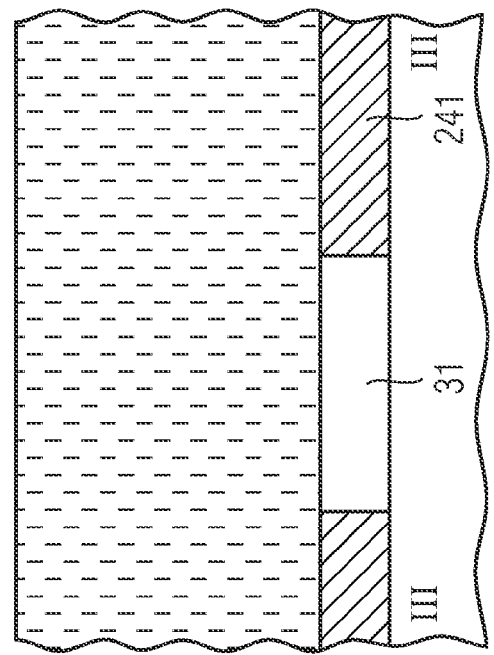
FIG 7A
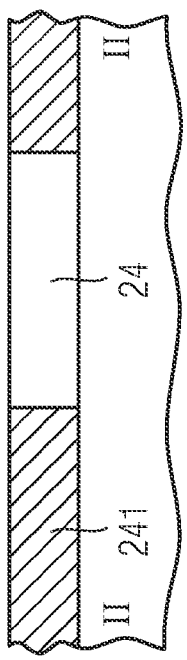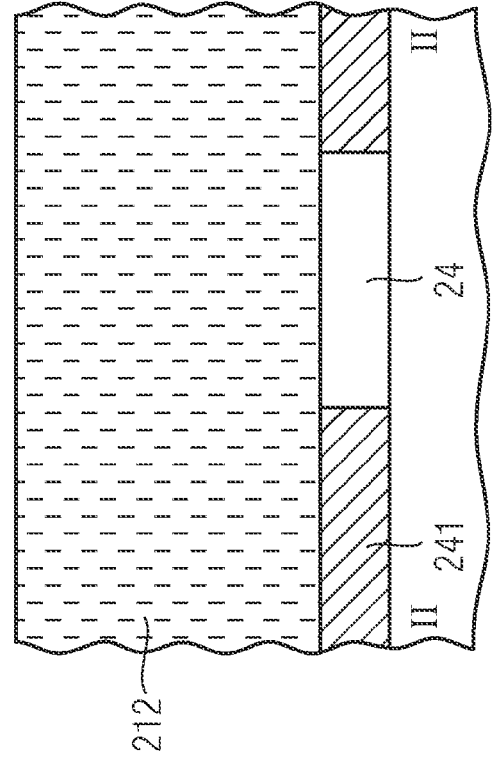
FIG 7B

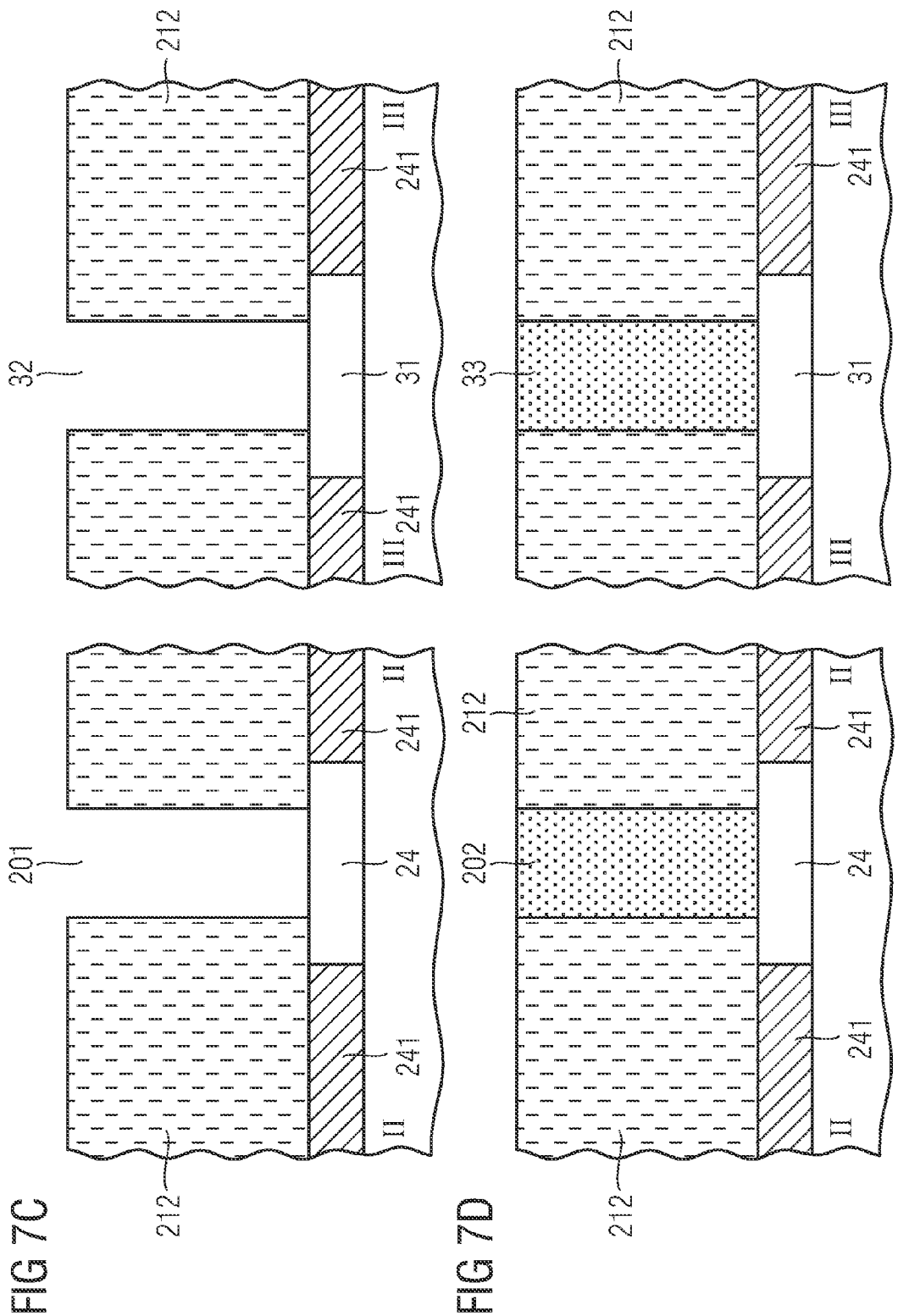

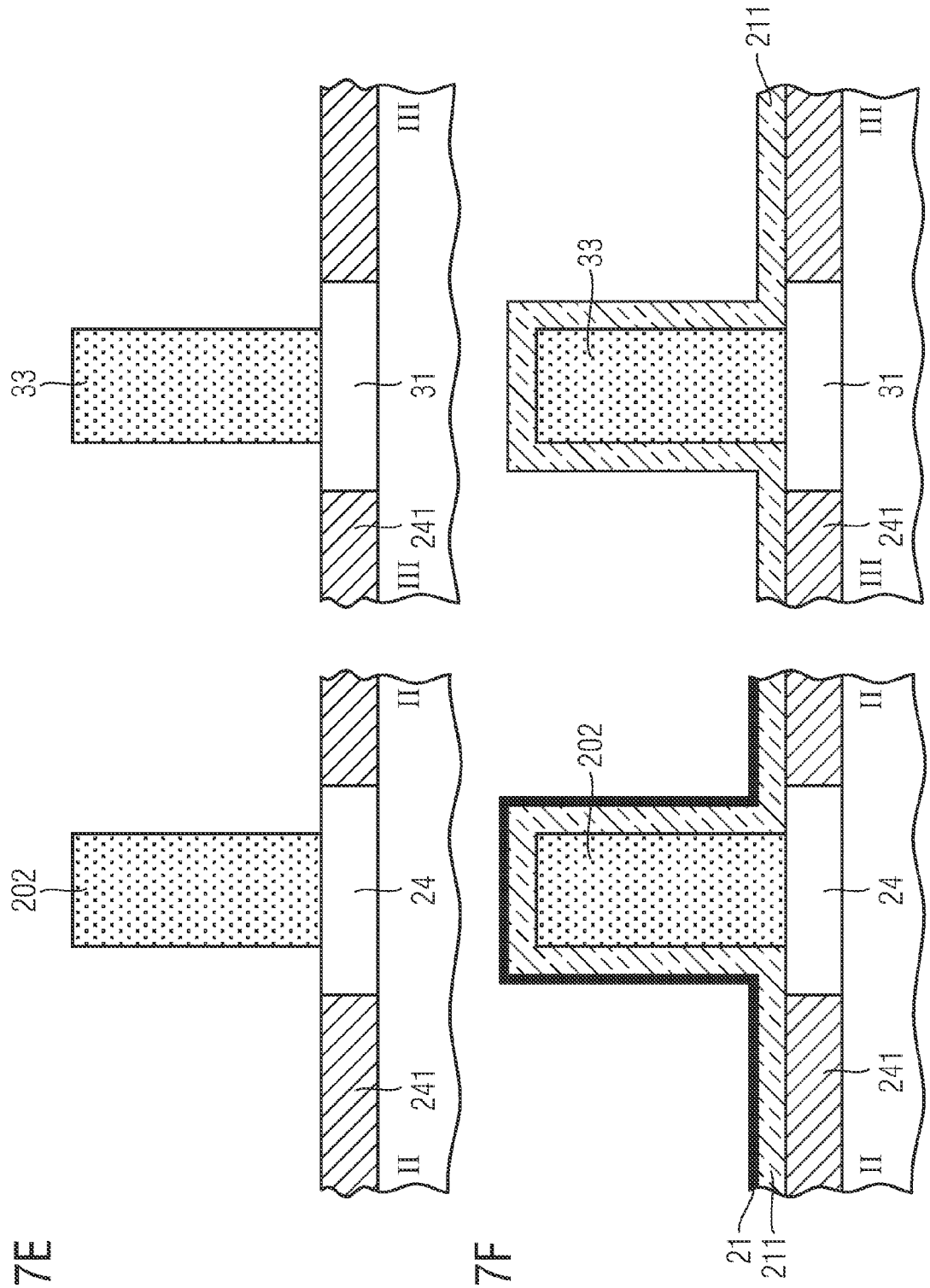

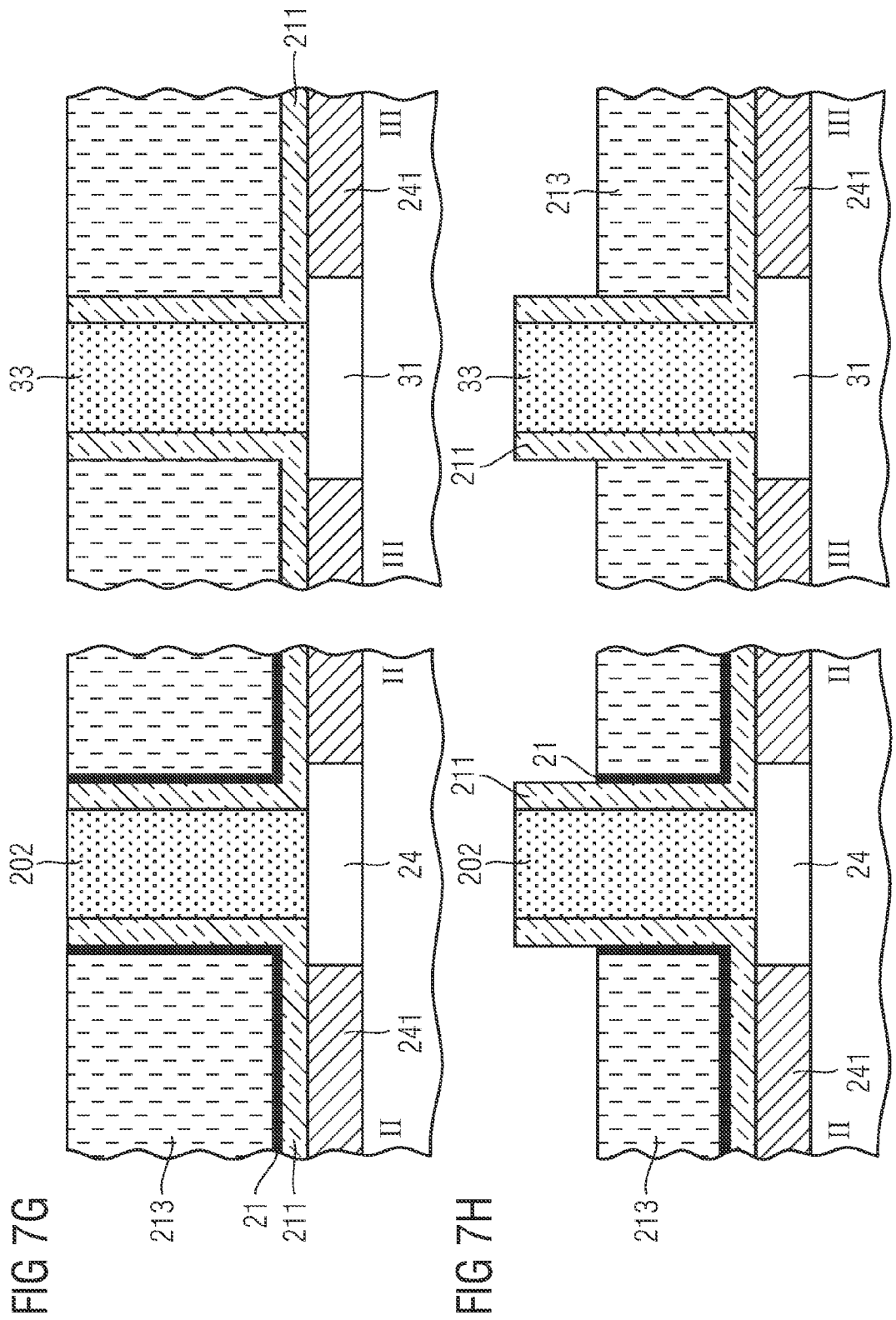

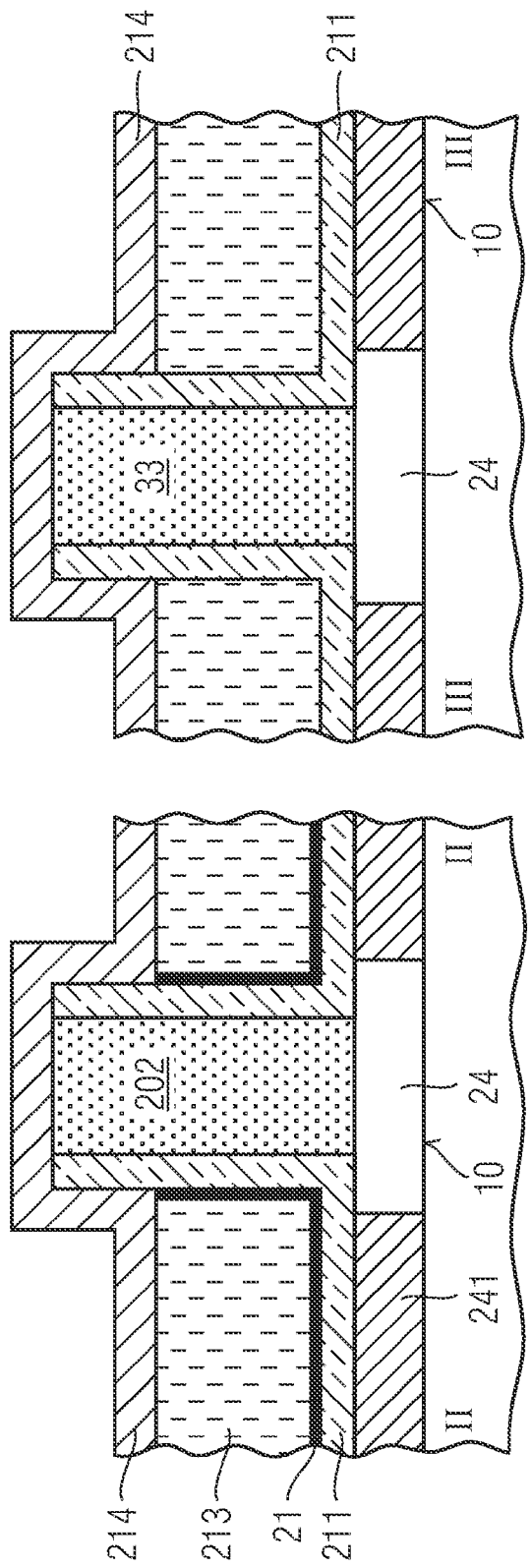

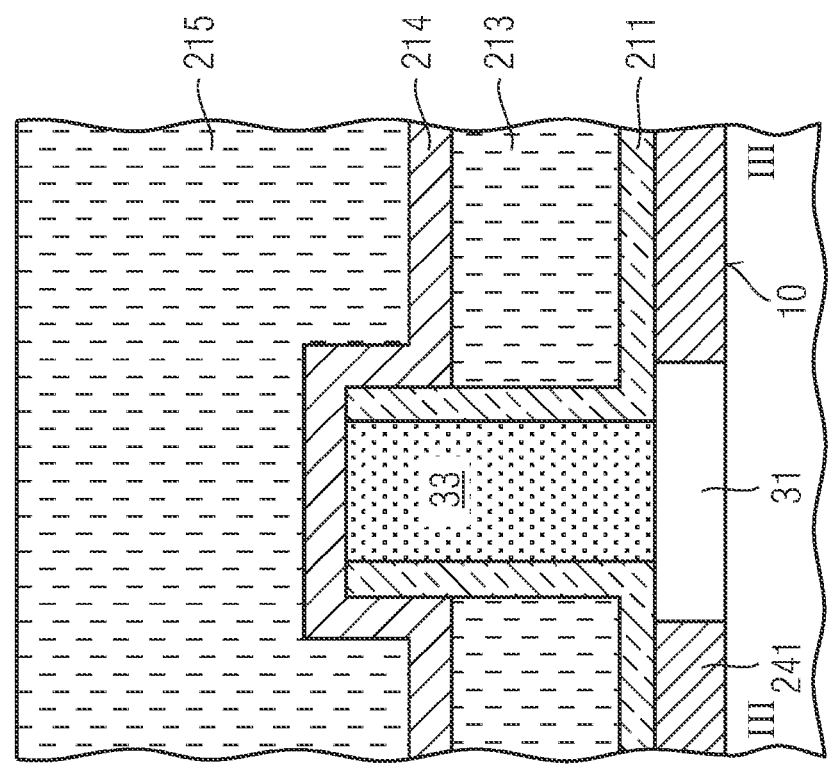
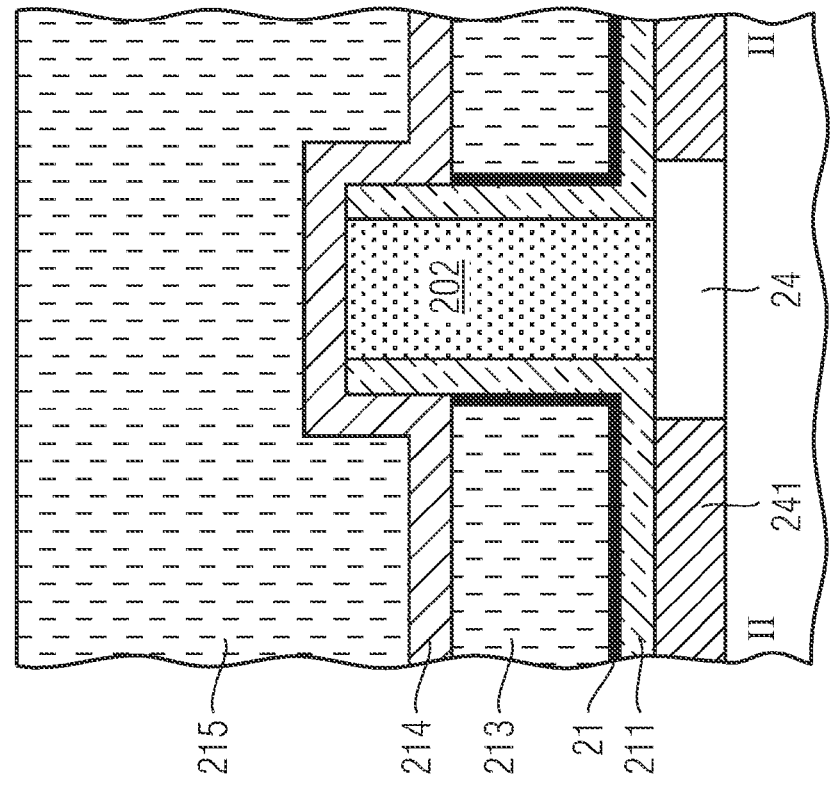
FIG 7J

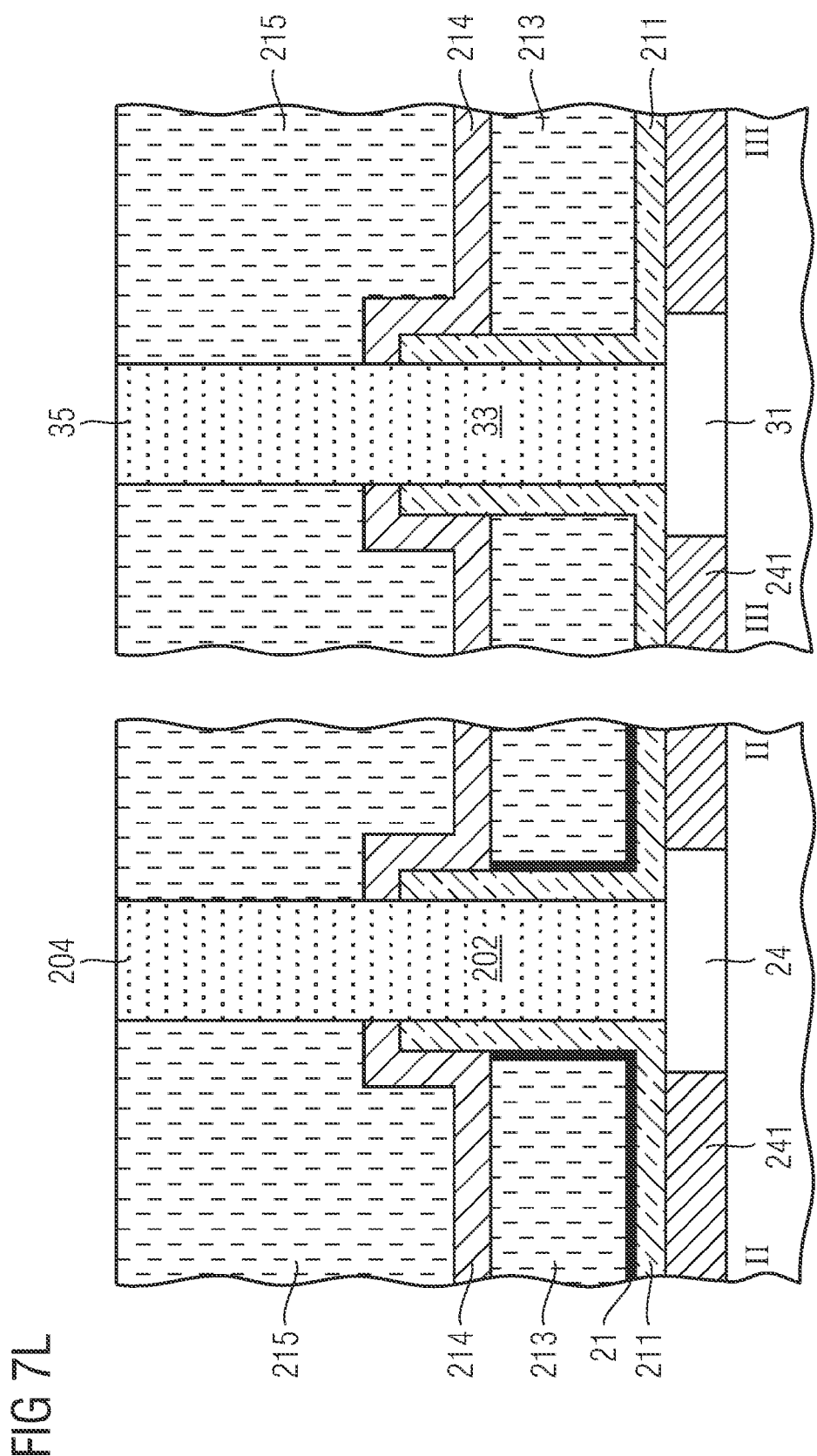

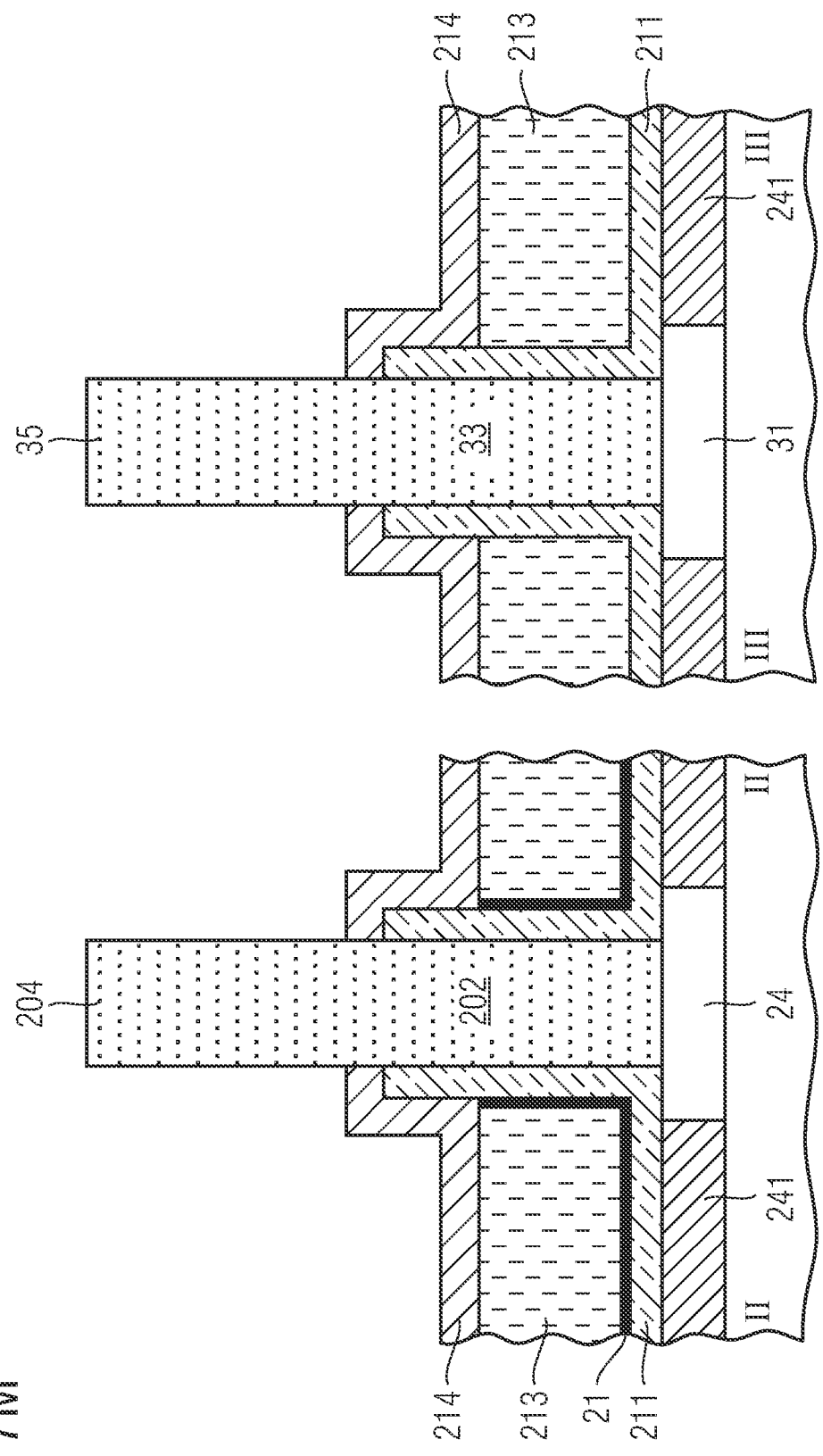

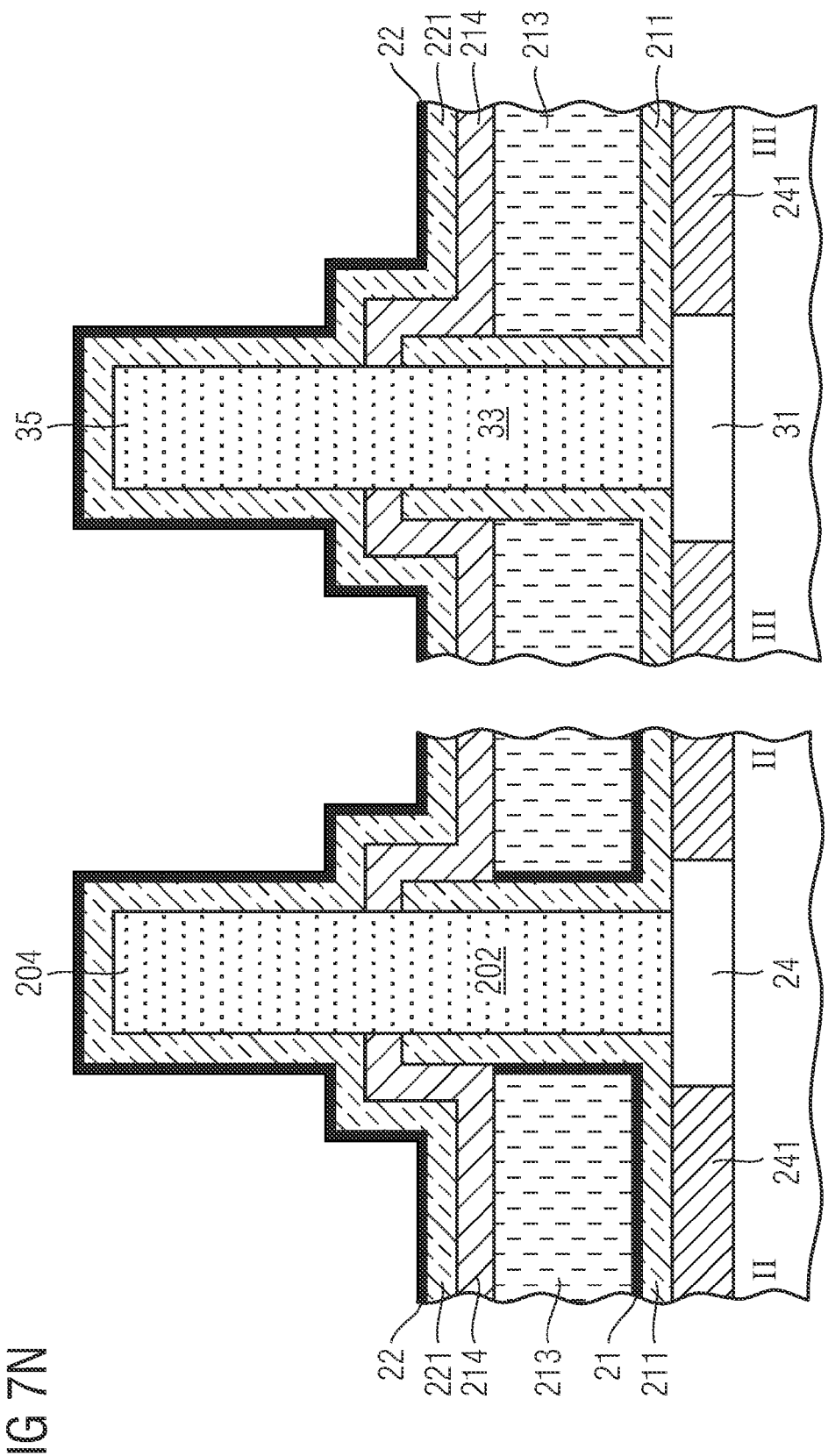

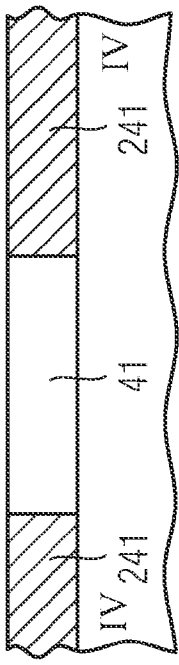
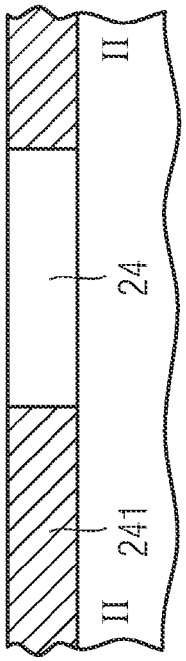
FIG 8A
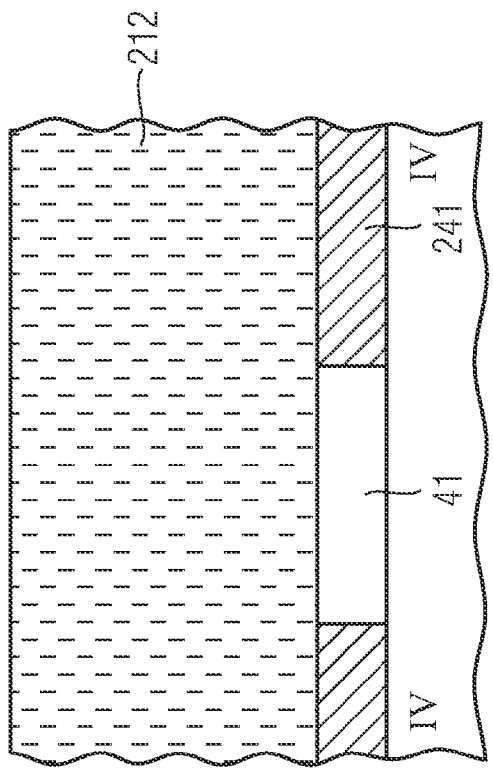
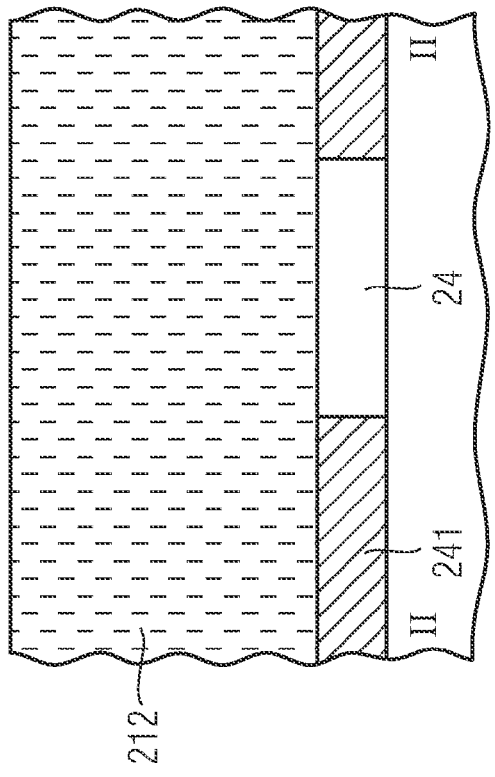
FIG 8B

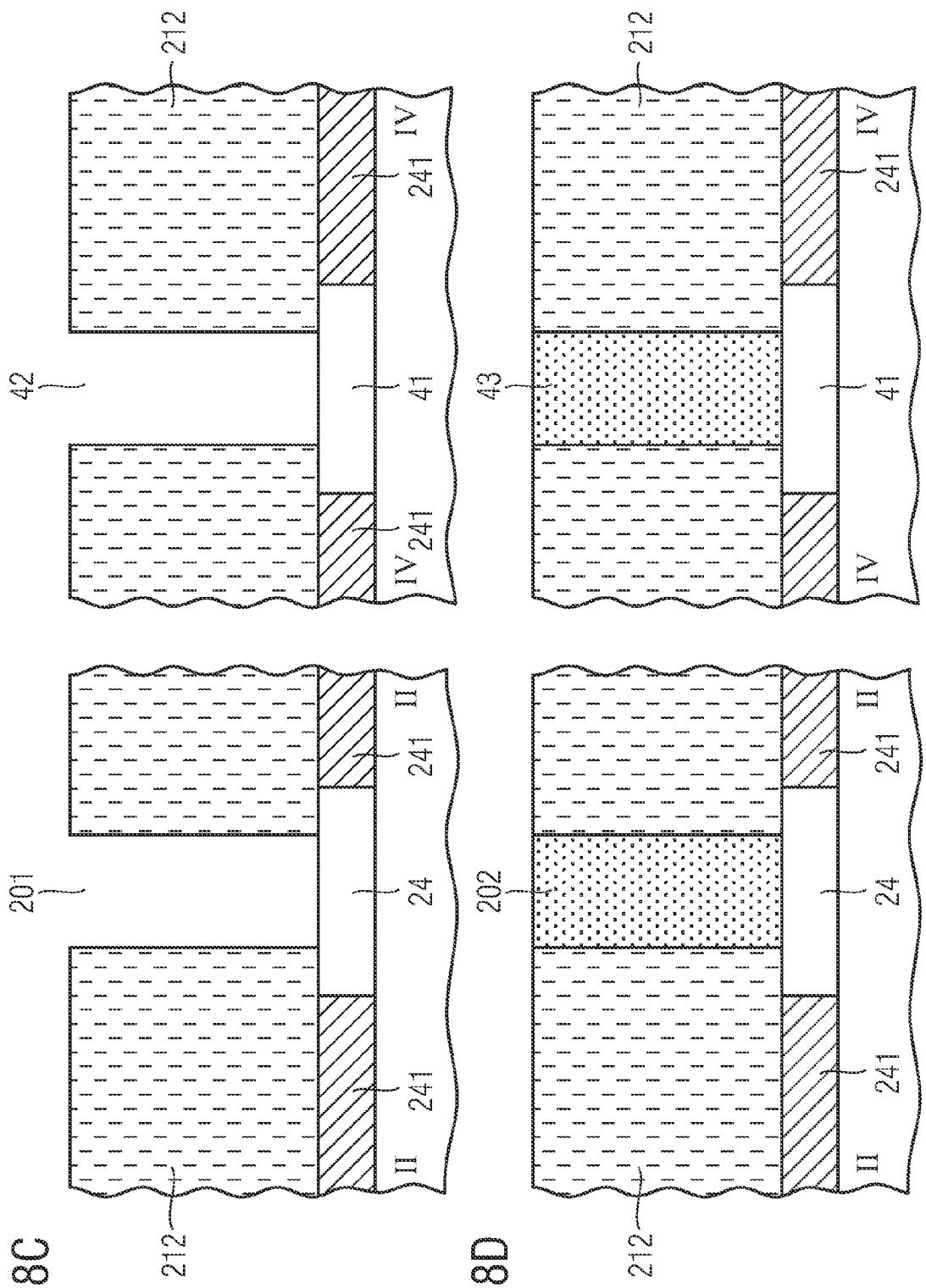

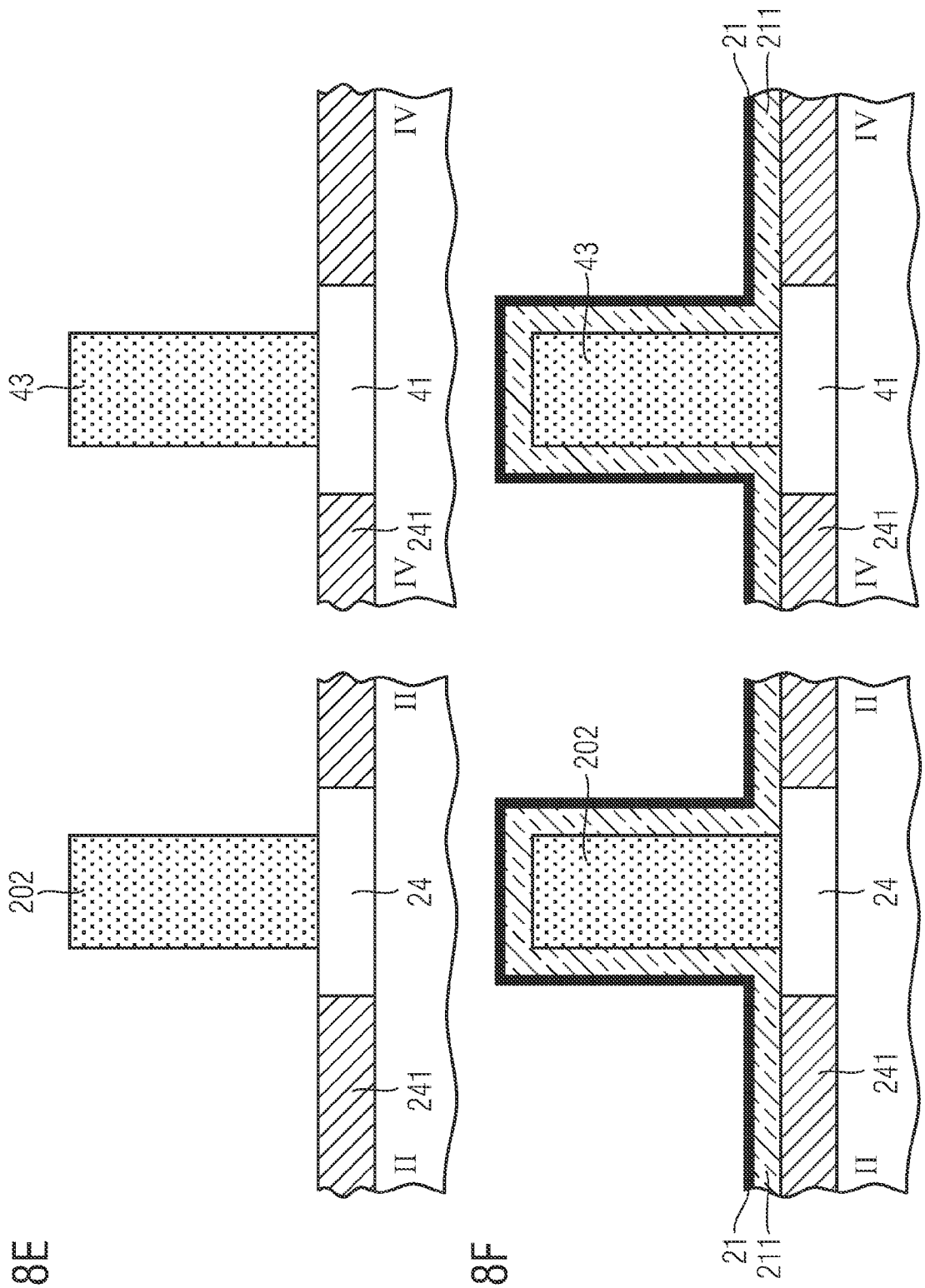

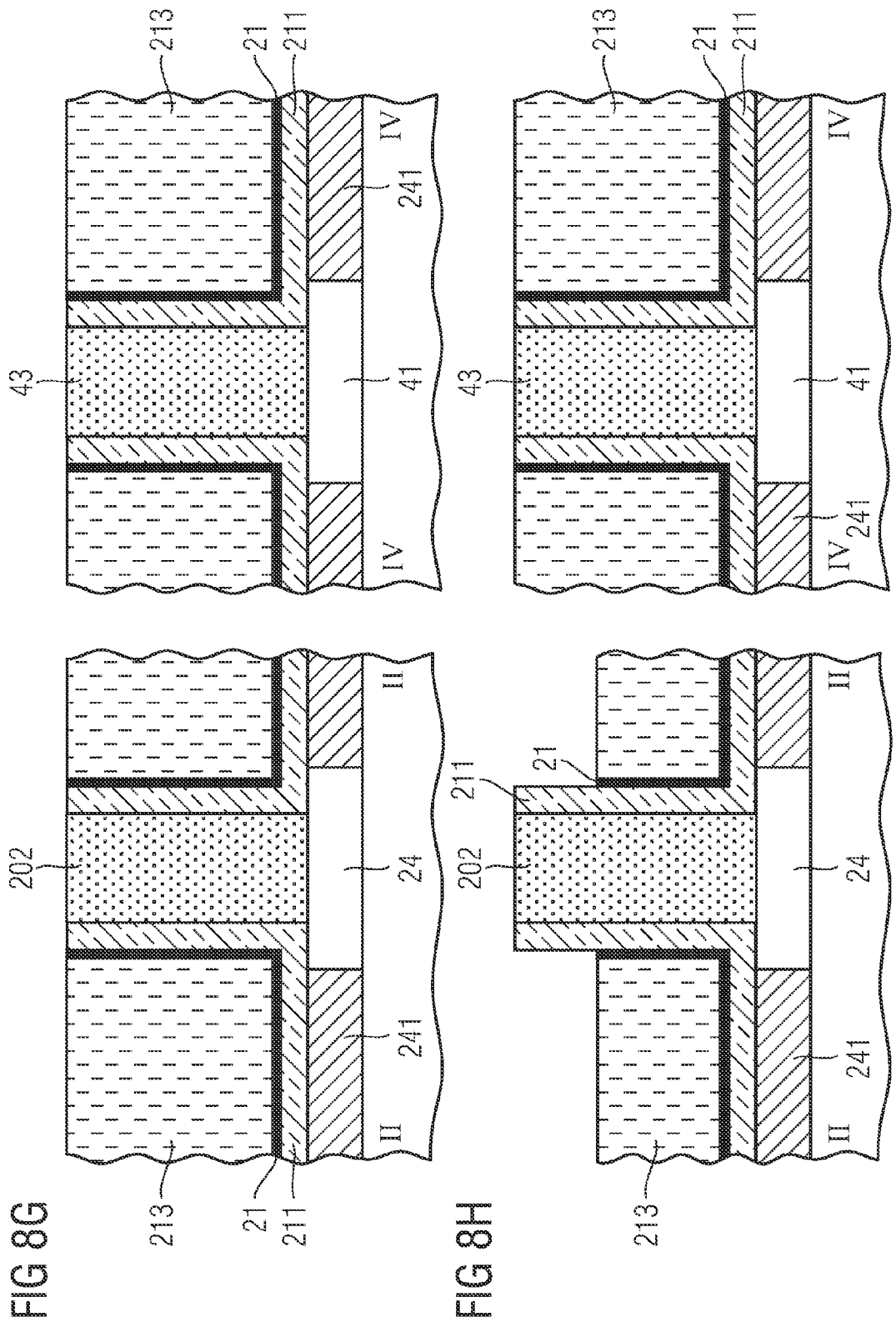

FIG 8J
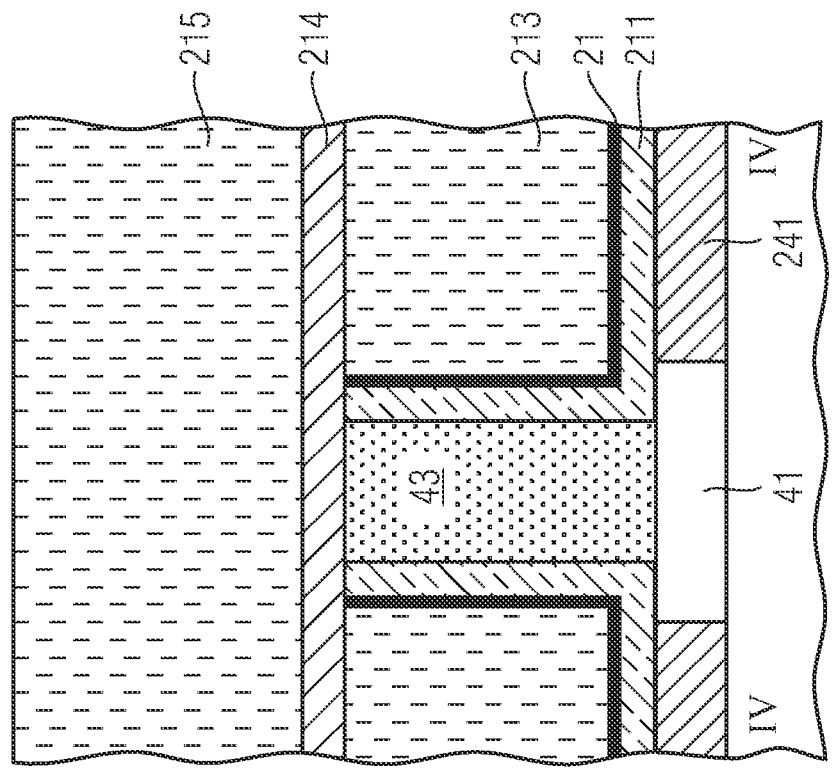
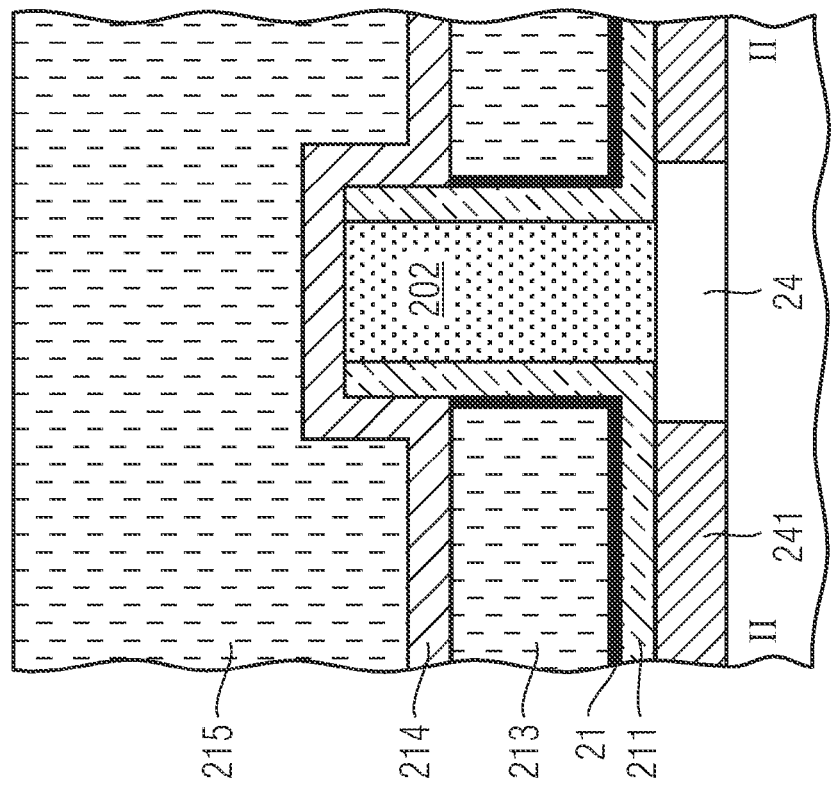

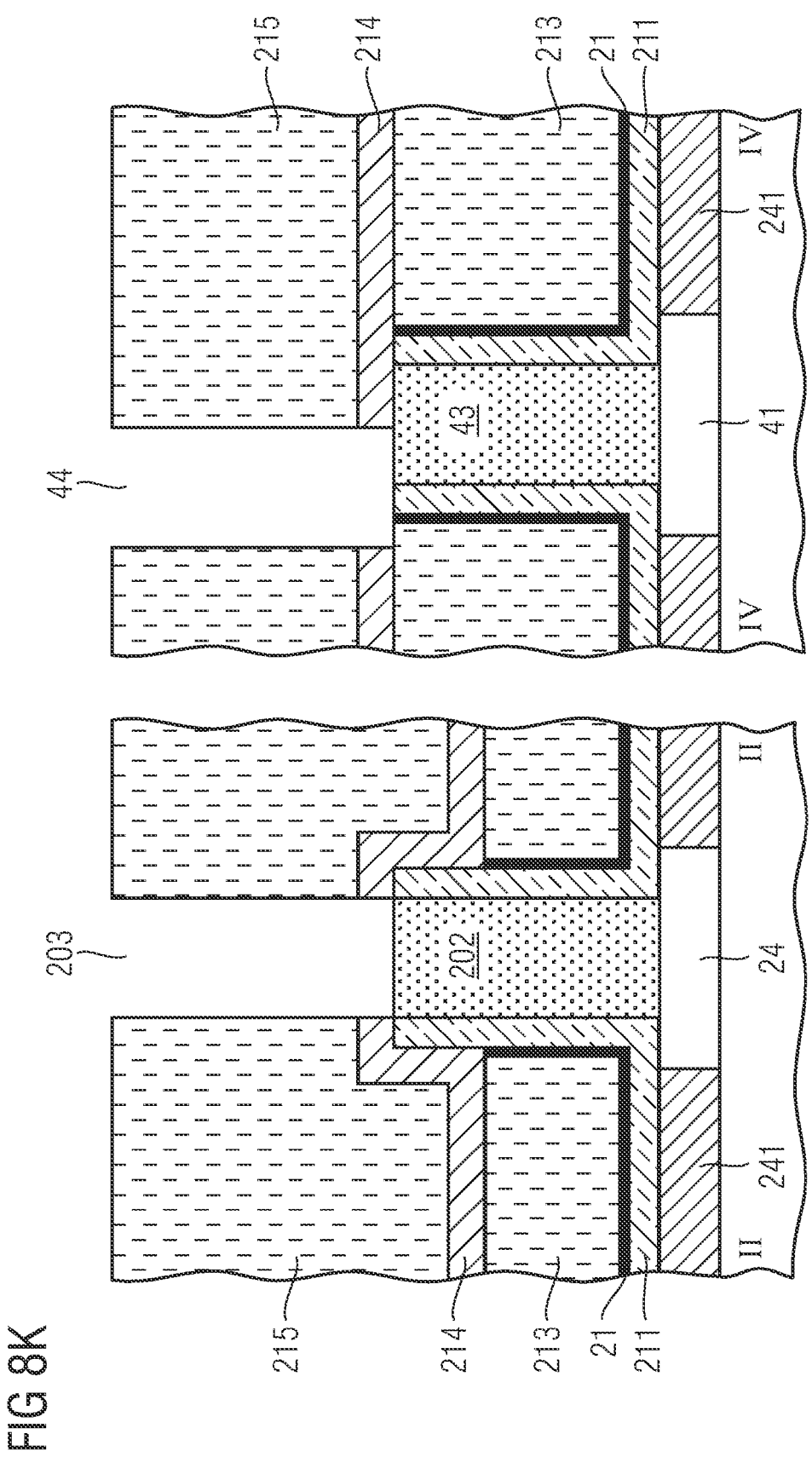

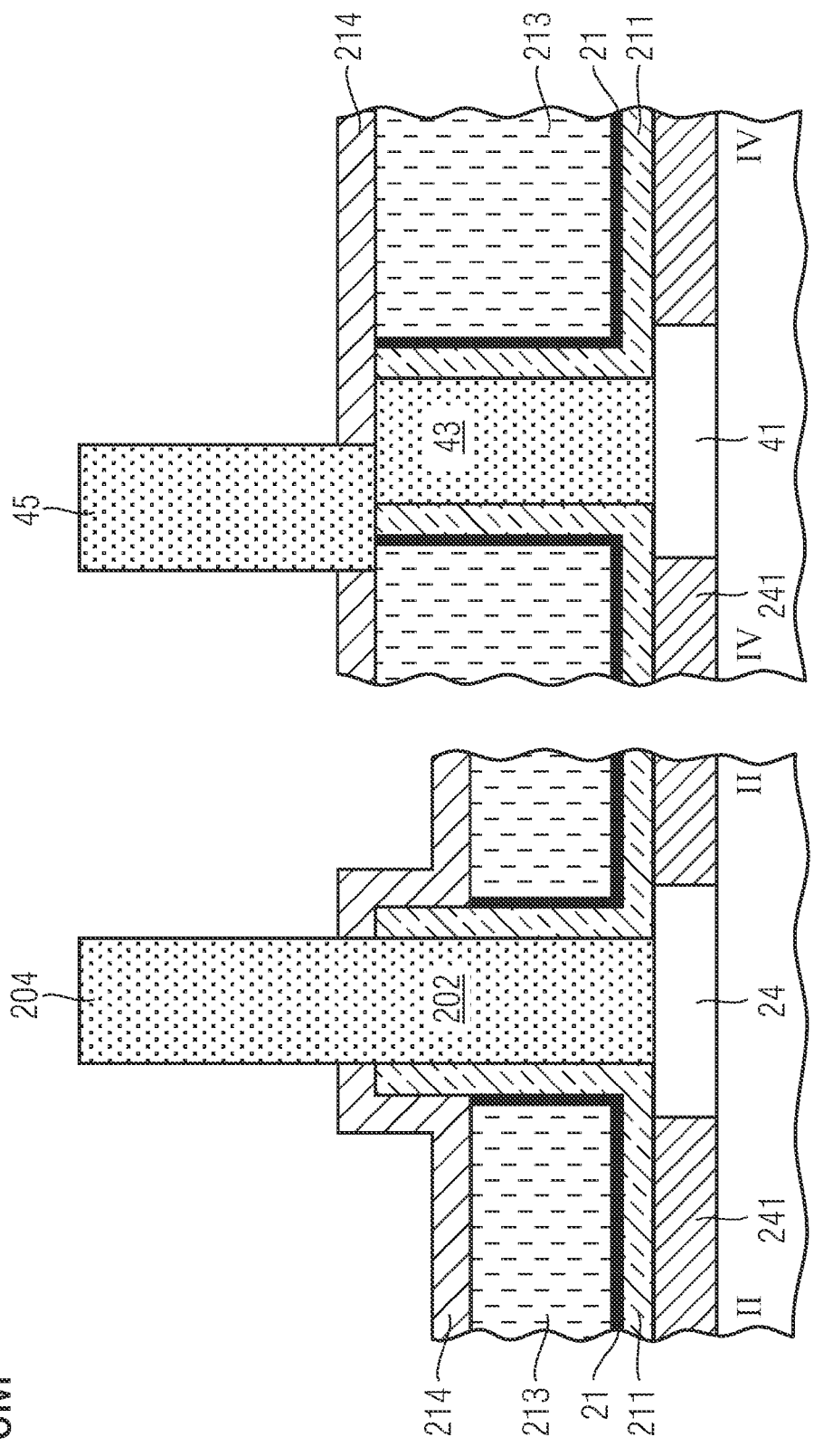

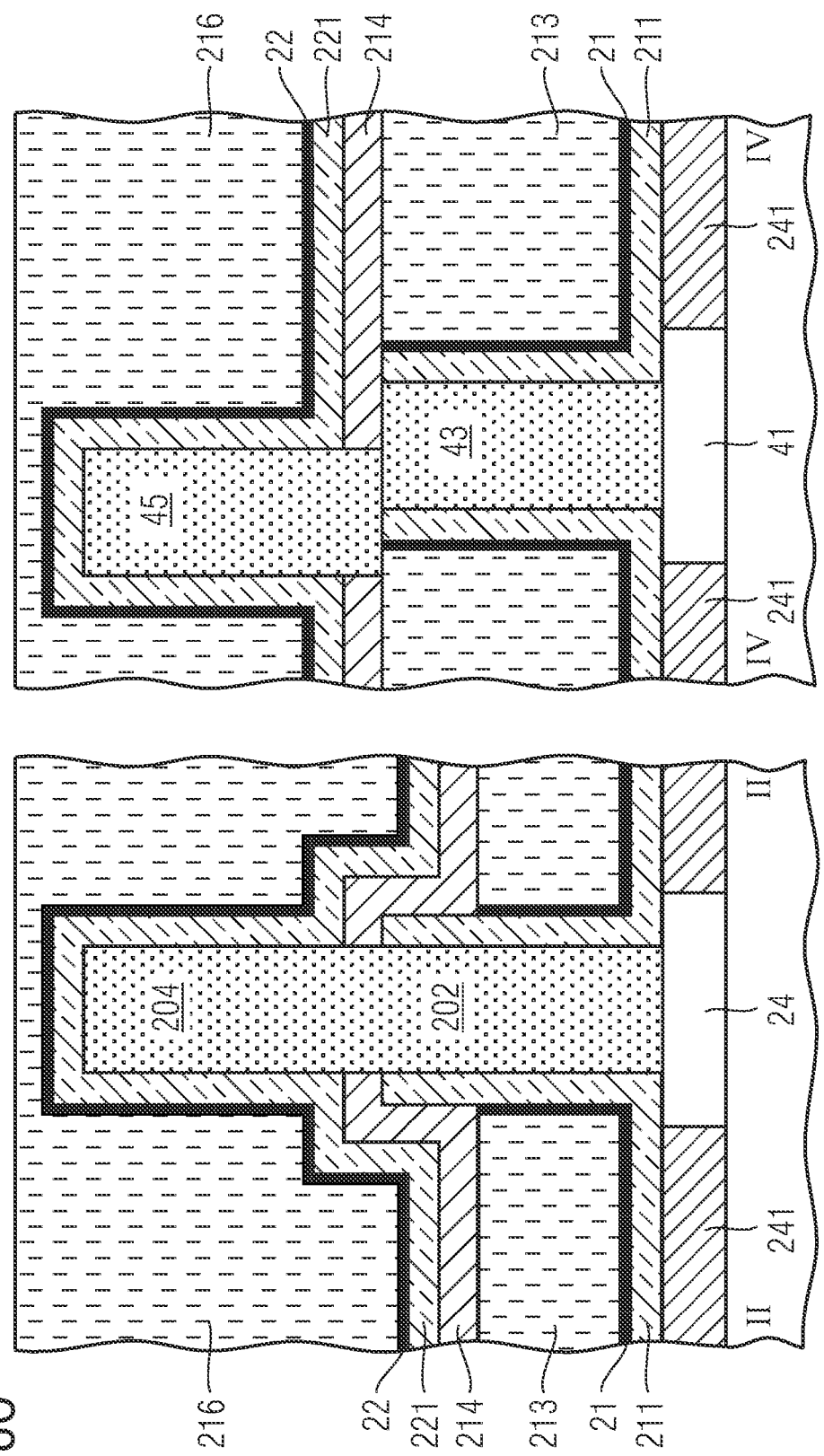

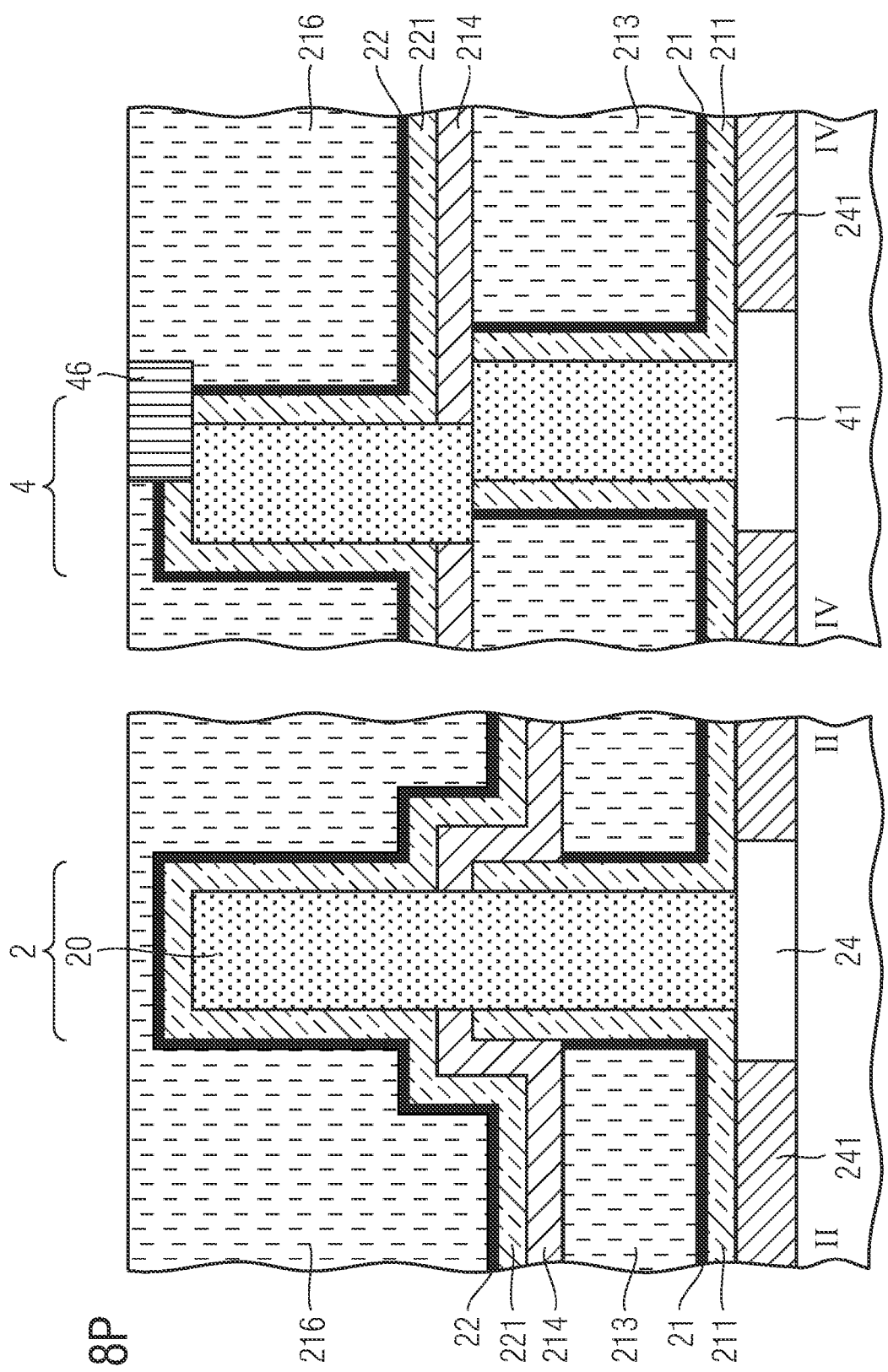

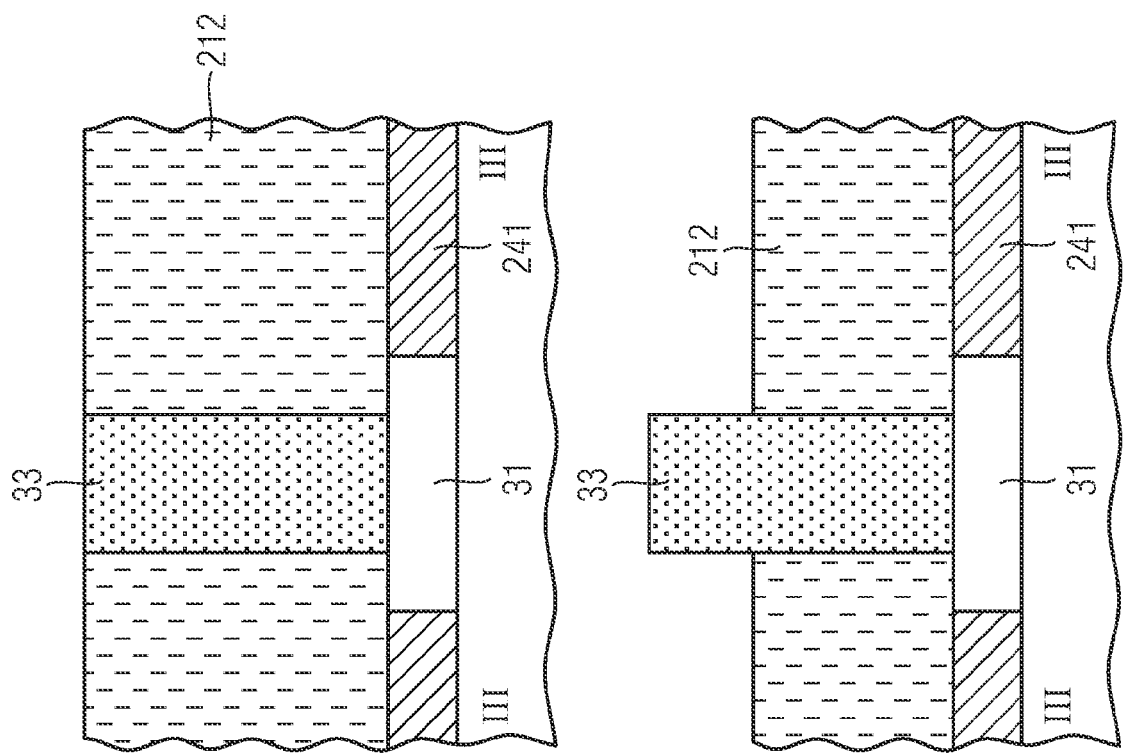
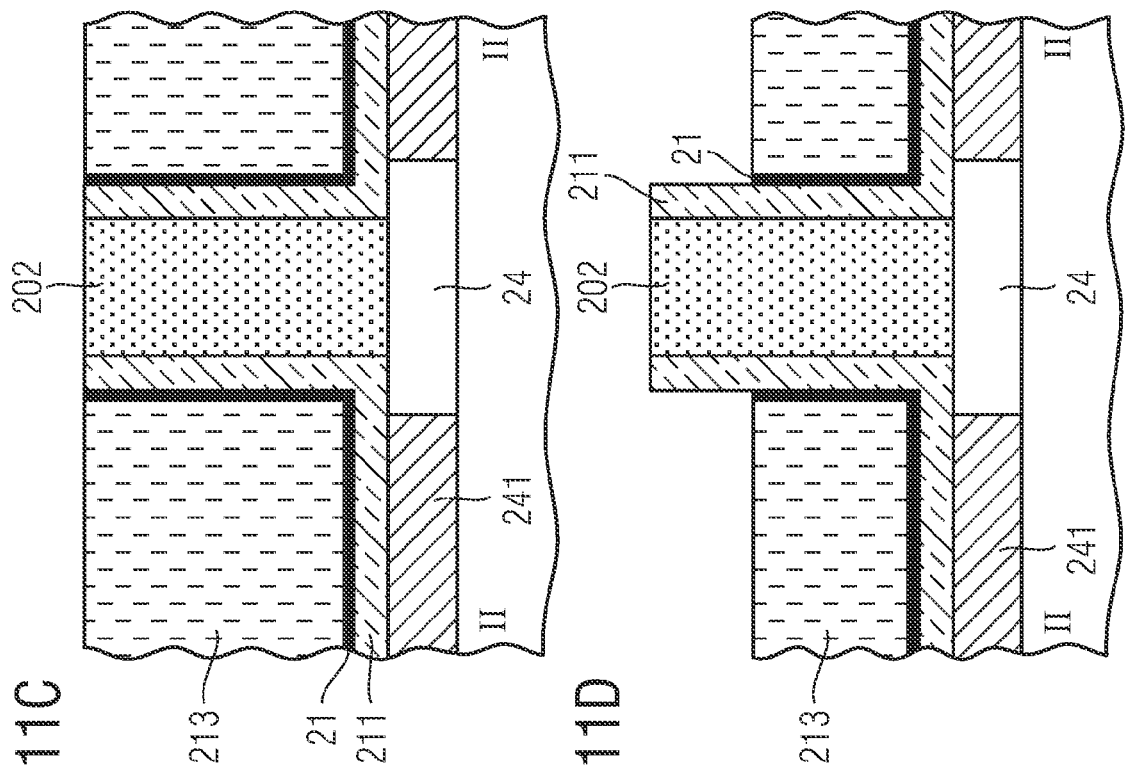

FIG 11F
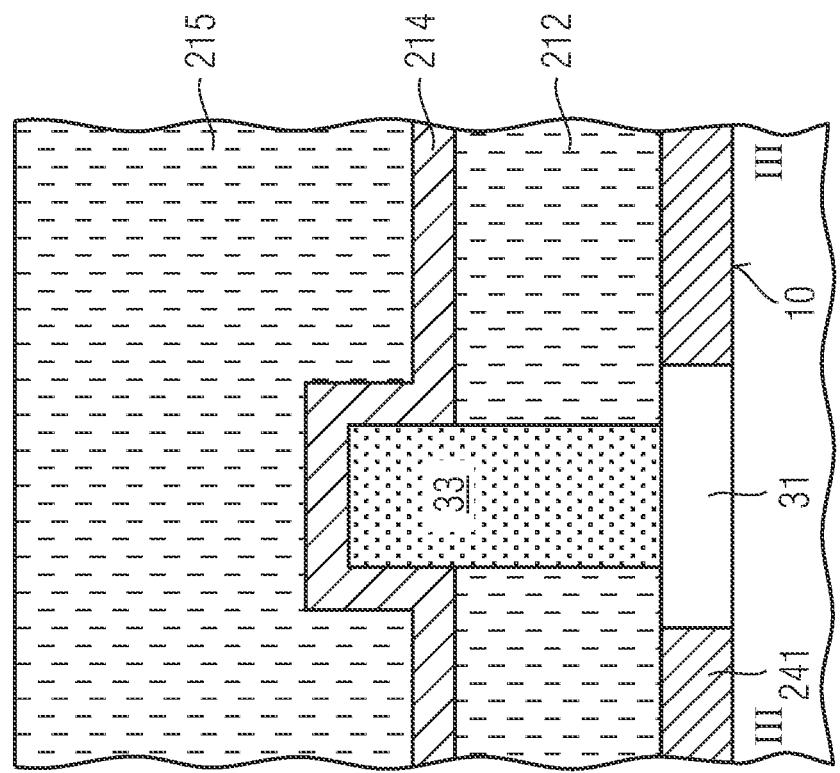
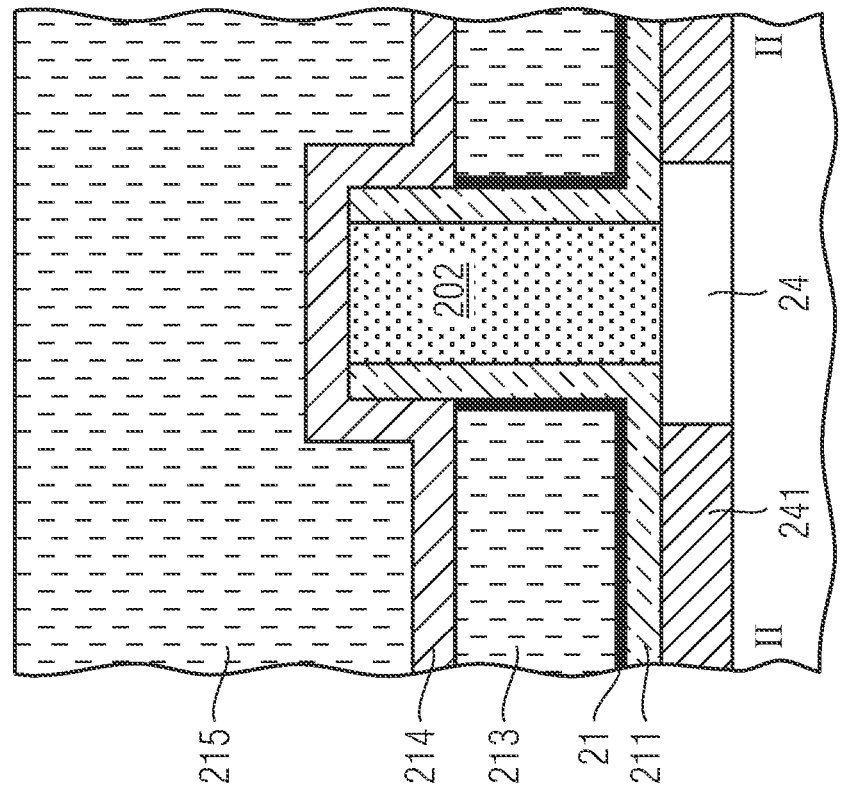

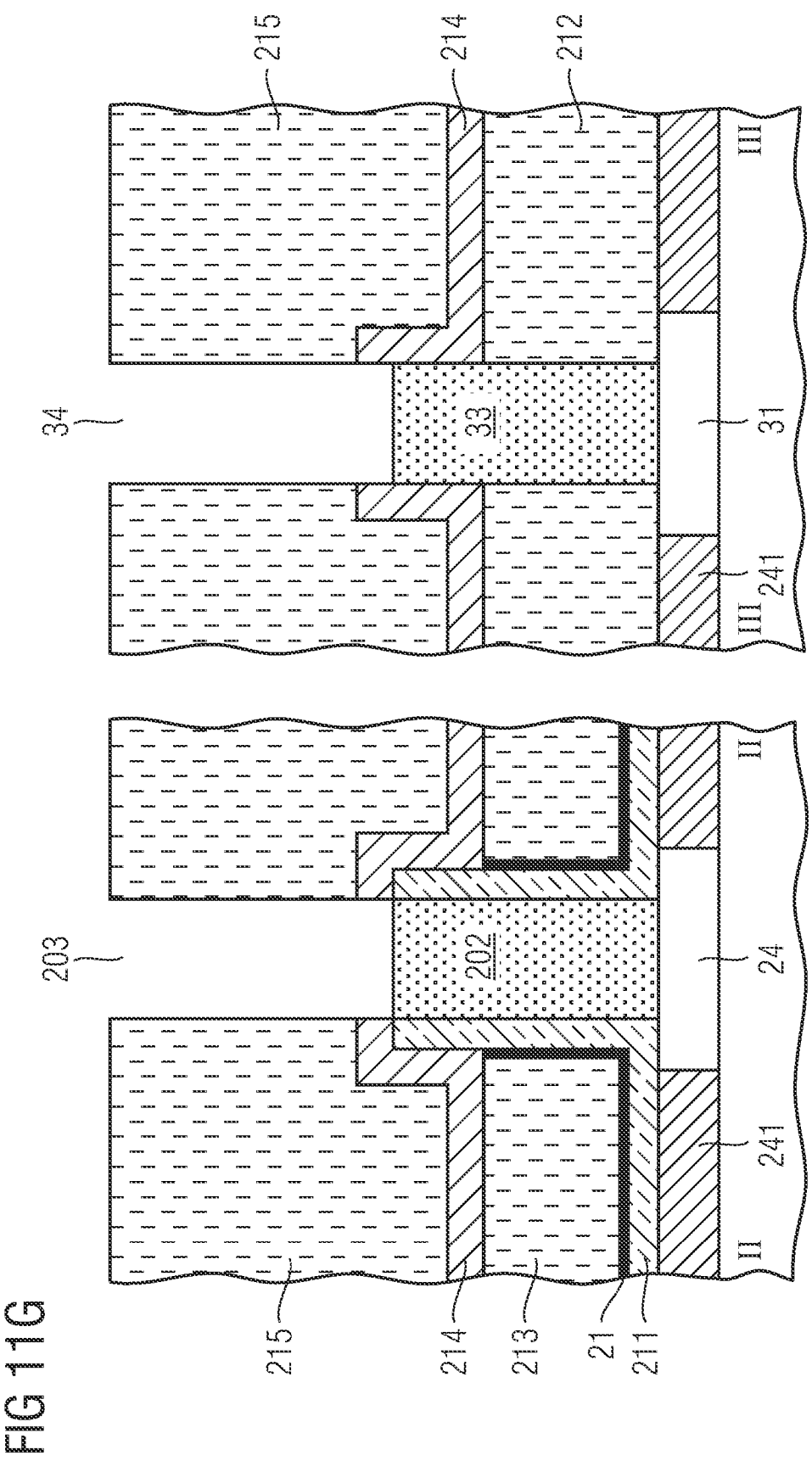

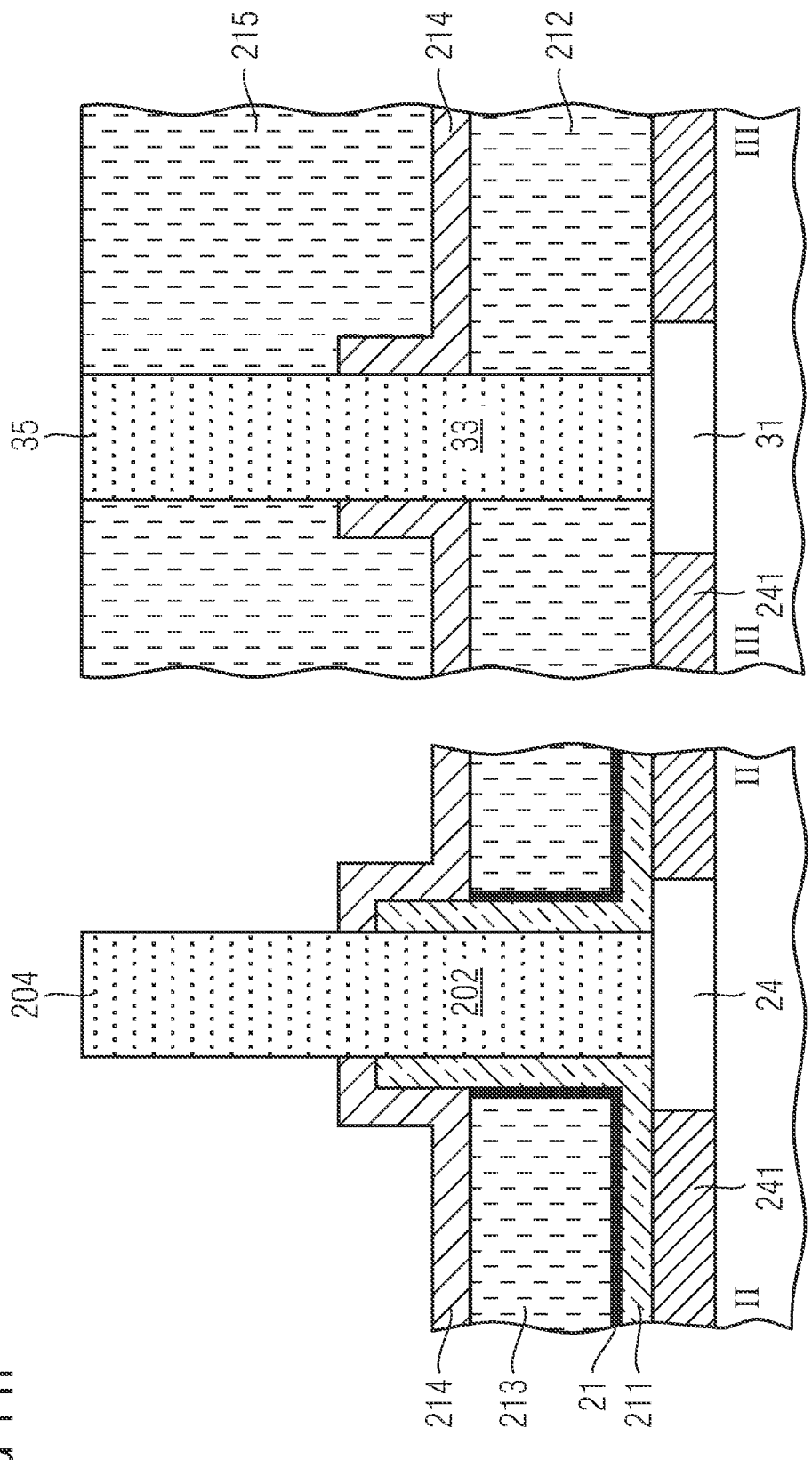

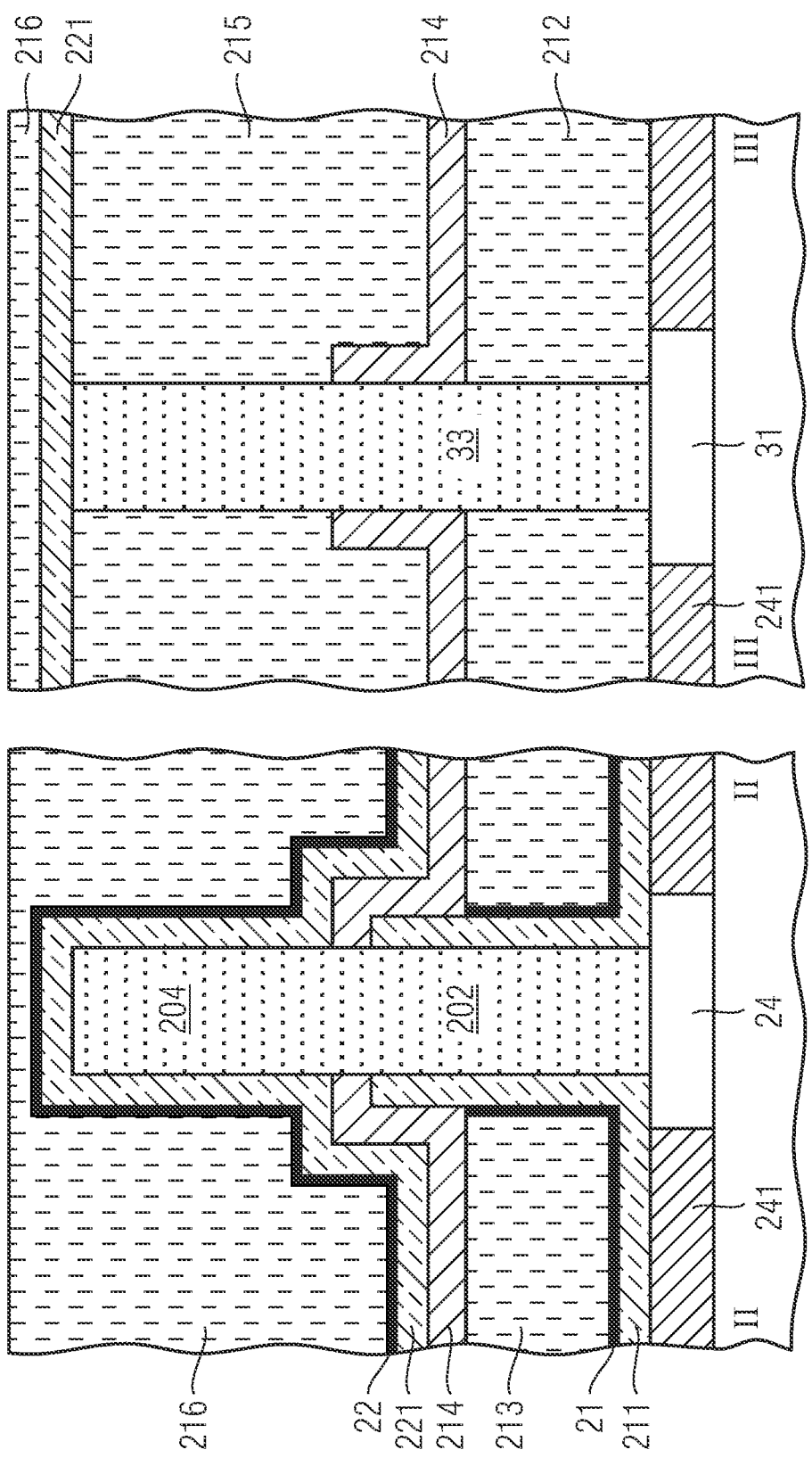

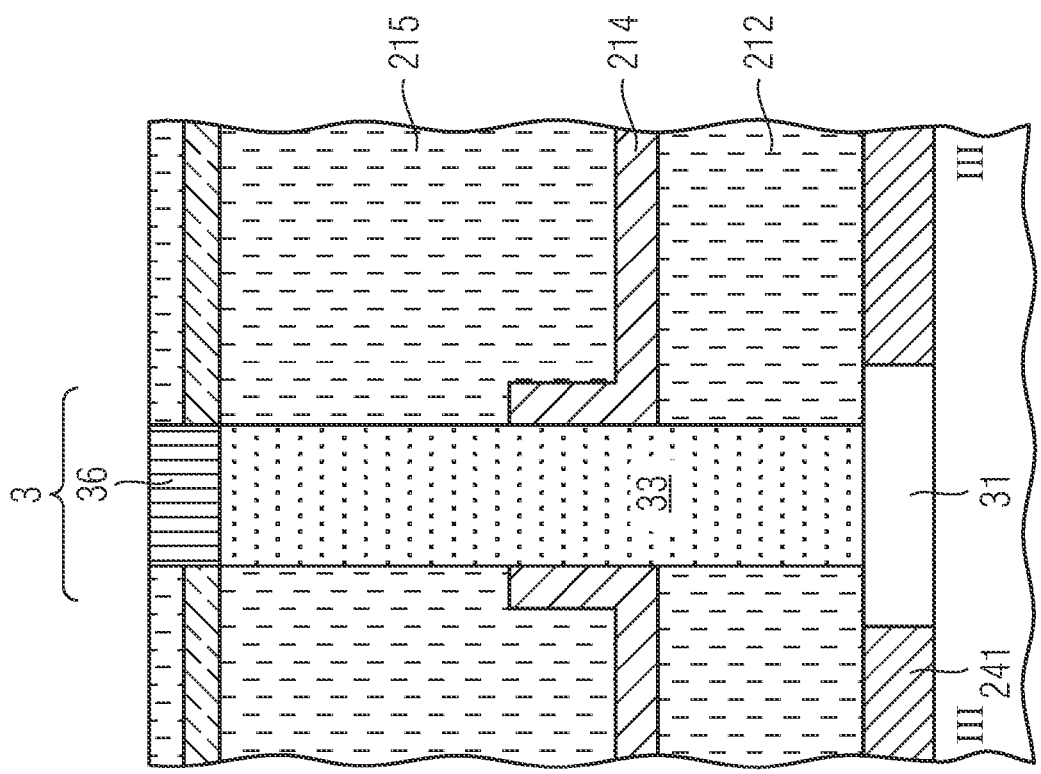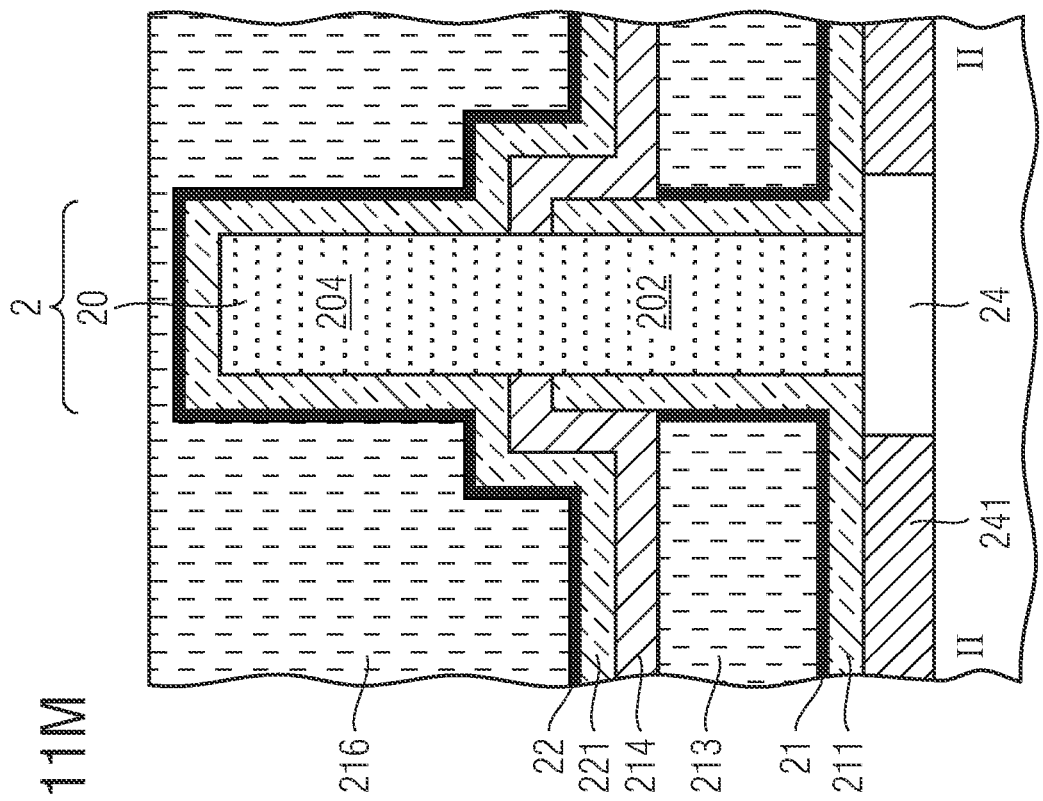

STORAGE CAPACITOR AND METHOD OF MANUFACTURING A STORAGE CAPACITOR

CROSS-REFERENCE TO RELATED APPLICATIONS

This utility patent application is a continuation application of U.S. patent application Ser. No. 11/039,740, filed Jan. 20, 2005, which is incorporated herein by reference.

FIELD OF THE INVENTION

The specification relates to a storage capacitor, which can, for example, be used in a memory cell of a DRAM (Dynamic Random Access) memory as well as to a method of manufacturing such a storage capacitor.

In addition, the present specification refers to a method of manufacturing a memory cell array as well as to a method of manufacturing a memory device.

BACKGROUND

Memory cells of a dynamic random access memory (DRAM) generally comprise a storage capacitor for storing an electrical charge which represents information to be stored, and an access transistor which is connected with the storage capacitor. The access transistor comprises a first and a second source/drain regions, a channel connecting the first and the second source/drain regions as well as a gate electrode controlling an electrical current flow between the first and second source/drain regions. The transistor usually is at least partially formed in the semiconductor substrate. The gate electrode forms part of a word line and is electrically isolated from the channel by a gate dielectric. By addressing the access transistor via the corresponding word line, the information stored in the storage capacitor is read out. In addition, by addressing the access transistor and transmitting an information signal via a bit line, an information is stored in the corresponding memory cell, which is assigned to the specific word line and bit line.

In the currently used DRAM memory cells, the storage capacitor can be implemented as a trench capacitor. In a trench capacitor, for example, the storage electrode can be disposed in a trench which extends in the substrate in a direction perpendicular to the substrate surface. The storage electrode is isolated from the sidewalls of the trench by a dielectric layer acting as the capacitor dielectric, the sidewalls of the trench forming a counter electrode.

According to another implementation of the DRAM memory cell, the electrical charge is stored in a stacked capacitor, which is formed above the surface of the substrate.

FIG. 10 illustrates a cross-sectional view of an exemplary DRAM memory cell comprising a stacked capacitor. In FIG. 10, an access transistor comprising a first source/drain region 51 and a second source/drain region 52 is formed in a substrate 1. A gate electrode 53 is provided so as to control an electrical current flow between the first and the second source/drain regions 51, 52 respectively. The gate electrode 53 forms part of a word line 7. A bit line 8 is connected via a bit line contact 81 with the second source/drain region 52. As is illustrated in FIG. 10, the storage capacitor 2 is disposed above the semiconductor substrate surface 10. In particular, the storage capacitor 2 comprises a storage electrode 20 as well as a counter electrode 210. Both capacitor electrodes are formed of $n^+$-doped polysilicon. A dielectric layer 211 is disposed between the storage electrode and the counter electrode. A capacitor contact 24 electrically connects the first source/drain region 51 with the storage electrode 20. A BPSG (boron phosphorous silicate glass) layer 54 is disposed above the substrate surface 10 and electrically isolates the capacitor components from the substrate surface.

For future DRAM technologies, an increased cell capacitance for high performance and low power applications is desirable. In the structure of FIG. 10, the cell capacitance can be increased by increasing the height of the stacked capacitor. For example, by increasing the height of the capacitor with respect to the width of the capacitor, or, differently stated, by increasing the aspect ratio of the storage capacitor, the cell capacitance can be increased while reducing the size of the memory cell. At present, typical aspect ratios amount to 20 to 30. In addition, with higher aspect ratios, the mechanical stability of a storage capacitor which is implemented as a cylinder has to be considered. At present, the height of the cylinders amounts to approximately 1.5 to 2 μm.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates an exemplary equivalent circuit diagram of a memory cell array according to an embodiment.

FIGS. 6A to 6D illustrate a further embodiment of the method of manufacturing a storage capacitor.

FIGS. 11A to 11M illustrate a modification of the embodiment illustrated in FIG. 7A to 7Q.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention.

The following detailed description, therefore, is not to be taken in a limiting sense, and the scope of the present invention is defined by the appended claims.

An embodiment of the invention refers to a storage capacitor, having a larger storage capacity. Further embodiments refer to a method of manufacturing a storage capacitor, a method of manufacturing a memory cell array as well as a method of manufacturing a memory device.

Figure 1A:
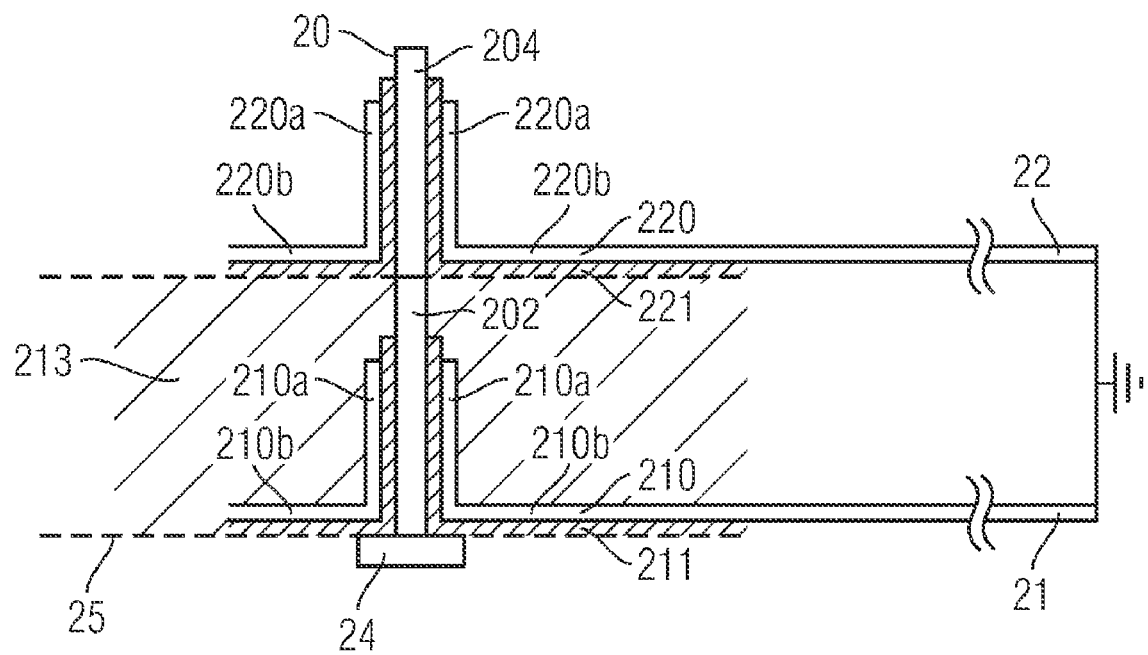
FIGS. 1A and 1B illustrate an exemplary embodiment and an equivalent circuit diagram, respectively, of a storage capacitor of the present invention.

FIG. 1A illustrates an embodiment of a storage capacitor.

In FIG. 1A, a storage electrode 20 is arranged so as to project from the surface 25 of a base layer such as a silicon nitride layer or another insulating or semiconductor layer. A first counter electrode 210 has a first portion 210a which is adjacent to a first section 202 of the storage electrode 20 and which extends in a first direction. The first portion 210a of the first counter electrode extends along the first section 202 of the storage electrode. The first dielectric layer 211 is disposed between the first portion 210a of the first counter electrode and the first section 202 of the storage electrode. The first counter electrode additionally comprises a second portion 210b which extends in at least one second direction which is different from the first direction. The second portion 210b extends along the substrate surface. As can be seen from FIG. 1A, for example, the first portion 210a may be nearly parallel with respect to the storage electrode 20. In addition, the second portion of the first counter electrode may be parallel with respect to the base material surface 25, by way of example. The second portion 210b which is adjacent to the base material surface 25 is disposed at a position which lies beneath the first portion of the first counter electrode 210a. To be more specific, the second portion 210b of the first counter electrode is closer to the semiconductor substrate or the base material surface 25 than the first portion 210a of the first counter electrode 210a.

The storage capacitor further comprises a second counter electrode 220 having a first portion 220a which is adjacent to the storage electrode 20. The first portion 220a of the second counter electrode 220 extends along the storage electrode. A second dielectric layer 221 is disposed between the storage electrode and the first portion 220a of the second counter electrode. The first portion of the second counter electrode 220a extends in a third direction. For example, the third direction may be equal to the first direction. In addition, the second counter electrode 220 comprises a second portion 220b which extends in a fourth direction. The second portion 220b of the counter electrode 220 may extend along the direction of the substrate surface. For example, the fourth direction is equal to the second direction. By way of further example, the second and fourth directions, respectively, are nearly parallel to the surface of the base material 25.

In addition, by way of example, the first and third directions, respectively, are nearly parallel with the direction of the storage electrode 20, so that the second portions 210a and 220a of the first and second counter electrodes, respectively, extend in parallel with the storage electrode 20.

In the region of the storage electrode 20, the first and second counter electrodes are isolated from each other by an isolating layer 213. Nevertheless, as will also be illustrated later, at the edge of the memory cell array, the first and second counter electrodes 21, 22 are electrically connected with each other and are grounded or held at a constant potential.

Nevertheless, the second portions of the first and second counter electrodes, respectively, need not be parallel to each other. In addition, the second portion 220b of the second counter electrode is disposed beneath the first portion 220a of the second counter electrode 220. To be more specific, the second portion 220b may be disposed closer to the base material surface 25 than the first portion 220a. According to a further embodiment of the present invention, the storage electrode 20 extends vertically with respect to the semiconductor surface (not illustrated) and in particular vertical with respect to the surface 25 of the base material layer. According to another embodiment, an angle between the storage electrode 20 and the base material surface 251 is 89 to 91°. The storage electrode 20 is connected via a capacitor contact 24 to an access transistor (not illustrated) which is disposed beneath the surface 25 of the base material.

As is illustrated in FIG. 1A, an angle between the first and second portions 210a, 210b amounts to approximately 90°. Nevertheless, an angle between 85 and 95° may be taken. The angles between the first and second portions of the first counter electrode need not necessarily be equal to the angle between the first and second portions of the second counter electrode.

Figure 1B:
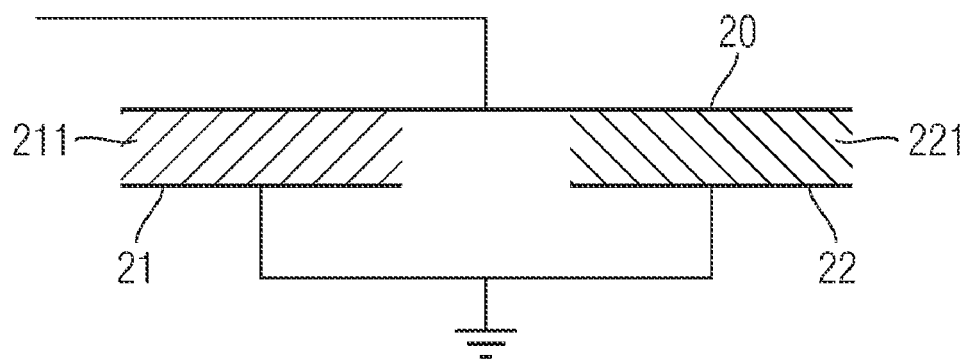

FIG. 1B illustrates an equivalent circuit diagram of the structure illustrated in FIG. 1A. As can be seen from FIG. 1B, the total capacitance of the storage capacitor amounts to the sum of the capacitances of each of the individual capacitors which are formed of the first counter electrode 210 and the storage capacitor and the second counter electrode 220 and the storage electrode, respectively.

Figure 2A:
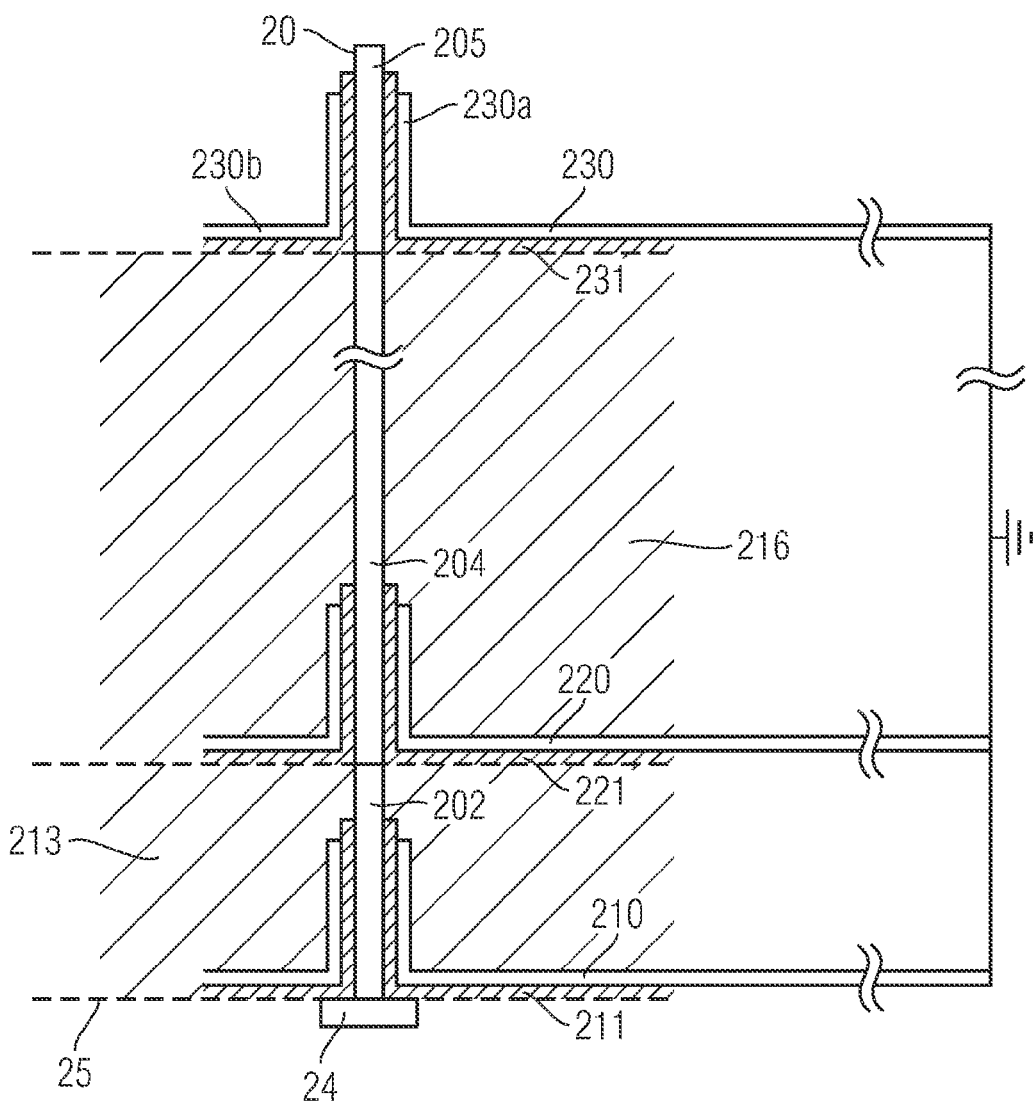
FIGS. 2A and 2B illustrate another exemplary embodiment and an equivalent circuit diagram, respectively, of a storage capacitor according to an embodiment.

FIG. 2A illustrates a further embodiment of the storage capacitor of the present invention. As is illustrated in FIG. 2A, the storage capacitor additionally comprises up to (n+2) counter electrodes, each of the counter electrodes having a first and a second portion, respectively, in which the first portion 230a is adjacent to the storage electrode 20, the first portion 230a extending along the storage electrode 20, and in which the second portion of the corresponding counter electrode 230b extends in a direction which is different from the direction of the first portion 230a of the corresponding counter electrode. For example, the second portion may extend along the substrate surface. According to an embodiment, n can be any number such as 1, 2, 3, 4 and any other natural number.

A dielectric layer 231 is disposed between the first portion 230a of the corresponding counter electrode and the storage electrode 20. For example, each of the counter electrodes can have a structure and a shape which may be identical with any of the first and second counter electrodes, respectively. The remaining components of FIG. 2A may be identical with the corresponding components disclosed with respect to FIG. 1A, and the description thereof is omitted.

As is illustrated in FIG. 2A, an angle between the first and second portions of any of the illustrated counter electrodes may be between 85° and 95°, for example approximately 90°. The angles between the first and second portions of the first counter electrode need not necessarily be equal to the angle between the first and second portions of the second counter electrode or of the n-th counter electrode. Nevertheless, the angle between the first and second portions of any of the illustrated counter electrodes can as well have an arbitrary value.

Figure 2B:
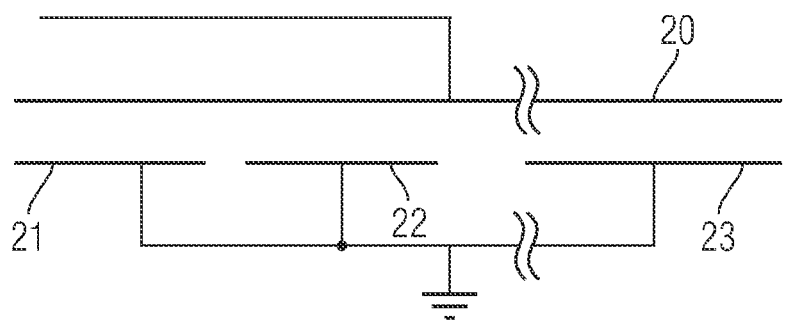

FIG. 2B illustrates an equivalent circuit diagram of the storage capacitor illustrated in FIG. 2A. As can be seen, by stacking (2+n) counter electrodes, the total capacitance of the storage capacitor can be largely increased.

As can be seen from FIGS. 1 and 2, the illustrated embodiments provide a storage capacitor having a greatly enhanced capacity and having an improved mechanical stability in comparison with the known capacitors having a high aspect ratio. For example, due to the special construction comprising one solid storage electrode and several counter electrodes which are arranged in the manner described above, the storage capacitor may exhibit an enlarged mechanical stability and the former problems of sticking cylinders may be avoided.

The mode of action of the memory cell array is described with reference to FIG. 3. In this respect it is to be noted, that FIG. 3 only illustrates one possible layout of a memory cell device. However as is obvious from the description above, the storage capacitor as well as the methods according to the embodiments can equally be applied to any layout which is suitable for a DRAM memory cell array comprising a stacked capacitor.

FIG. 3 is a simplified schematic diagram describing a pair of memory cell arrays 60, 60', each comprising an access transistor 5 and a storage capacitor 2 in accordance with an embodiment. The arrays are implemented in an open bit line configuration, each employing memory cells 6, comprising one transistor 5 and one capacitor 2.

The memory arrays 60, 60' are each coupled to respective groups of bit lines 8, 8' and respective groups of word lines, 7, 7'. The two groups of bit lines 8, 8' are coupled, one from each of the memory arrays 60, 60' to sense amplifiers 9. The sense amplifiers 9 comprise peripheral circuitry, generally formed outside of the memory cell arrays 60, 60'.

In operation, one memory cell 6 is selected, for example, by activating one word line 7. The word line 7 is coupled to the respective gate electrode of a respective one of the transistors 5. The bit line 8 is coupled to the second source/drain region of one of these transistors 5 via bit line contacts. If the transistor 5 is turned on, charge stored in the capacitor 2 is coupled to the associated bit line 8. The sense amplifier 9 then senses the charge coupled from the capacitor 2 to the bit line 8. The sense amplifier 9 compares that signal to a reference signal, such as the reference charge Qref or a reference signal which is obtained by sensing a corresponding bit line 8', without a voltage being applied to the corresponding word line 7', and amplifies the resulting signal. This allows data represented by the charge stored in the capacitor 2 being accessed external to the memory arrays 60, 60' and also allows the capacitor 2 storing charge representative of the data from the memory cell 6 back into the memory cell 6.

Nevertheless, as has been mentioned above, the stacked capacitor can as well be implemented with a memory cell array which is implemented in a folded bit line or vertically twisted bit line configuration.

Figure 4:
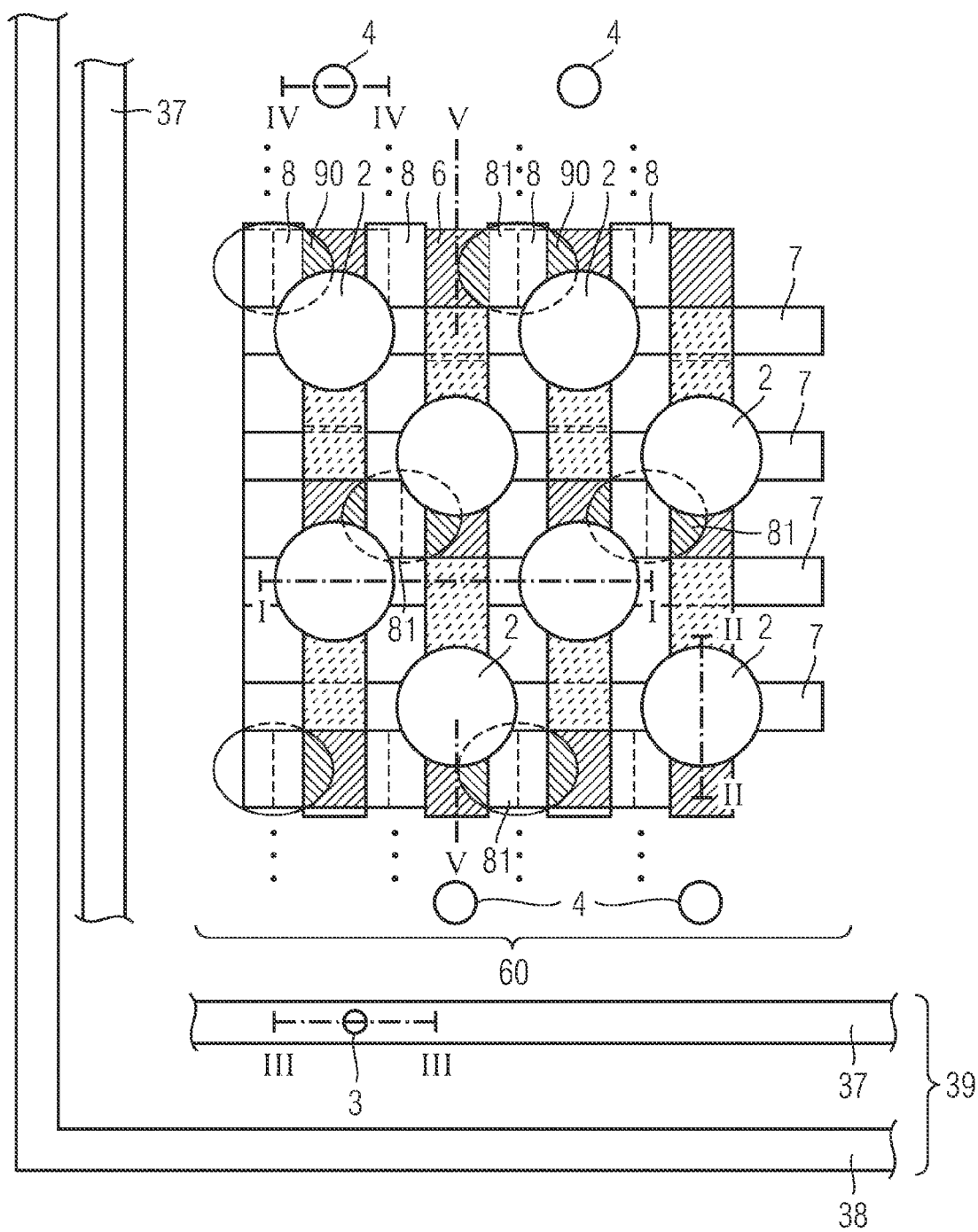
FIG. 4 illustrates an exemplary plan view of a memory device according to an embodiment of the present invention.

FIG. 4 illustrates a plan view of an exemplary memory device which can be manufactured by a method according to an embodiment. In the central portion of FIG. 4, the memory cell array 60 is illustrated. For example, in the memory cell array of FIG. 4, the stacked capacitors 2 may be arranged in a checkerboard pattern. To be more specific, the capacitors 2 are arranged in rows and in columns, so that directly adjacent rows are arranged in a staggered manner and the capacitors of even row numbers and uneven row numbers, respectively, are placed in the same columns. Two neighboring transistors 2 share a common bit line contact 81. Word lines 7 are arranged in a first direction, and a plurality of bit lines 8 are disposed in a second direction which may be, by way of example, perpendicular to the direction of the word lines 7. In the example illustrated, the memory cell array is arranged so that a single memory cell has an area of $8F^2$ ($8F \times F$), so that it can be implemented in a folded bit line configuration.

As has been mentioned above, the storage capacitor may be implemented with arbitrary arrangements of the components of the memory device, respectively. Likewise, the method of manufacturing a memory cell array or the method of manufacturing a memory device may relate to the method of manufacturing the storage capacitor and a backside electrode contact or a support contact, respectively. Consequently, these methods can be applied independently from the specific structure of the memory cells as well as from the layout of the memory cell array.

At the edges of the memory cell array 60, backside electrode contacts 4 may be provided so as to electrically connect the backside electrodes of one column with each other. In FIG. 4, the backside electrode contacts 4 are disposed on either side of each of the columns, respectively. For example, in the top region of the memory cell array 60, one backside electrode contact 4 may be assigned to two neighboring columns, and in the bottom region of the memory cell array 60, one backside electrode contact 4 is assigned to two neighboring columns, the backside electrode contacts in the top and the bottom regions being arranged in a staggered manner, respectively.

As is obvious to the person skilled in the art, the backside electrode contacts could as well or can additionally be disposed at either side of each of the rows of the array. The counter electrodes of the single storage capacitors, may be connected with each other and may be grounded or held at a constant potential, by way of example.

The memory device of FIG. 4 further comprises the peripheral portion 39. Usually, the peripheral portion 39 comprises the core circuitry 37 including row drivers and sense amplifiers and other devices for controlling and addressing the individual memory cells, and the support 38 which usually lies outside the core circuitry. In the following description, all parts outside the memory cell array belonging to the memory device will be referred to as the peripheral portion 39. In the memory device illustrated in FIG. 4, the peripheral portion 39 is formed in the same semiconductor substrate as the individual memory cells 6. When an aspect ratio and, consequently, the height of the storage capacitors 2 becomes larger, equally the aspect ratio of contacts in the peripheral portion have a higher aspect ratio. Hence, it is highly desirable to have a manufacturing method for manufacturing a memory device by which a storage capacitor of the memory cell array and the contacts of the peripheral portion can be formed simultaneously.

Figure 5A:
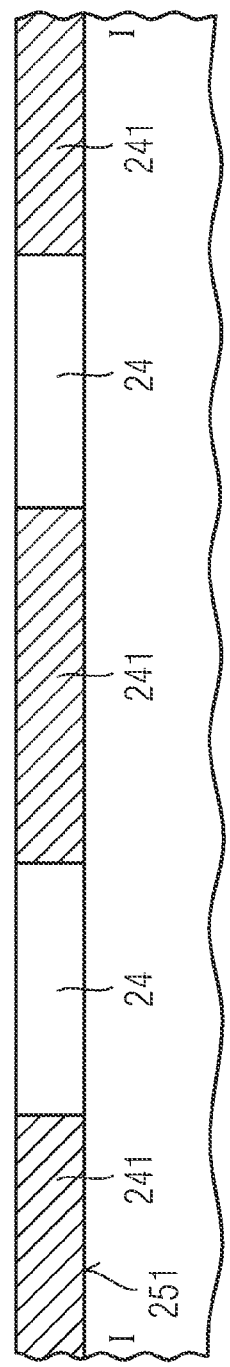
FIGS. 5A to 5O illustrate an exemplary embodiment of a method of manufacturing a storage capacitor according to an embodiment.

FIGS. 5A to 5O illustrate the process steps of a method of manufacturing a storage capacitor according to the present invention. FIGS. 5A to 5O are cross-sectional views taken between I and I as can be seen from FIG. 4. For example, the cross-section between I and I can be taken parallel or perpendicularly with respect to a word line.

In FIG. 5A, reference numeral 251 denotes the surface of a base material such as a silicon dioxide layer, a BPSG layer, which can be coated on a semiconductor substrate, for example, a processed semiconductor or silicon substrate. Nevertheless, reference numeral 251 can denote any kind of substrate surface such as a substrate made of plastics or any other isolating or semiconductor material. The base material can, for example, be a processed silicon substrate. For example, the base material layer can be deposited or grown on a silicon substrate which has been processed so as to provide the components of the DRAM memory cell array. In FIG. 5A, on the surface 251 of the base material, first, the silicon nitride layer 241 is deposited, and capacitor contacts 24 are formed by generally known methods. The capacitor contacts 24 have a diameter of approximately 1, 5 F, wherein F denotes the minimum pitch according to the technology used. For example, F can be 100 nm or below, for example 50 nm, 40 nm and even less. The capacitor contacts are photolithographically defined in the silicon nitride layer 241 and filled with a conducting material such as TiN. The resulting structure is illustrated in FIG. 5A.

In the next step, a silicon dioxide layer 212 having a thickness of approximately 1 to 3 µm is deposited by known methods, for example, by a CVD (Chemical Vapor Deposition) method using TEOS (Tetra Ethyl Ortho Silicate) as a starting material.

Figure 5B:
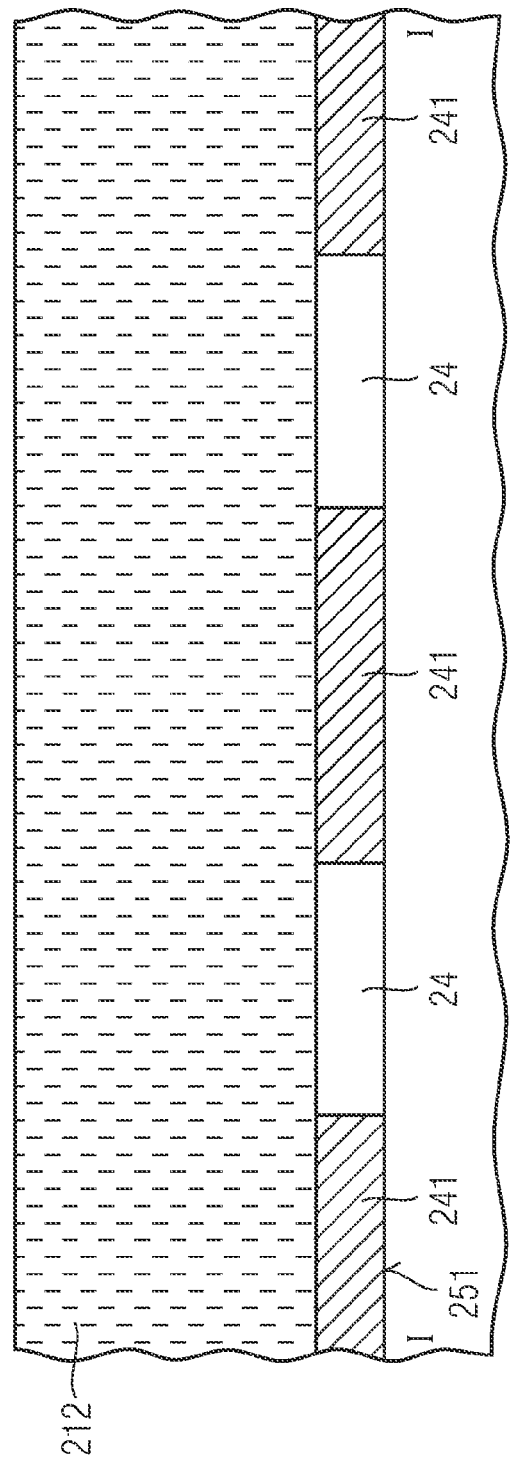

The resulting structure is illustrated in FIG. 5B.

As is illustrated in FIG. 5C, next, openings 201 are formed in the silicon dioxide layer 212. The cross-sectional shape of the openings 201 depends on the layout of the resulting memory cell array. In particular, for example, for a $6F^2$ layout, an oval diameter is taken, whereas, for example an $8F^2$ layout, a round diameter is chosen. The openings 201 have a diameter of approximately 1, 3 to 1, 8F. The openings 201 are photolithographically defined using a corresponding mask and are etched by known etching methods.

As is illustrated in FIG. 5D, in the next step, the material of the storage electrode is deposited by known methods. For example, W, polysilicon or TiN can be taken as a material for the first section of the storage electrode 202. Then, a CMP (Chemical Mechanical Polishing) or back etching step is performed so as to planarize the surface.

In the next step, the silicon dioxide layer 212 is stripped by wet or dry etching. The resulting structure is illustrated in FIG. 5E.

As can be seen from FIG. 5E, the first section 202 of each of the storage electrode 2 projects from the base material surface. For example, an angle between the first section 202 of the storage electrode 2 and the base material surface 251 can be approximately 90°. In addition, the height of the first portion of the storage electrode 202 amounts to approximately the thickness of the formerly deposited silicon dioxide layer 212.

In the next step, first, a dielectric layer is deposited by generally known methods such as a CVD or ALD (atomic layer deposition) method. For example, $Al_2O_3$ or aluminum hafnium oxide (AlHfO) can be used as the first dielectric layer 211. If a so-called high-k material such as AlHfO is used as the first dielectric layer 211, the thickness thereof can be 5 to 10 nm. Thereafter, the first conductive layer 21 which is for example made of TiN, is deposited by known methods. Both layers 211 and 21 are deposited so as to form a conformal layer which covers the horizontal portions and the vertical portions of the surface. To be more specific, although FIG. 5F merely is a cross-sectional view, it is clearly to be understood that the layers 211 and 21 surround each of the first sections 202 of the storage electrodes and, consequently, form a continuous layer on the memory cell array surface. The sidewalls and the top portion of the first and second of the storage electrodes 202 may be covered by these layers, by way of example.

The resulting structure is illustrated in FIG. 5F.

Thereafter, a silicon dioxide layer 213 may be deposited by known methods such as the TEOS method. Then, a CMP (Chemical Mechanical Polishing) step is performed so that the topmost portion of the first dielectric layer 211 and of the first conductive layer 21 are removed. As a result, the top portion of the first section 202 of the storage electrode is exposed.

The resulting structure is illustrated in FIG. 5G.

In the next step, the silicon dioxide layer 213 may be etched back so that a step between the silicon dioxide layer 213 and the top of the first section 202 of the storage electrode is formed. The silicon dioxide layer 213 is etched back by approximately 100 to 150 nm. In addition, the first conductive layer 21 is also etched back by 100 to 150 nm. These etching steps are performed time-controlled so as to achieve the desired depth of etching.

The resulting structure is illustrated in FIG. 5H.

In the next step, a silicon nitride liner 214 having a thickness of 10 to 50 nm may be deposited by known methods. The silicon nitride liner 214 is deposited so as to form a conformal layer which covers the topmost portion of the first section 202 of the storage electrode as well as the upper part of the sidewalls thereof.

Figure 5I:
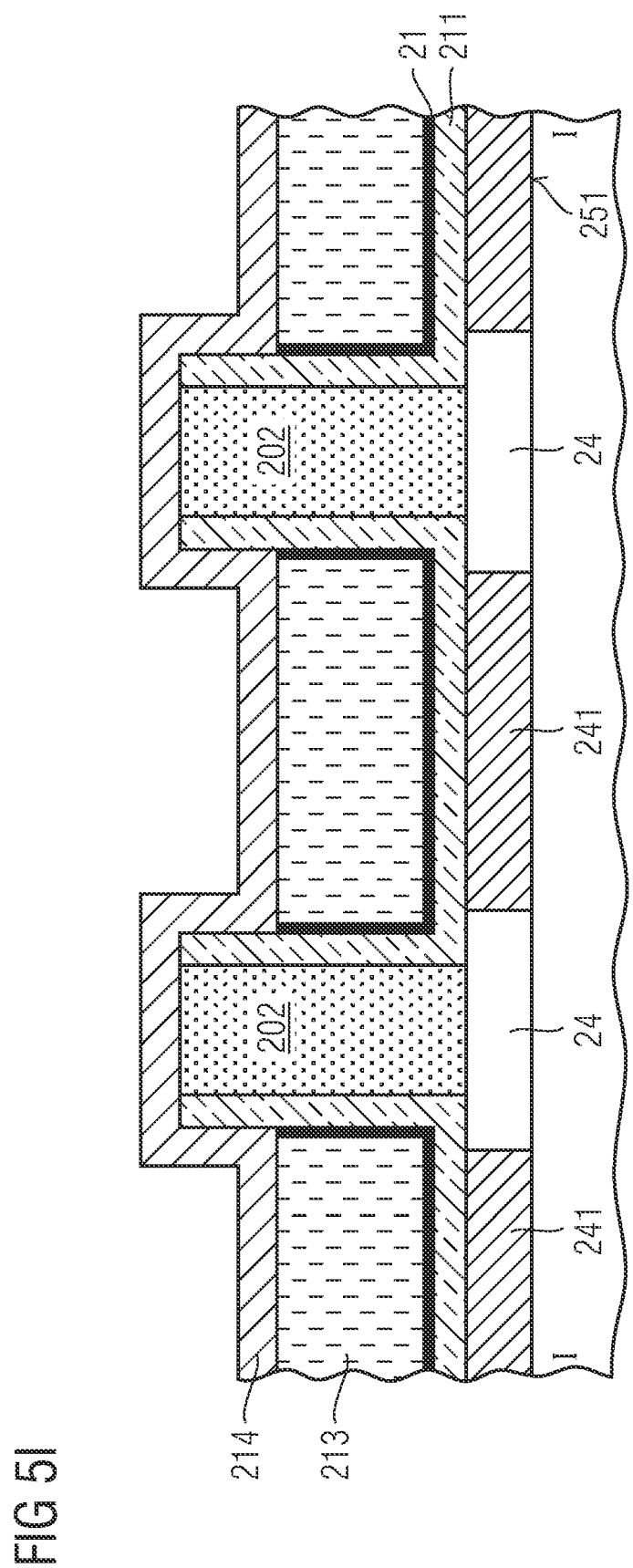

The resulting structure is illustrated in FIG. 5I.

Figure 5J:
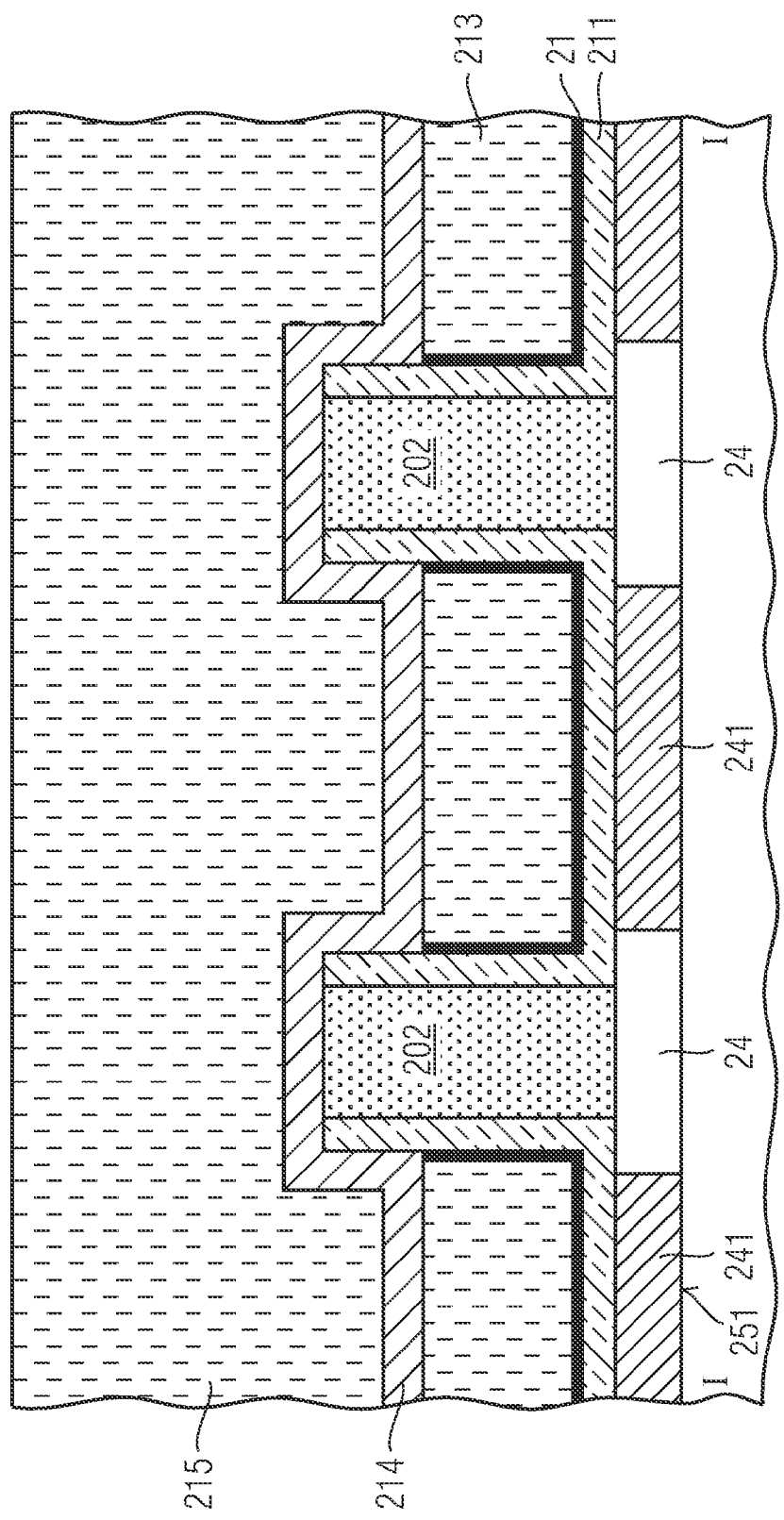

As is illustrated in FIG. 5J, in the next step, a silicon dioxide layer 215 having a thickness of 1 to 3 µm, by way of example, may be deposited by known methods.

Figure 5K:
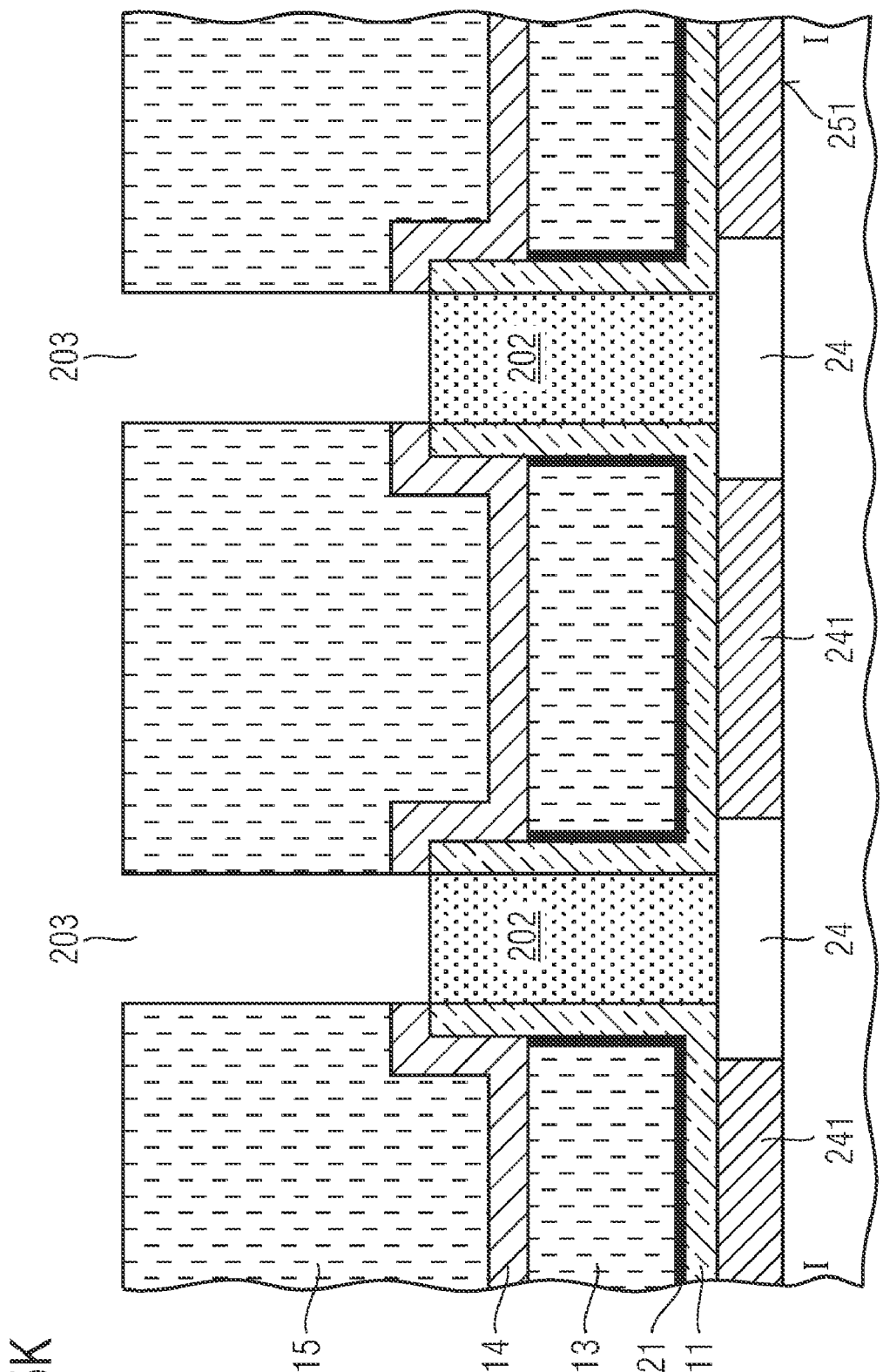

Thereafter, openings 203 for forming the second section of the storage electrode are photolithographically defined and etched in the silicon dioxide layer 215. By way of example, the silicon dioxide layer 215 may be etched, using the detection of the final point of the etching. As soon as the silicon nitride liner 214 is reached during the etching step, a signal indicating the final point of the etching step may be issued. Then, an over-etching step of approximately 5 to 10% of the etched opening 203 is conducted so as remove the silicon nitride liner 214. An over-etching step of approximately 5 to 10% may be sufficient to achieve an electrical contact to the first section 202 of the storage electrode even if the opening 203 is not properly aligned with respect to the first section of the storage electrode 202. Nevertheless, an over-etching of approximately 5 to 10% will not result in a contact of the opening 203 with the first conductive layer 21 which would cause an unwanted short. Accordingly, since the first conductive layer 21 has been etched back in the previous step, the alignment of the opening 203 with respect to the first section 202 of the storage electrode is not critical. The resulting structure is illustrated in FIG. 5K.

Figure 5L:
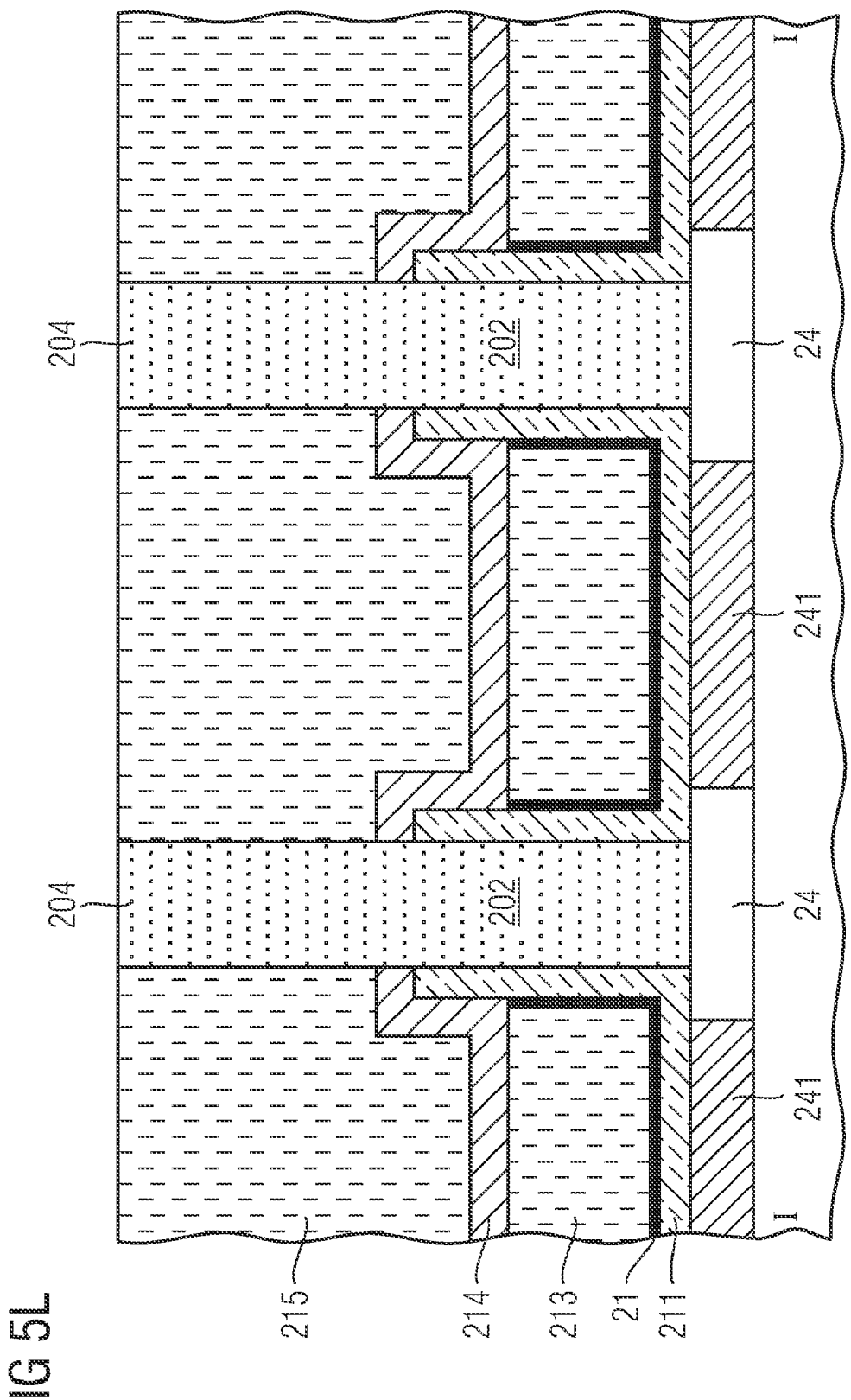

Next, the material of the second section 204 of the storage electrode is deposited by generally known methods. For example, W, polysilicon or TiN can be used as the material of the second section of the storage electrode 204. By way of example, the materials of the first and second sections of the storage electrode 202, 204 may be identical. Nevertheless, they can as well be different from each other. Thereafter, a CMP step or back-etching step is performed so as to obtain a smooth surface as illustrated in FIG. 5L.

Next, the silicon dioxide layer 215 is removed by dry or wet etching. The resulting structure is illustrated in FIG. 5M.

Figure 5N:
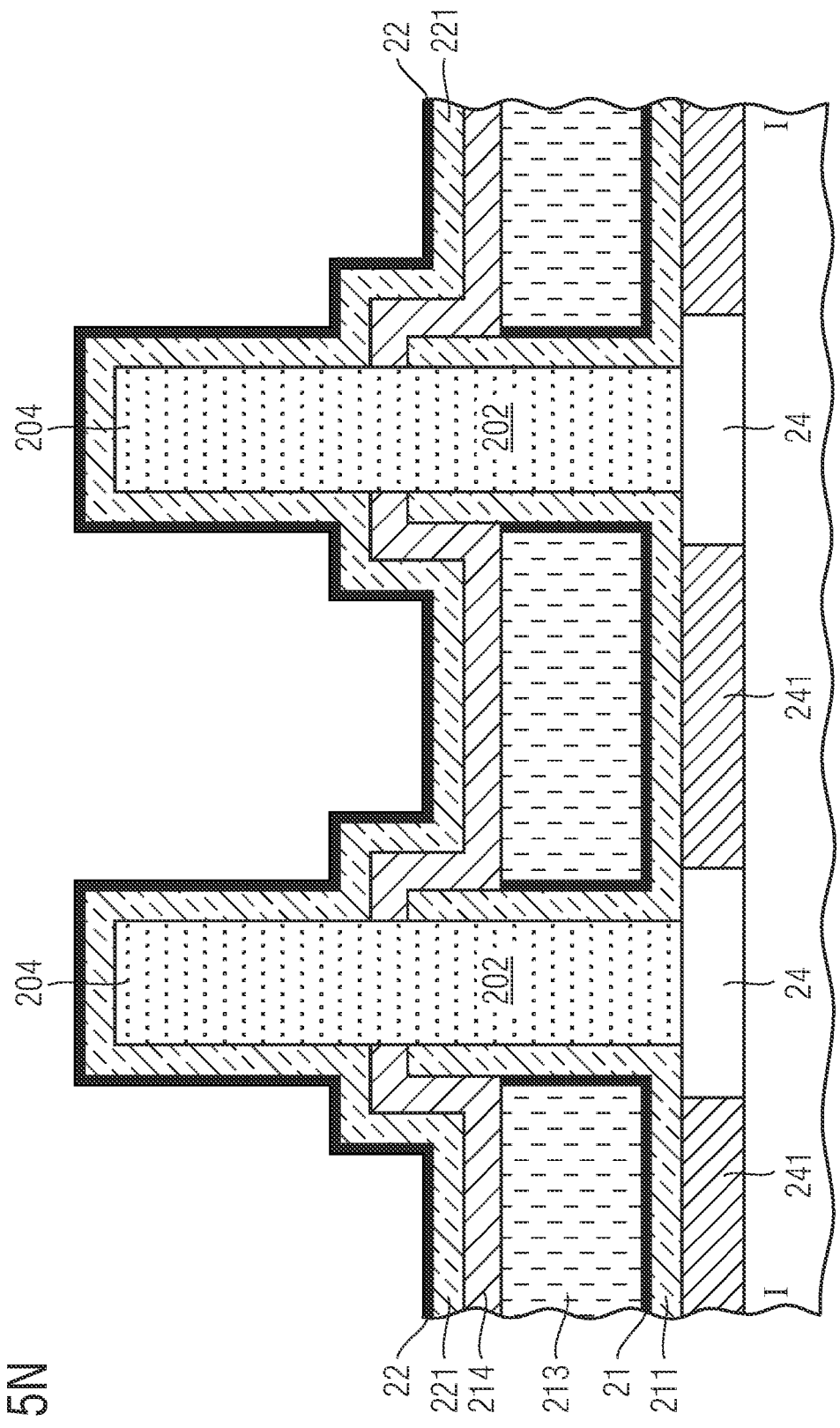
Figure 50:
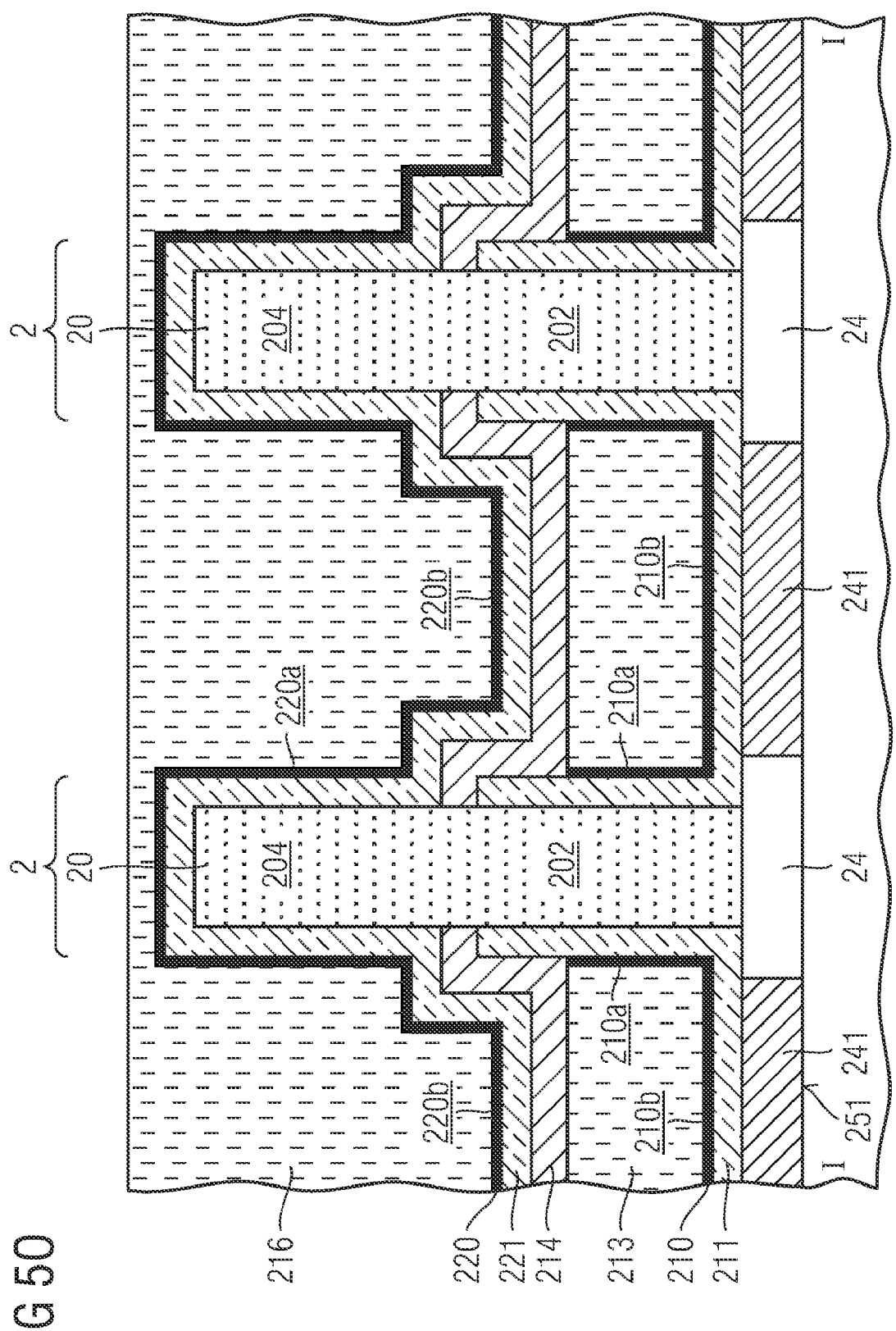

Thereafter, a second dielectric layer 221 which for example can be made of $Al_2O_3$ or AlHfO, may be deposited by known methods. The thickness of the second dielectric layer 221 can be 5 to 10 nm. In addition, the second conductive layer 22 which for example can be made of TiN is deposited. The resulting structure is illustrated in FIG. 5N.

Next, a silicon dioxide layer 216 may be deposited by generally known methods, for example by a CVD method. Accordingly, a capacitor having a first counter electrode and a second counter electrode is obtained as can be seen from FIG. 5O.

At this point, optionally a further CMP step can be performed and the completed storage capacitor 2 is obtained.

As an alternative, a CMP step can be performed so as to expose the top portion of the second section 204 of the storage electrode and the steps which have been described with reference to FIGS. 5G to 5O can be repeated so as to obtain a capacitor having three counter electrodes. The steps of conducting a CMP step and the steps as described with reference to FIGS. 5G to 5O can be repeated many times until the desired height of the storage electrode 20 and, thus, the desired capacity of the storage capacitor is obtained.

As can be seen from FIG. 5O, the storage capacitor 2 comprises a storage electrode 20 having a first section 202 and a second section 204. The first counter electrode 210 is made of the first conductive layer 21 and comprises a first portion 210a and a second portion 210b. The first portion 210a extends substantially in parallel with the first section of the storage electrode 202, whereas the second portion 210b is arranged in parallel with the base material surface 251. Likewise, the second counter electrode 220 comprises a first portion 220a and a second portion 220b. The first portion 220a extends substantially in parallel with the second section 204 of the storage electrode whereas the second portion of the second counter electrode 220b extends substantially in parallel with the second section of the first counter electrode 210b.

As has been illustrated, the storage capacitor 2 according to the illustrated embodiment can be manufactured by a simple process, in which several stacks are stacked on each other. For example, the storage electrode may be formed by stacking the single sections thereof on each other. To be more specific, by performing a method in accordance to an embodiment of the invention, a storage electrode having an aspect ratio of greater than 40, for example 50 to 100, can be manufactured with etching steps of etching holes having a low aspect ratio of 20 and below. Accordingly, a capacitor having a high capacitance can be formed without the necessity to perform an etching step with a high aspect ratio. Accordingly, in contrast to the known methods of manufacturing a storage capacitor, the total height and, consequently, the total capacitance of the resulting capacitor is no more limited by the aspect ratio which can be achieved during a single etching step.

According to a modification of the described process steps, the process steps which are described in the following, can be performed starting from the structure illustrated in FIG. 5D, so as to obtain a landing pad on top of the first section 202 of the storage electrode. Due to this landing pad, the alignment of the opening of the second section 203 of the storage electrode with respect to the first section 202 of the storage electrode can be simplified.

FIG. 6A illustrates a structure which is identical with the structure illustrated in FIG. 5D. Starting from the structure illustrated in FIG. 6A, the material of the first section 202 of the storage electrode is etched by known methods. The resulting structure is illustrated in FIG. 6B.

Next, an isotropic etching step, for example, a wet etching step is performed so as to widen the openings above the first section 202 of the storage electrode. Thereby, extended openings 26 are formed in the silicon dioxide layer 212. The resulting structure is illustrated in FIG. 6C.

Next, a material for the landing pad, for example W, TiN, polysilicon, which may be, for example, identical with the material of the first section 202 of the storage electrode may be deposited, followed by a CMP step. Thereby, a landing pad 261 is obtained. The resulting structure is illustrated in FIG. 6D. Thereafter, the steps which are described with reference to FIGS. 5E to 5K are repeated.

As is illustrated in FIG. 5K, when etching the openings 203, the silicon dioxide layer 215 is etched selectively with respect to the material of the landing pad 261 so that this etching step is terminated as soon as a contact to the landing pad is made.

According to an embodiment of the invention which is described with reference to FIGS. 7A to 7Q, stacked contacts in the peripheral region of the memory device are formed together with the stacked stack capacitor in the memory cell array, the stacked contacts as well as the stacked stack capacitor being formed on the same substrate.

According to an embodiment of the invention, the high aspect ratio contacts for contacting the support portion can be manufactured in an easy manner. For example, the increased complexity of the method of forming the capacitor having multiple counter electrodes can be compensated by simultaneously forming the contacts having a high aspect ratio for contacting the peripheral portion.

In the following figures, the cross-section between II and II denotes cross-sectional views of the capacitor, whereas the cross-section between III and III illustrates cross-sectional views of the contacts formed in the peripheral portion of the memory device. An exemplary location of the cross-sectional views between II and II or III and III, respectively, can be seen from FIG. 4.

The base material layer having the surface 251 may be formed on a processed silicon substrate, in which the main components of the memory cell array as well as the peripheral circuitry are formed. Usually, the peripheral circuitry and the components memory cell array are formed at least partially simultaneously. For example, common deposition processes and etching processes may be used for the memory cell array and the peripheral circuitry, using for example different masks for patterning the different components.

As illustrated in FIG. 7A, first, a capacitor contact 24 is formed in the memory cell array, whereas, by performing the same process steps, a support contact pad 31 is formed in the peripheral portion. The support contact has a smallest dimension in the horizontal direction of approximately 1,5 F. For defining the capacitor contact and for forming the support contact pad, different photolithographical masks can be used. The capacitor contact 24 and the support contact pad 31 are formed in the silicon nitride layer 241.

In the next step, a silicon dioxide layer 212 is deposited on the memory cell array as well as in the peripheral portion, as can be seen from FIG. 7B. In the next step, in the memory cell array, an opening 201 for the first storage electrode 201 is lithographically defined as has been described with reference to FIG. 5C. In addition, in the peripheral portion of the memory device, a first support contact opening 32 is lithographically defined in the silicon dioxide layer 212. For example, the mask for defining the opening 32 may be different from the mask used for defining the opening 201. After photolithographically defining the openings, the silicon dioxide layer 212 is etched so as to form the openings 201 and 32 in the manner which has been described with reference to FIG. 5C.

The resulting structure is illustrated in FIG. 7C.

Thereafter, a conductive material is deposited so as to fill the openings 201 and 32, respectively. Thereafter, the CMP or back-etching step is performed so as to obtain the structure illustrated in FIG. 7D. For example, in FIG. 7D, the first section of the storage electrode 202 may be formed in the memory cell array portion, whereas the first section 33 of the support contact is formed in the peripheral portion.

Thereafter, in the same manner as is described with reference to FIG. 5E, the silicon dioxide layer 212 is etched so as to essentially completely expose the first section 202 of the storage electrode as well as the first portion 33 of the support contact. The resulting structure is illustrated in FIG. 7E.

In the next step, the dielectric layer 211 as well as the first conductive layer 21 are deposited, as has been described with reference to FIG. 5F. Subsequently, a block mask (not illustrated) is deposited on the array portion, leaving the peripheral portion of the memory device exposed. Thereafter, the conductive layer 21 is etched in the peripheral portion, while in the array portion the conductive layer 21 is maintained. The block mask which can for example be made of a material such as resist, silicon nitride, polysilicon or other suitable materials, is removed thereafter.

The resulting structure is illustrated in FIG. 7F.

In the next step a silicon dioxide layer 213 may be deposited by generally known methods, and a CMP step is performed so as to obtain the structure illustrated in FIG. 7G.

As can be seen from FIG. 7G, in the peripheral portion between III and III, the dielectric layer 211 is directly adjacent to the silicon dioxide layer 213. In the array portion, as is illustrated between II and II, the silicon dioxide layer is adjacent to the first conductive layer 21.

In the next step, an oxide back-etching step as well as a step of etching the conductive layer 21 are performed, as is described with reference to FIG. 5H. The resulting structure is illustrated in FIG. 7H.

In the next step, a silicon nitride liner 214 is deposited in the array portion and in the peripheral portion, in the manner which has been described with reference to FIG. 5I. The resulting structure is illustrated in FIG. 7I.

Thereafter, a silicon dioxide layer 215 is deposited in the array portion and in the peripheral portion in the manner which has been described with reference to FIG. 5J. The resulting structure is illustrated in FIG. 7J.

Figure 7K:
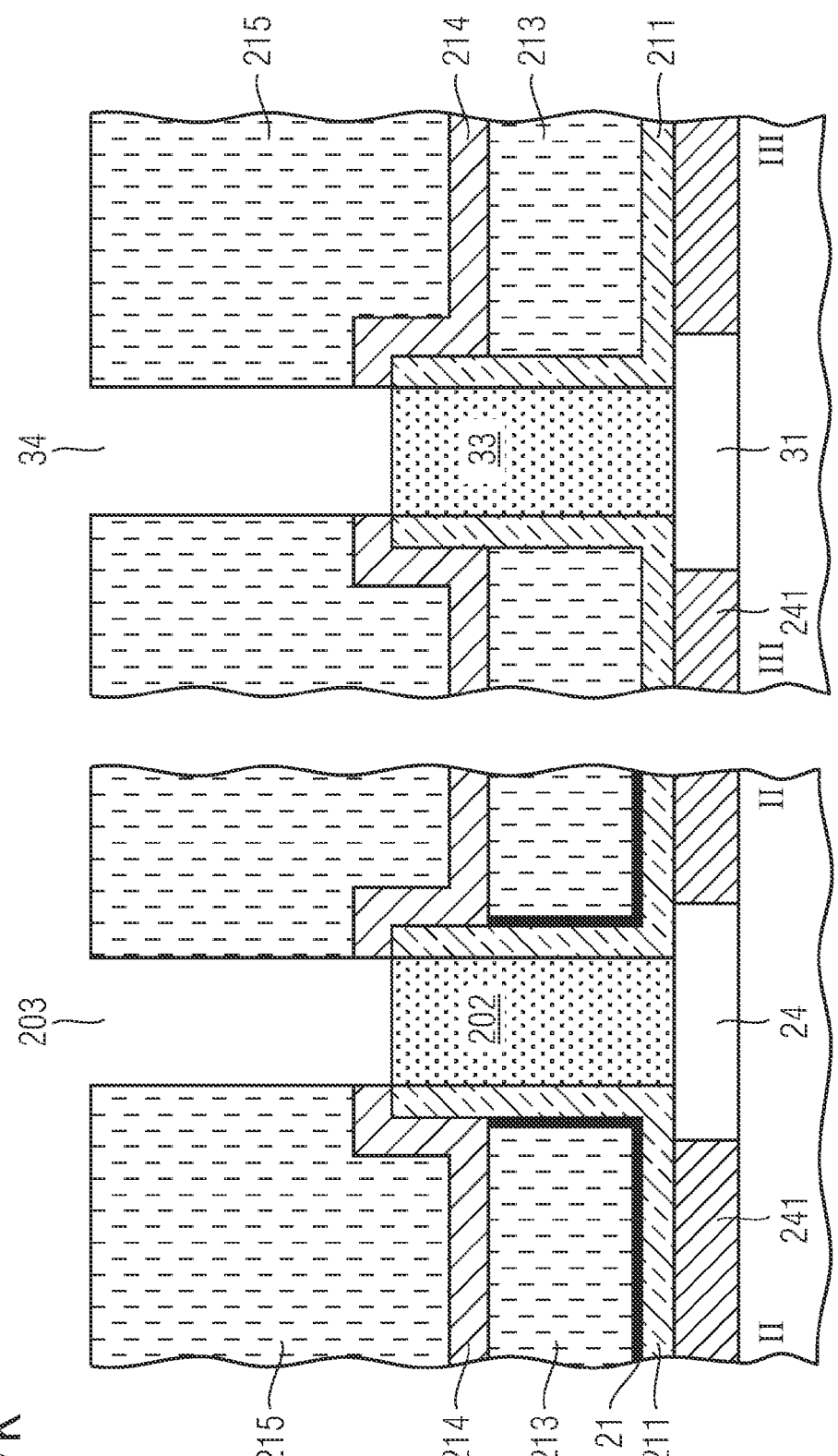
FIGS. 7A to 7Q illustrate a further embodiment of the method of manufacturing a memory device.
Figure 70:
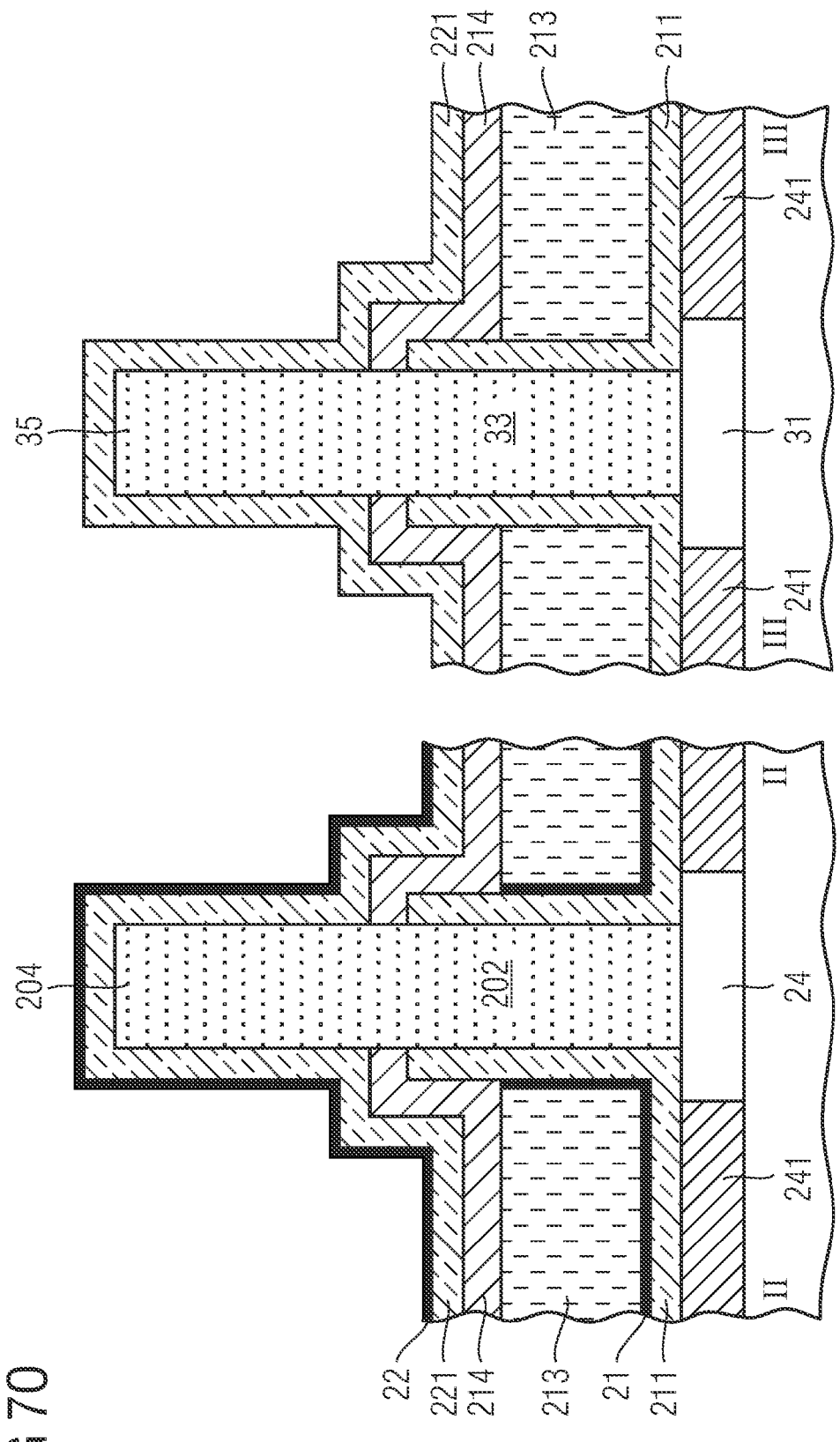

In the next step, openings 203 for the second section of the storage electrode are etched in the array portion, whereas openings 34 for the second section of the support contact are formed in the peripheral portion. This etching step is performed in the manner which has been described with reference to FIG. 5K. The resulting structure is illustrated in FIG. 7K.

Thereafter, a conductive material is deposited so as to form the second section 204 of the storage electrode and the second portion of the support contact, respectively, and a CMP or back-etching step is performed so as to obtain the structure illustrated in FIG. 7L. The steps of depositing the conducting material and the CMP or back-etching step are performed in the same manner which has been described with reference to FIG. 5L.

Thereafter, a step of etching the silicon dioxide layer 215 is performed in the same manner as has been described with reference to FIG. 5M. The resulting structure is illustrated in FIG. 7M.

In the next step, the second dielectric layer 221 and the second conductive layer 22 are deposited in the array portion between II and II as well as in the peripheral portion between III and III. These steps are performed in the same manner as has been described with reference to FIG. 5N. The resulting structure is illustrated in FIG. 7N.

In the next step, a block mask (not illustrated) is formed over the array portion between II and II, leaving the peripheral portion between III and III exposed. The block mask again can be made of a suitable material such as silicon nitride, poly-silicon or other materials. Thereafter, an etching step is performed, so as to remove the second conductive layer 22 from the peripheral portion of the memory device. The resulting structure is illustrated in FIG. 7O.

Figure 7P:
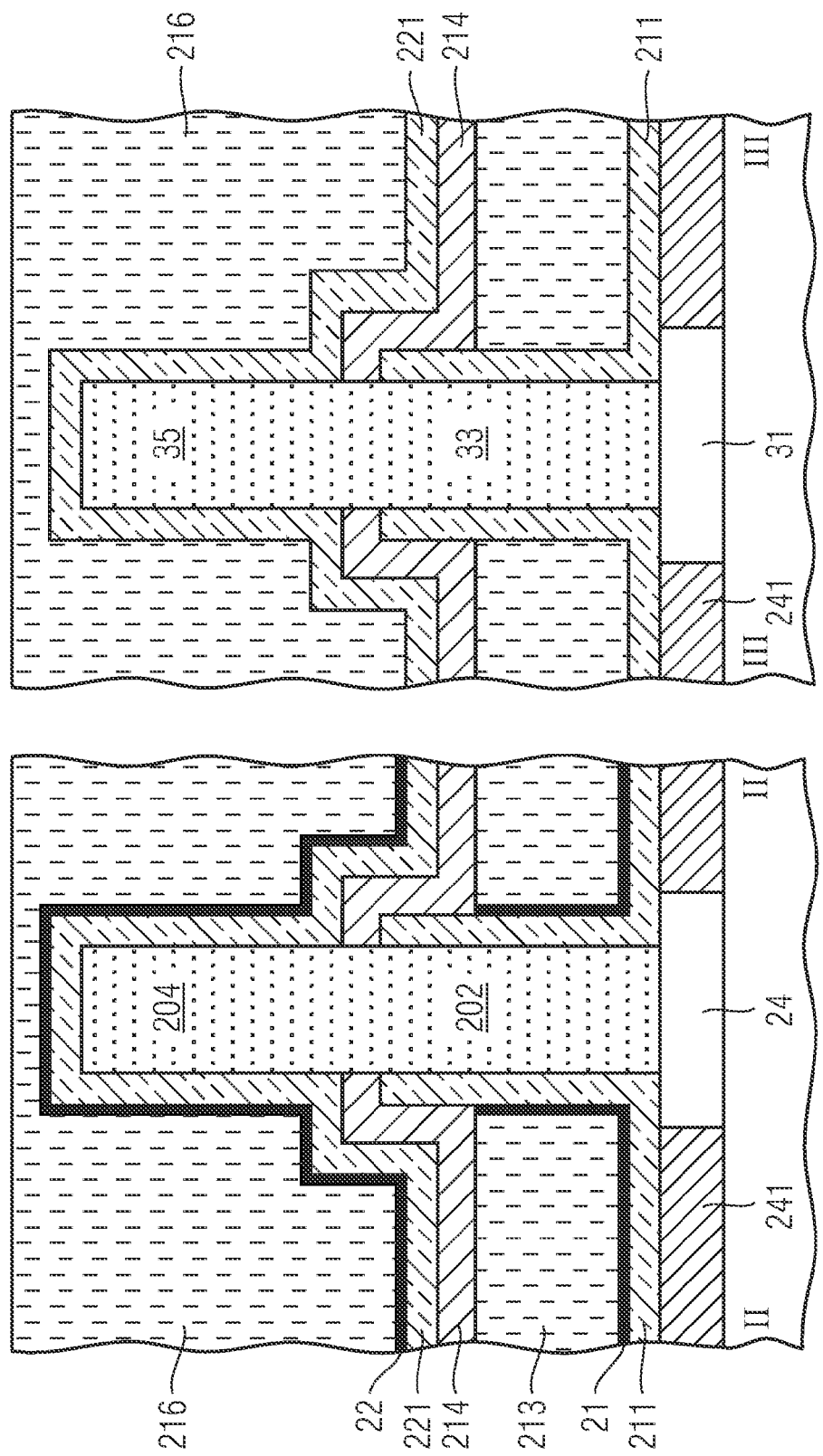

In the next step, a silicon dioxide layer 216 is deposited in the same manner which has been described with reference to FIG. 5O. The resulting structure is illustrated in FIG. 7P. As can be seen, in the peripheral portion between III and III, the second dielectric layer 221 is directly adjacent to the silicon dioxide layer 216.

Thereafter, a CMP step can be performed and the steps which have been described with reference to FIG. 7G to FIG. 7P can be repeated so as form a third capacitor and a third section of the support contact, respectively, or a further section of the storage electrode and of the support contact, respectively, until a desired height and, thus, a desired capacitance, of the capacitor is obtained.

Alternatively, a CMP step can be performed and a final contact in the support portion can be made. For example, this can be achieved by photolithographically defining an opening for the support contact plug and by filling the opening with a suitable conductive material. Thereby, a support contact plug 36 is provided.

Figure 7Q:
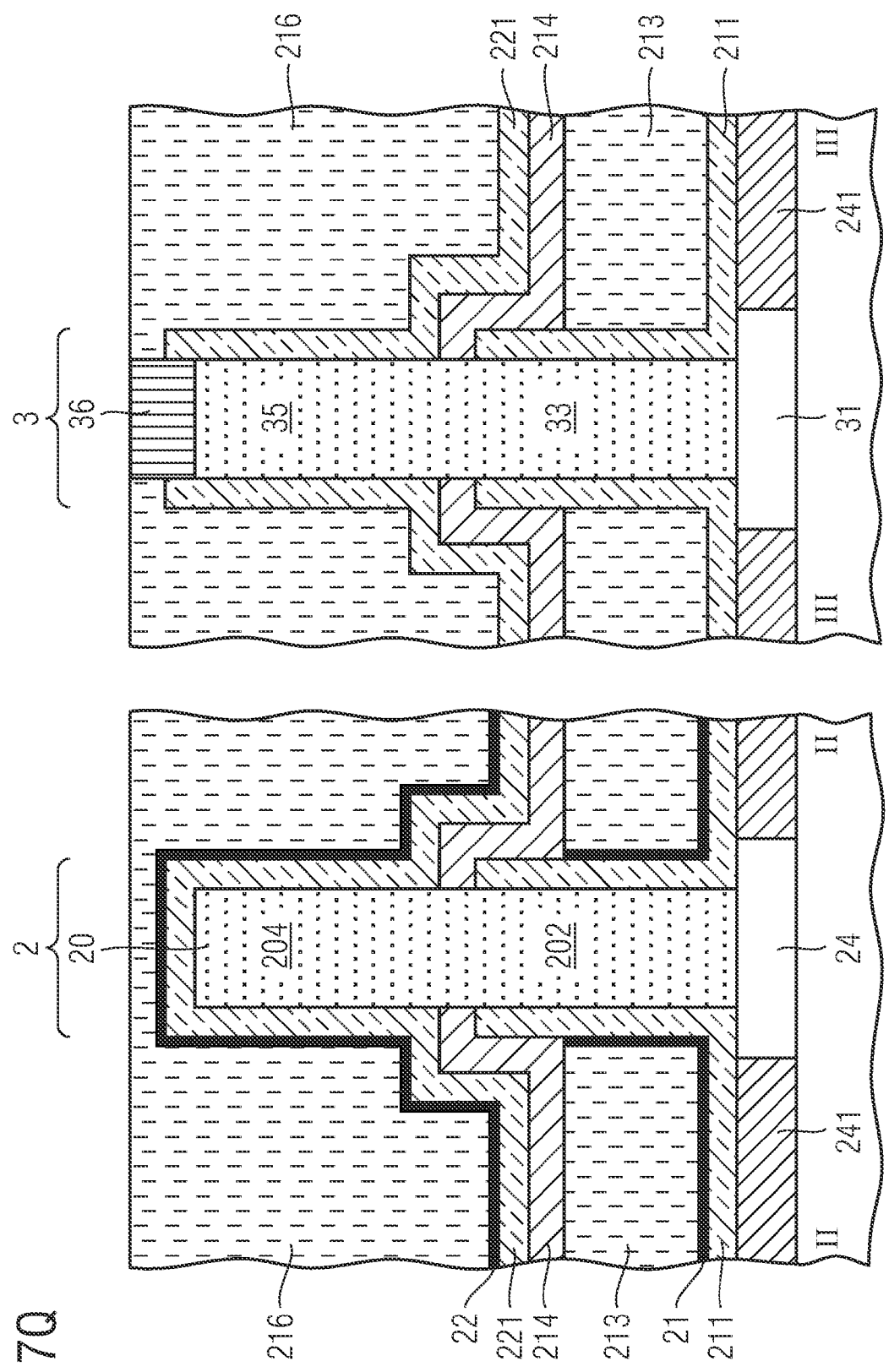

FIG. 7Q illustrates an exemplary cross-sectional view between II and II in the array portion and between III and III in the peripheral portion of the memory device. FIG. 7Q is only an exemplary cross-sectional view and it is obvious, that the storage electrode can include more than the illustrated two sections. In addition, likewise the support contact can comprise more than the two sections which are illustrated in FIG. 7Q. As is illustrated in FIG. 7Q, the support contact 3 comprises at least two sections 33 and 35 as well as a contact plug 36 so as to connect the support contact with the higher metallization layers.

As has been illustrated in the foregoing, embodiments of the present invention provide a method of manufacturing a memory cell array comprising storage capacitors having a greatly enlarged capacitance. The storage electrode may extend to an enlarged height, by way of example. A problem concerning the high aspect ratio of the support contacts which have to be formed in the peripheries of such a memory cell array is solved by a method according to a further embodiment of the present invention, in which single sections of the support contact are stacked. Further, a step of levelling which is necessary in the known methods, may be avoided.

FIGS. 11A to 11M illustrate a further embodiment of the present invention, which may be regarded as a modification of what is described above, wherein in the etching step exposing the first or second section of the storage electrode, the silicon dioxide layer is not etched in the peripheral portion. As a consequence, the corresponding section of the support contact is not exposed. This modification may provide a more robust process in which the danger of a breaking of the support contacts is largely eliminated. Due to a large amount of redundancy in the memory cell array, the breaking of a storage electrode may not be so critical, whereas, in contrast, a breaking of a support contact leads to a failure of the memory device.

Figure 11A:
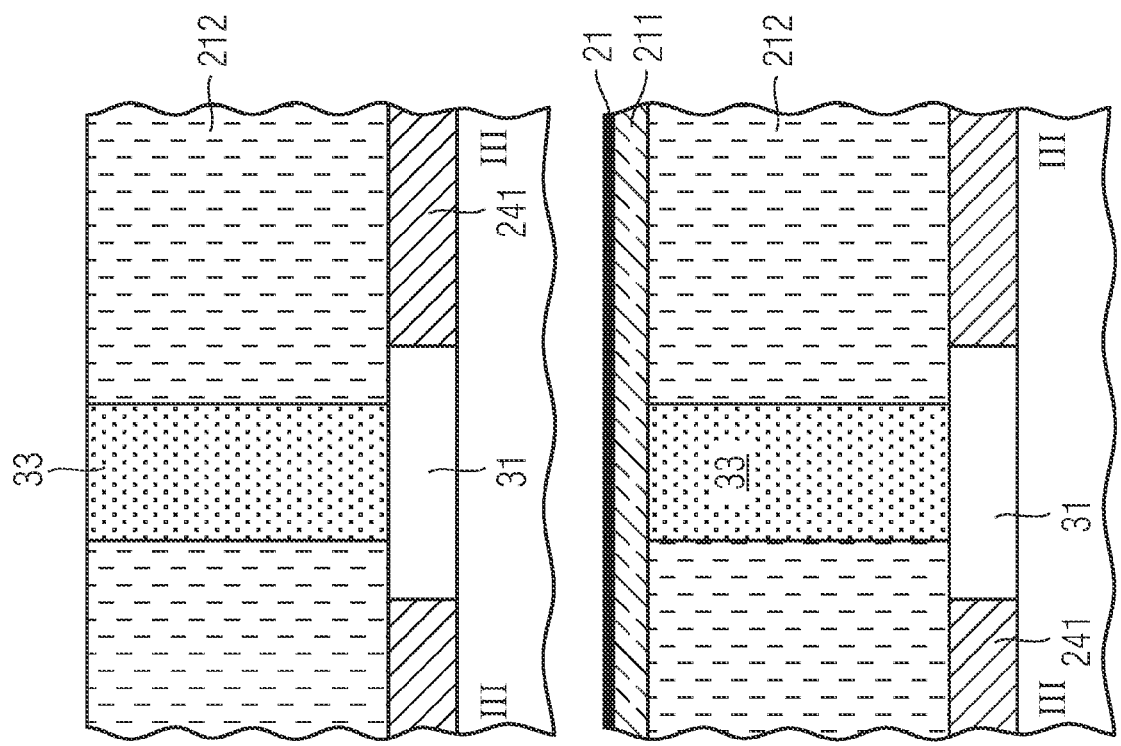

According to this embodiment, starting from FIG. 7D, a block mask (not illustrated) is deposited on the peripheral portion, leaving the array portion of the memory device exposed. Thereafter, in the same manner as is described with reference to FIG. 5E, the silicon dioxide layer 212 is etched in the array portion so as to essentially completely expose the first section 202 of the storage electrode. Then, the block mask which can for example be made of a material such as resist, silicon nitride, polysilicon or other suitable materials, is removed. The resulting structure is illustrated in FIG. 11A.

In the next step, the dielectric layer 211 as well as the first conductive layer 21 are deposited, as has been described with reference to FIG. 5F.

Figure 11B:
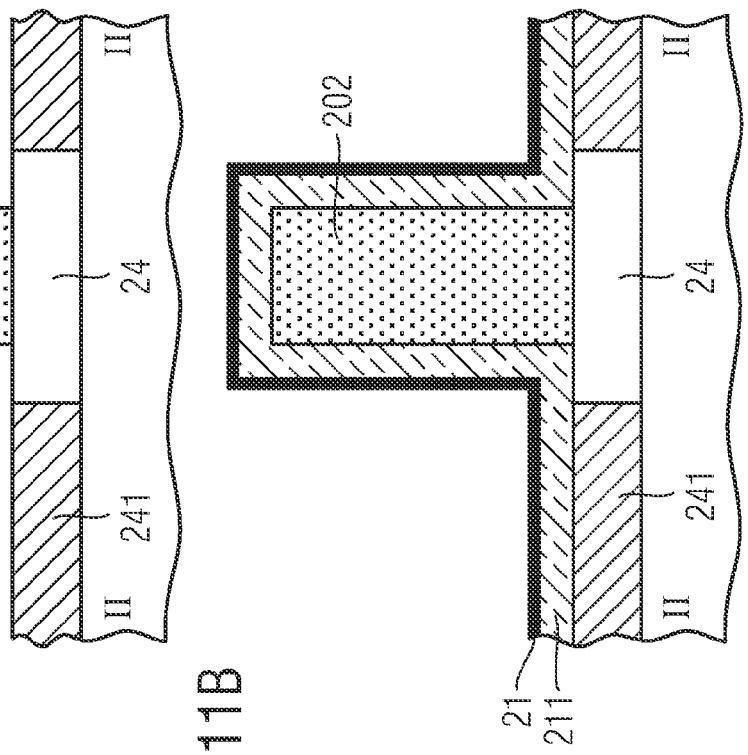

The resulting structure is illustrated in FIG. 11B.

In the next step a silicon dioxide layer 213 may be deposited by generally known methods. Thereafter, a block mask is deposited on the array portion, leaving the peripheral portion of the memory device exposed. Thereafter, the silicon dioxide layer 213 is etched in the peripheral portion whereas no silicon dioxide is etched in the array portion. After removing the block mask, the upper level of the silicon dioxide layer is equal in the array and in the peripheral portion.

Thereafter, a CMP step is performed, whereby the horizontal portion of the first conductive layer 21 and the dielectric layer 211 is removed. Thereby, the structure illustrated in FIG. 1C is obtained.

In the next step, an oxide back-etching step as well as a step of etching the conductive layer 21 are performed, as is described with reference to FIG. 5H. The resulting structure is illustrated in FIG. 11D.

Figure 11E:
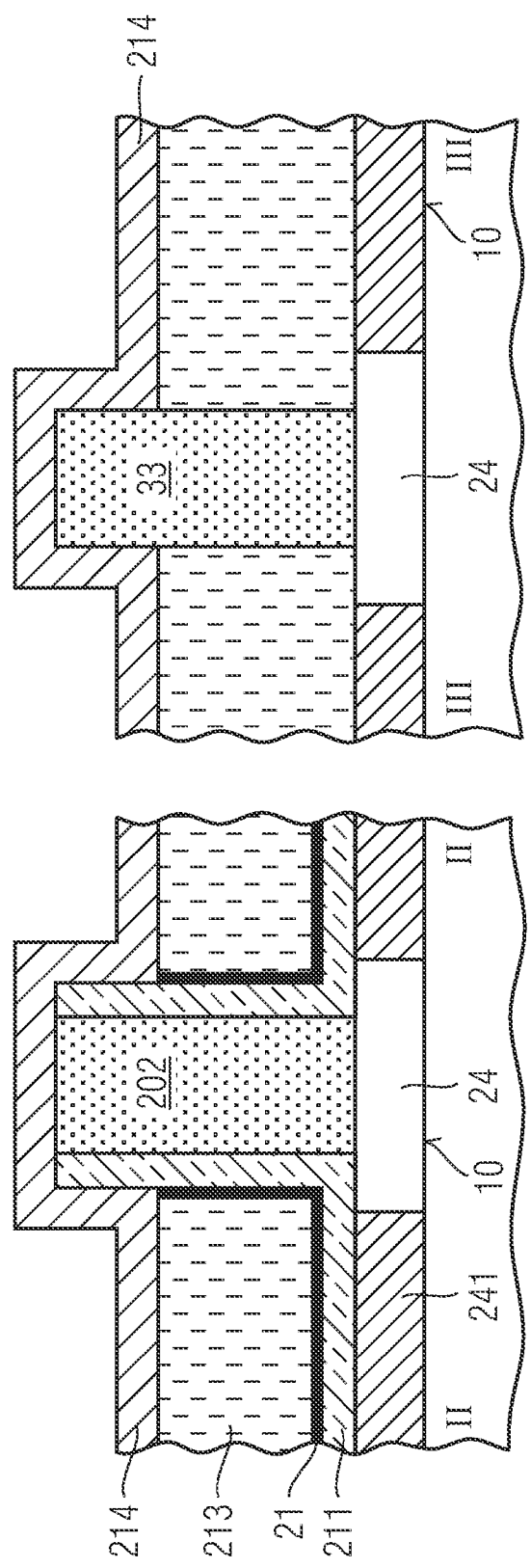

In the next step, a silicon nitride liner 214 is deposited in the array portion and in the peripheral portion, in the manner which has been described with reference to FIG. 5I. The resulting structure is illustrated in FIG. 11E.

Thereafter, a silicon dioxide layer 215 is deposited in the array portion and in the peripheral portion in the manner which has been described with reference to FIG. 5J. The resulting structure is illustrated in FIG. 11F.

In the next step, openings 203 for the second section of the storage electrode are etched in the array portion, whereas openings 34 for the second section of the support contact are formed in the peripheral portion. This etching step is performed in the manner which has been described with reference to FIG. 5K. The resulting structure is illustrated in FIG. 11G.

Figure 11H:
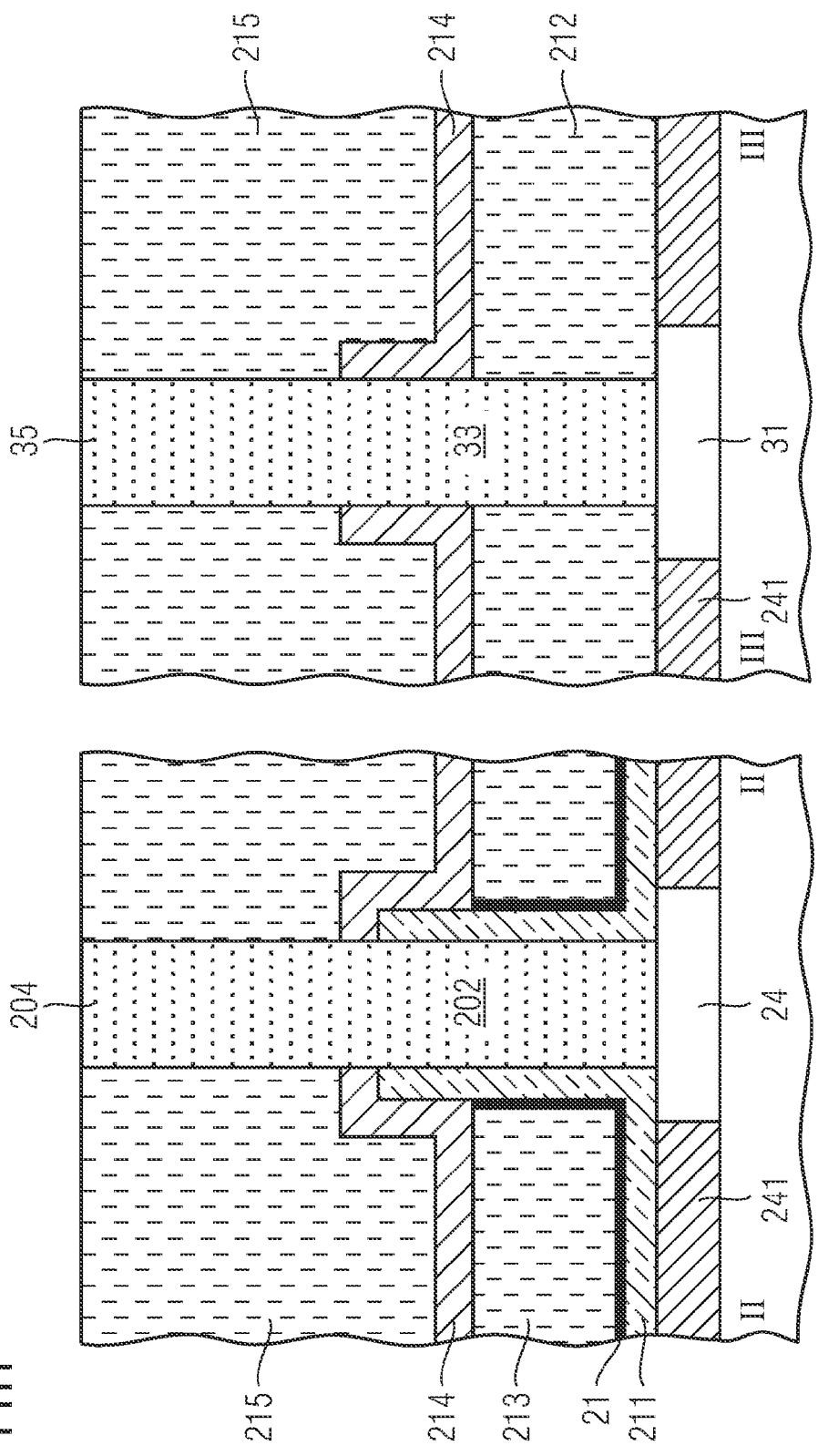

Thereafter, a conductive material is deposited so as to form the second section 204 of the storage electrode and the second portion of the support contact, respectively, and a CMP or back-etching step is performed so as to obtain the structure illustrated in FIG. 11H. The steps of depositing the conducting material and the CMP or back-etching step are performed in the same manner which has been described with reference to FIG. 5L.

Thereafter, a block mask (not illustrated) is deposited on the peripheral portion, leaving the array portion of the memory device exposed. Then, a step of etching the silicon dioxide layer 215 is performed in the same manner as has been described with reference to FIG. 5M. Thereby, only the silicon dioxide layer 215 in the array portion is removed, while maintaining the silicon dioxide layer 215 in the peripheral portion. Then, the hard mask layer is removed from the peripheral portion. The resulting structure is illustrated in FIG. 11I.

Figure 11J:
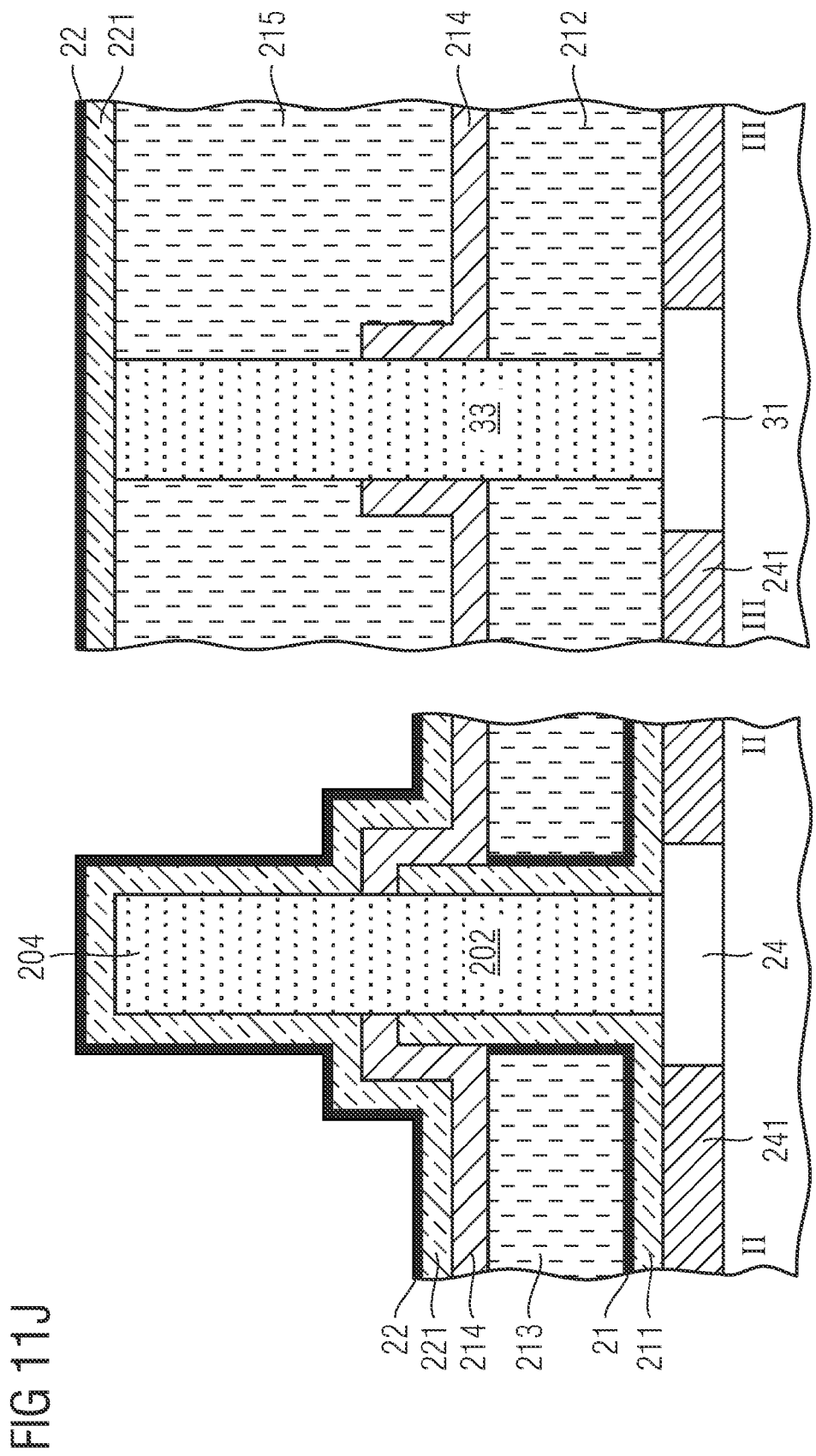

In the next step, the second dielectric layer 221 and the second conductive layer 22 are deposited in the array portion between II and II as well as in the peripheral portion between III and III. These steps are performed in the same manner as has been described with reference to FIG. 5N. The resulting structure is illustrated in FIG. 11J.

Figure 11K:
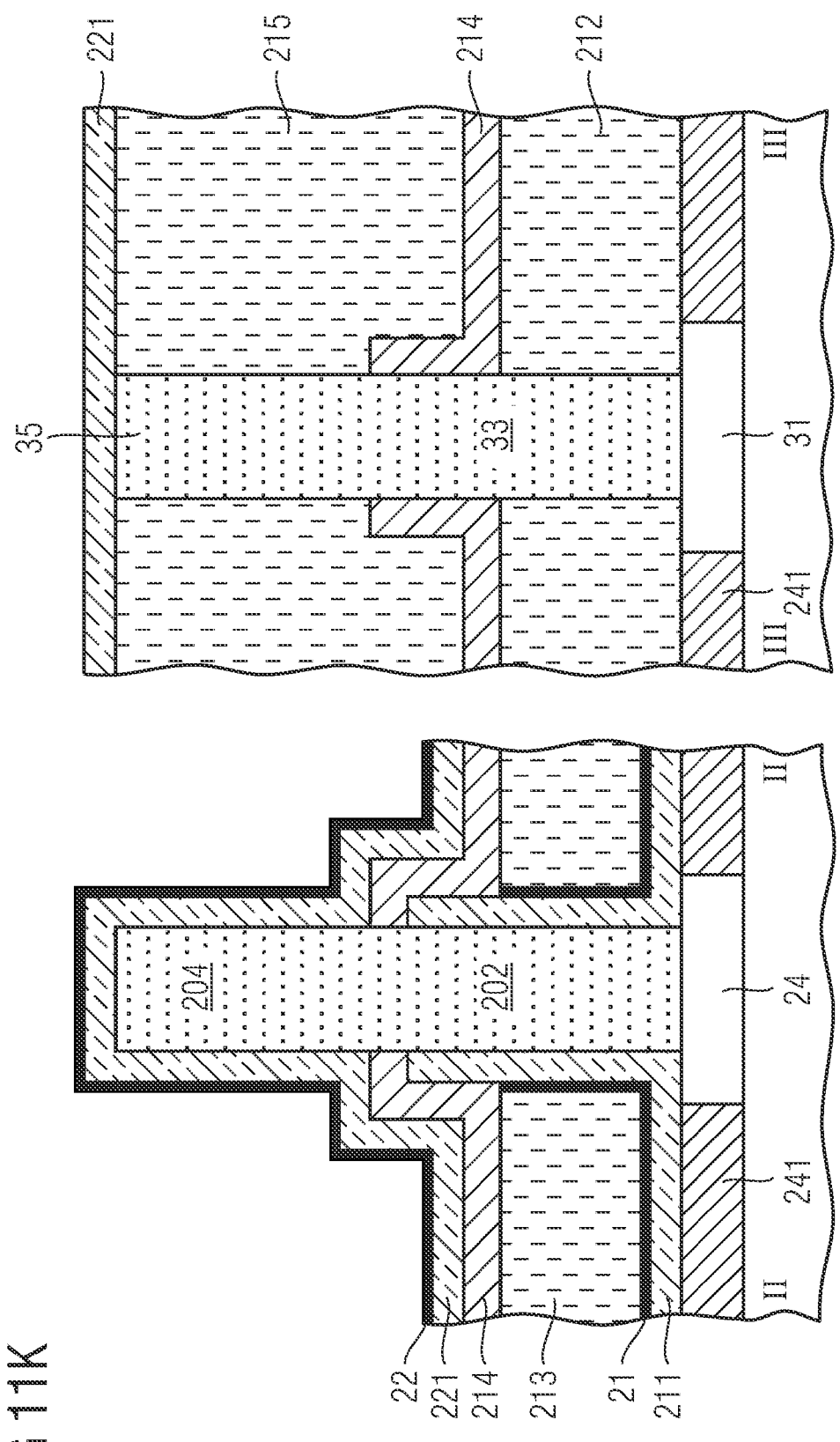

In the next step, a block mask is formed over the array portion between II and II, leaving the peripheral portion between III and III exposed. The block mask again can be made of a suitable material such as resist, silicon nitride, poly-silicon or other materials. Thereafter, an etching step is performed, so as to remove the second conductive layer 22 from the peripheral portion of the memory device. The resulting structure is illustrated in FIG. 11K.

In the next step, a silicon dioxide layer 216 is deposited in the same manner which has been described with reference to FIG. 5O. Thereafter, a block mask is deposited on the array portion, leaving the peripheral portion of the memory device exposed. Thereafter, the silicon dioxide layer 216 is etched in the peripheral portion whereas no silicon dioxide is etched in the array portion. After removing the block mask, the upper level of the silicon dioxide layer is equal in the array and in the peripheral portion.

The resulting structure is illustrated in FIG. 11L.

Thereafter, a CMP step can be performed and the steps which have been described with reference to FIG. 11C to FIG. 11L can be repeated so as form a third capacitor and a third section of the support contact, respectively, or a further section of the storage electrode and of the support contact, respectively, until a desired height and, thus, a desired capacitance, of the capacitor is obtained.

Alternatively, a CMP step can be performed and a final contact in the support portion can be made. For example, this can be achieved by photolithographically defining an opening for the support contact plug and by filling the opening with a suitable conductive material. Thereby, a support contact plug 36 is provided.

FIG. 11M illustrates an exemplary cross-sectional view between II and II in the array portion and between III and III in the peripheral portion of the memory device, the view of FIG. 11M being similar to the view of FIG. 7Q.

A further embodiment of the present invention will be explained with reference to FIGS. 8A to 8O. According to the embodiment, for example, the storage capacitor according to a further embodiment of the invention may be formed by performing the same process steps as described before, wherein a backside electrode contact is also formed simultaneously, the backside electrode contact and the stacked stack capacitor being formed on the same substrate. As it is obvious to the person skilled in the art, the steps of the embodiments described above can be combined so as to simultaneously form the storage electrode, the backside electrode contact as well as the support contact.

First, in the same manner as has been described with reference to FIG. 5A, a node contact pad 24 is formed in a silicon nitride layer 241 in the array portion. At the same time, a backside electrode contact pad 41 is formed in the silicon nitride layer 241. The backside electrode contact pad 41 can be formed by photolithographically defining an opening in the silicon nitride layer 241, wherein a mask is used for the backside electrode contact portion which is different from the mask for the array portion. The mask for the backside electrode contact portion can be the same as for the support contacts formed in the peripheral portion of the memory device. The cross-section between IV and IV illustrates the cross-sectional view of the backside electrode contact as can also be seen from FIG. 4.

In the next step, in the same manner as has been described with reference to FIG. 5B, a silicon dioxide layer 212 is deposited in the array portion as well as in the backside electrode contact portion. The resulting structure is illustrated in FIG. 8B.

Thereafter, in the manner which has been described with reference to FIG. 5C, an opening 201 for the first section of the storage electrode is photolithographically defined in the array portion. Simultaneously, an opening for the first section of the backside electrode contact is photolithographically defined in the backside electrode contact portion between IV and IV. For example, again the mask for defining the opening for the backside electrode contact can be different from the mask used for defining the opening for the first section of the storage electrode. Thereafter, an etching step for etching the silicon dioxide layer 212 so as to form the openings 201 and 42, respectively, is performed in the manner which has been described with reference to FIG. 5C. The resulting structure is illustrated in FIG. 8C.

Thereafter, a conducting material for forming the first section of the storage electrode and simultaneously the first section of the backside electrode contact is deposited and, subsequently, a CMP or back-etching step is performed. These steps are performed in the manner which has been described with reference to FIG. 5D. For example, W, polysilicon or TiN can be deposited as the material for the first section of the storage electrode and for the first section of the backside electrode contact, respectively. The resulting structure is illustrated in FIG. 8D.

Thereafter, an etching step is performed so as to etch the silicon dioxide layer 212, in the manner which has been described with reference to FIG. 5E. The resulting structure is illustrated in FIG. 8E.

Thereafter, a first dielectric layer 211, which can for example be made of $Al_2O_3$ or AlHfO and a first conductive layer 21, which can for example be made of TiN, is deposited in the same manner as has been described with reference to FIG. 5F. For example, the first dielectric layer 211 and the first conductive layer 21 are deposited in the array portion as well as in the backside electrode contact portion. The resulting structure is illustrated in FIG. 8F.

Thereafter, a silicon dioxide layer 213 is deposited and planarized by performing a CMP step in the manner which has been described with reference to FIG. 5G. As a result, the structure illustrated in FIG. 8G is obtained. As can be seen from FIG. 8G, the oxide layer 213 is deposited in the array portion as well as in the backside electrode contact portion. Additionally, the CMP step is performed in both portions.

In the next step, a block mask for protecting the backside electrode contact portion between IV and IV is deposited, leaving the array portion between II and II exposed. Thereafter, a back-etching step for etching the silicon dioxide layer 213 is performed, and, additionally, a step of etching the first conductive layer 21 is performed. As a result, as is illustrated in FIG. 8H, the silicon dioxide layer 213 as well as the first conductive layer 21 are recessed in the array portion, while in the backside electrode contact portion no recess is made. In the backside electrode contact portion, the silicon dioxide layer and the first conductive layer may extend, for example, to the same height as the first section 43 of the backside electrode contact.

The step of etching back the silicon dioxide layer 213 and the first conductive layer 21 are formed in the same manner as has been described with respect to FIG. 5H.

Figure 8I:
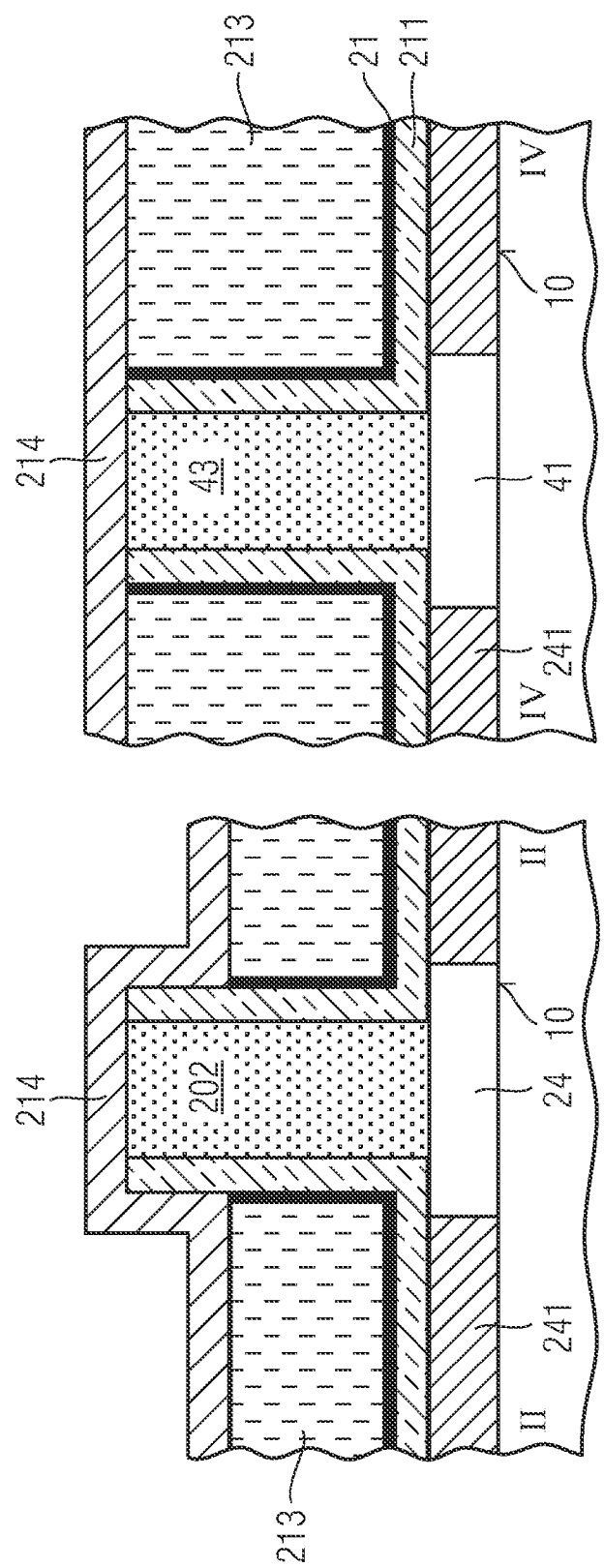
FIGS. 8A to 8P illustrate a further embodiment of the method of manufacturing a memory cell array.

In the next step, a silicon nitride liner 214 is deposited in the same manner as has been described with reference to FIG. 5I. The resulting structure is illustrated in FIG. 8I. As can be seen from FIG. 8I, in the backside electrode contact portion between IV and IV the silicon nitride liner 214 is deposited as the horizontal layer.

In the next step, a silicon dioxide layer 215 is deposited in the memory cell array portion as well as in the backside electrode contact portion. This step is performed in the same manner as has been described with reference to FIG. 5J. The resulting structure is illustrated in FIG. 8J.

Figure 8K:
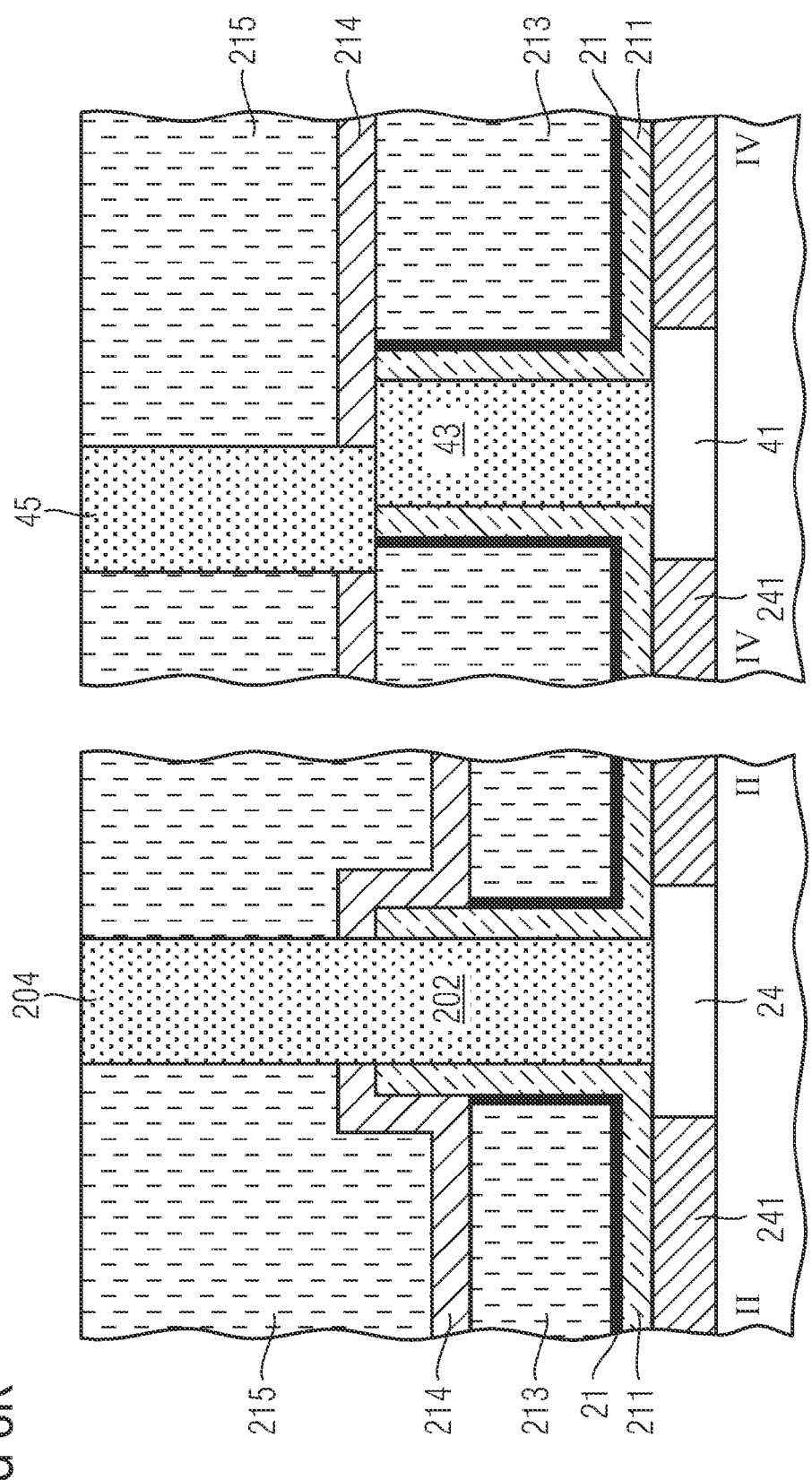

In the next step, openings 203 and 44 are formed in the silicon dioxide layer 215. The step for forming the opening 203 for the second section of the storage electrode is performed in the same manner as has been described with reference to FIG. 5K. The opening 44 for the second section of the backside electrode contact is photolithographically defined so as to expose a portion of the first conductive layer 21 as well as a portion of the first section 43 of the backside electrode contact. In other words, a misalignment is intentionally introduced, so that the opening 44 is not exactly above the first section of the backside electrode contact. The opening 44 may be moved or displaced sidewards with respect to the first section 43 of the backside electrode contact, by way of example. Due to this misalignment, a portion of the first conductive layer 21 is exposed and simultaneously, a portion of the first section of the backside electrode contact is exposed. The resulting structure is illustrated in FIG. 8K.

In the next step, a conducting material such as W, polysilicon or TiN is deposited in the same manner as has been described with reference to FIG. 5L. Additionally, a CMP or back-etching step is performed so as to obtain a planarized surface, as is illustrated in FIG. 8L. As can be seen from FIG. 8L, the first section of the storage electrode 202 and the second section of the storage electrode 204 are stacked over each other, and, likewise, in the backside electrode contact portion between IV and IV, the first section of the backside electrode contact 43 and the second section of the backside electrode contact are stacked in a staggered manner resulting in a short between the first conductive layer 21 and the first and second sections of the backside electrode contact.

In the next step, the silicon dioxide layer 215 is etched in the manner which has been described with reference to FIG. 5M. The resulting structure is illustrated in FIG. 8M.

Figure 8N:
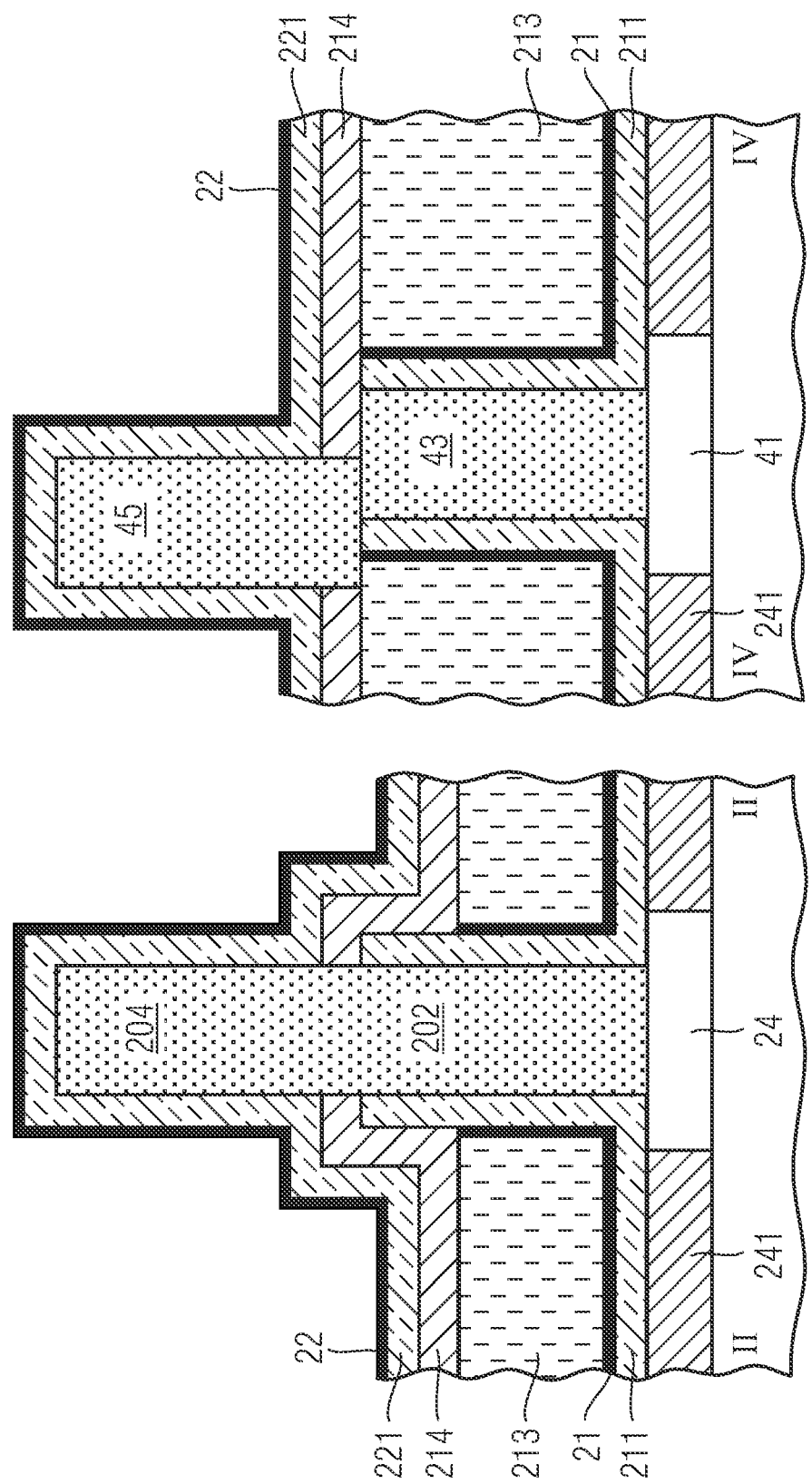

In the next step, a second dielectric layer 221 and a second conductive layer 22, which can be made of the same materials as the first dielectric layer 211 and the first conductive layer 21, respectively, are deposited in the manner which has been described with reference to FIG. 5N. The resulting structure is illustrated in FIG. 8N.

In the next step, a silicon dioxide layer 216 is deposited in the manner which has been described with reference to FIG. 5O. The resulting structure is illustrated in FIG. 8O. Thereafter, a CMP step for exposing the top most portion of the second section 204 of the storage electrode and the top most portion of the second section 45 of the backside electrode contact can be performed, and, subsequently, the steps which have been described with reference to FIGS. 8G to 8O can be repeated, so as to obtain a multiple stacked stack capacitor as well as a multiple stacked backside electrode contact. For example, a triple or 4-, 5- or n-fold stack can be formed until a desired height and, consequently, a desired capacitance of the stack capacitor is obtained.

Alternatively, as is illustrated in FIG. 8P, optionally a CMP step can be performed, and, thereafter, a final contact in the backside electrode portion between IV and IV can be formed. To this end, an opening for the backside electrode contact is photolithographically defined so that the second conductive layer 22 as well as the top most portion of the second section 45 of the backside electrode contact are exposed. In other words, the opening for the backside electrode contact plug 46 is photolithographically defined in an intentionally misaligned manner, so that a portion in the silicon dioxide layer 216 above the vertical portion of the second conductive layer 22 as well as part of the top most portion of the second section of the backside electrode contact 45 are exposed. Thereafter, the opening is filled with a conducting material and a CMP step is performed, thereby obtaining a backside electrode contact plug 46. Lines (not illustrated) for externally contacting the backside electrode contact can be lead through in a top portion or a bottom portion of the illustrated layer stack. The resulting structure is illustrated in FIG. 8P.

In the cross-section between II and II, a capacitor 2 is formed, comprising a storage electrode 20 as well as at least two counter electrodes in the manner which has been described before with reference to FIG. 5P. In addition, in the cross-sectional view between IV and IV a backside electrode contact is formed comprising at least two sections, which are arranged in such a manner that an electrical contact between the backside electrode contact as well as the at least two counter electrodes is obtained.

By the methods according to the embodiments, since the backside electrode contacts are formed by stacking single sections on each other, backside electrode contacts having a greatly enlarged height can be formed, without the necessity of etching with a high aspect ratio.

Figure 9:
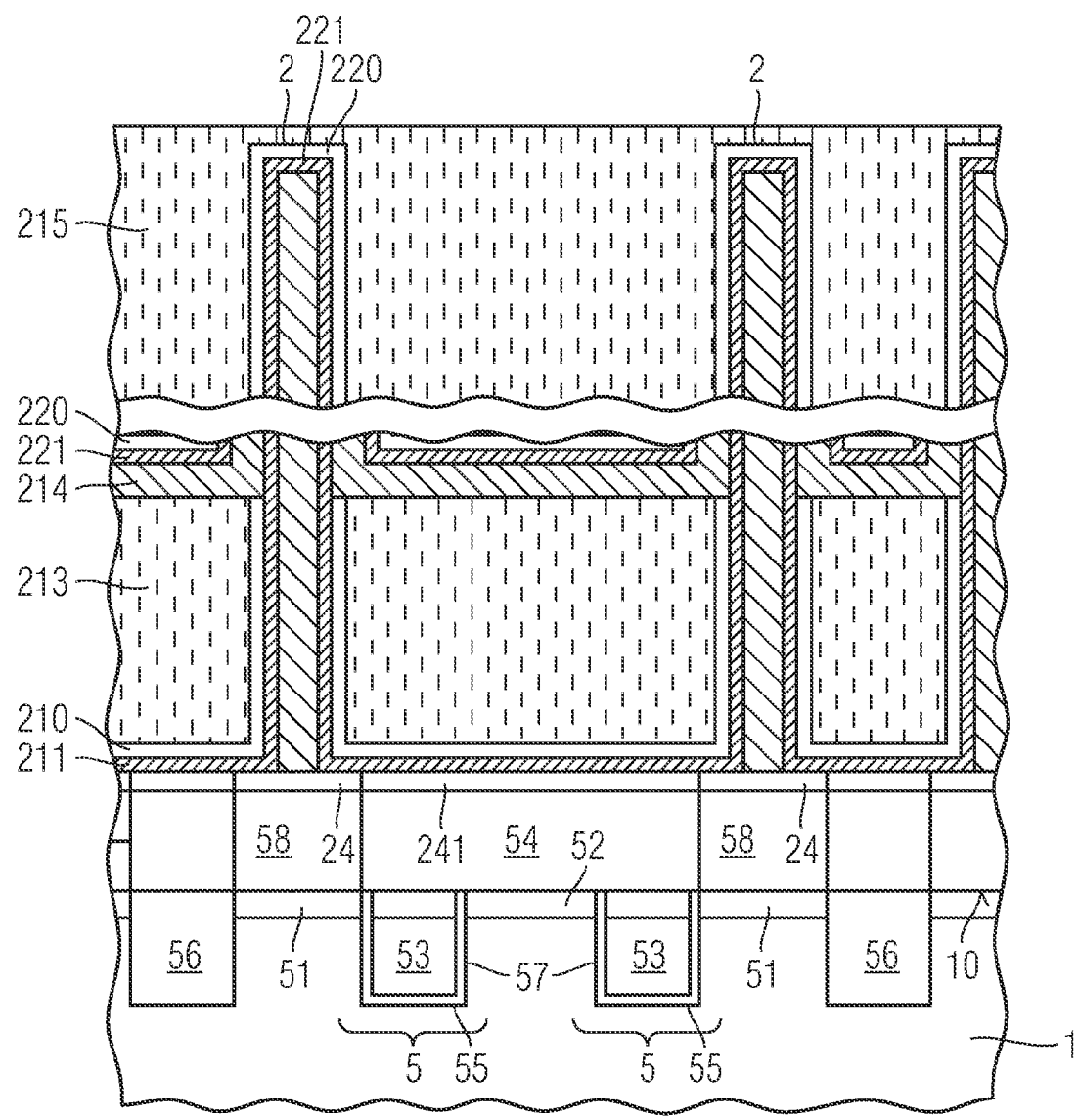
FIG. 9 illustrates an exemplary cross-sectional view of a memory cell according to a further embodiment.
Figure 10:
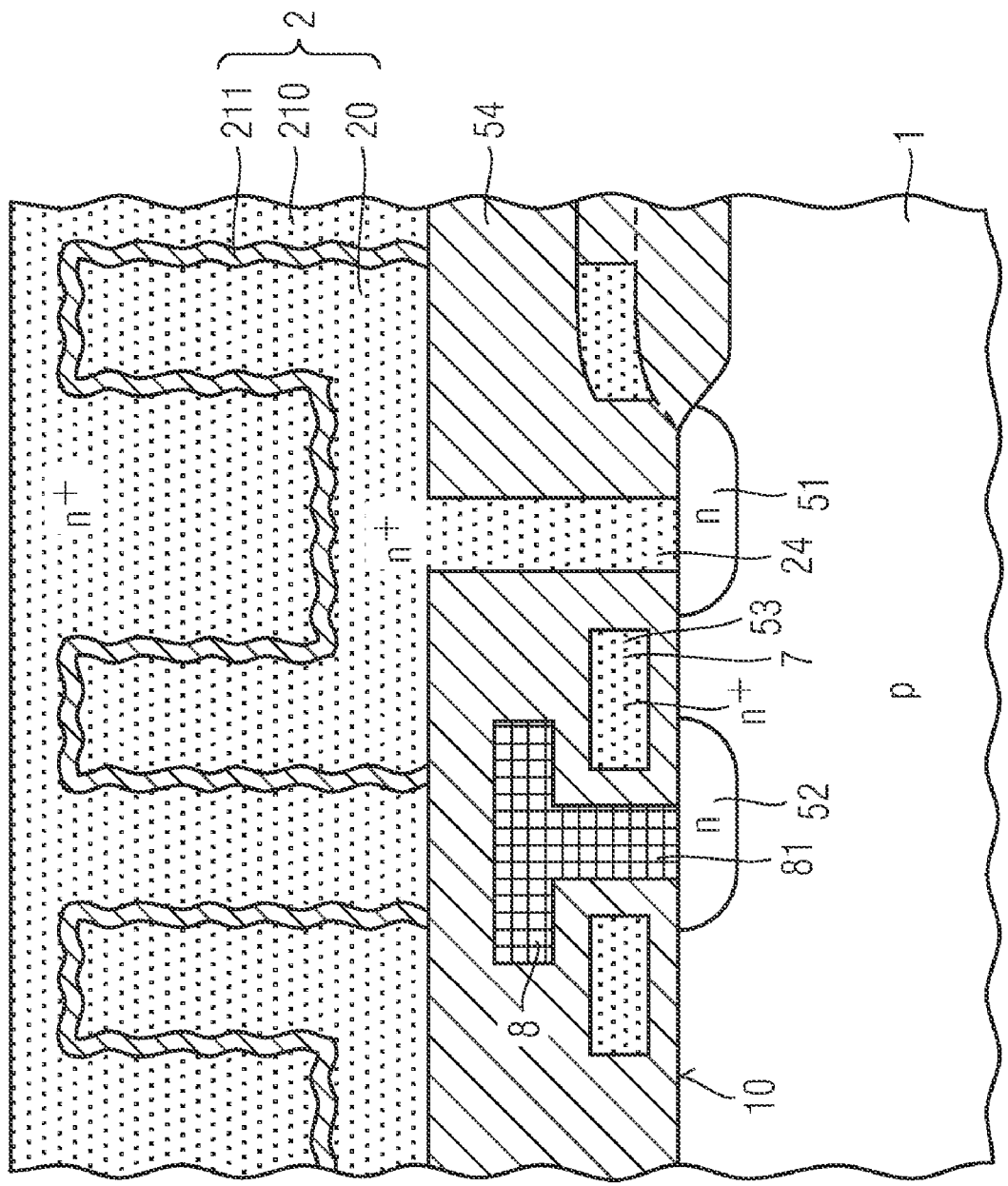
FIG. 10 illustrates a cross-sectional view of a conventional DRAM memory cell.

FIG. 9 illustrates a cross-sectional view of an exemplary DRAM memory cell incorporating the capacitor 2 according to an embodiment. As is illustrated in FIG. 9, the access transistor of the DRAM memory cell comprises a first and a second source/drain regions 51, 52, a gate electrode 53 for controlling the conductivity of a channel 55 which is formed between the first and the second source/drain regions 51, 52. The gate electrode 53 forms part of a word line and is electrically isolated from the silicon substrate material 1, such as a p-doped silicon substrate, by a gate dielectric 57 as is commonly used. The first and second source/drain regions 51, 52 may be, for example, implemented as n-doped portions.

In the illustrated layout, two access transistors are arranged side by side so that they share a common bit line contact (not illustrated in this cross-sectional view), which is connected with the second source/drain region 52. Pairs of adjacent access transistors are electrically isolated from each other by isolation structures 56. The first source/drain region 51 is connected with the capacitor contact 24 via a capacitor contact section 58. The capacitor 2 is formed in a manner as described above. As has been illustrated in the foregoing, a storage capacitor and, thus, a memory cell having a greatly enlarged capacitance is obtained.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

Another embodiment refers to a method of manufacturing a storage capacitor. The method comprises providing a substrate having a surface, said substrate comprising a material, defining a first section of a storage electrode so as to at least partially project from said substrate surface, forming a first dielectric layer covering said substrate surface and said first section of said storage electrode, forming a first conductive layer on said first dielectric layer, providing a first isolating material on the resulting surface, exposing the topmost portion of said first section of said storage electrode, forming a first isolating layer on the resulting surface, defining a second section of said storage electrode so as to be connected with said first section of said storage electrode, forming a second dielectric layer covering said isolating layer and said second section of said storage electrode, and forming a second conductive layer on said second dielectric layer, electrically connecting said first and second conductive layers.

What is claimed is:

1. An integrated circuit comprising a storage capacitor, comprising:
   a storage electrode comprising a first section and a second section,
   a first counter electrode comprising a first portion adjacent to the first section of the storage electrode, and a second portion, which does not extend along the storage electrode;
   a first dielectric layer being disposed between the first portion of the first counter electrode and the storage electrode;
   a second counter electrode comprising a first portion adjacent to a second section of the storage electrode and a second portion which does not extend along the storage electrode; and
   a second dielectric layer being disposed between the first portion of the second counter electrode and the storage electrode; wherein
   the first and the second counter electrodes are electrically connected with each other, the first counter electrode is disposed in a first layer and the second counter electrode is disposed in a second layer above the first layer, and the first and second dielectric layers are not connected with each other.

2. The integrated circuit of claim 1, wherein
   the first portion of the first counter electrode extends in a first direction;
   the first portion of the second counter electrode extends in a second direction; and
   the first direction is equal to the second direction.

3. The integrated circuit of claim 1, wherein at least one of the second portion of the first counter electrode and the second portion of the second counter electrode is parallel with the substrate surface.

4. The integrated circuit of claim 1, wherein the first portion of at least one of the first and second counter electrodes is parallel with the storage electrode.

5. The integrated circuit of claim 1, further comprising
   n further counter electrodes, disposed in a (n+2)-th layer above the (n+1)-th layer respectively, each of the n counter electrodes comprising a first portion adjacent to a (n+2)-th section of the storage electrode, and a second portion which does not extend along the storage electrode; and
   a (n+2)-th dielectric layer being disposed between the first portion of the (n+2)-th counter electrode and the storage electrode;
   wherein all of the first, second and (n+2)-th counter electrodes are electrically connected with each other.

6. The integrated circuit of claim 1, wherein the second portion of individual ones of the counter electrodes is disposed closer to the substrate surface than the first portion of the corresponding one of the counter electrodes, respectively.

7. The integrated circuit of claim 1, wherein the storage electrode is at least partially formed above a substrate surface.

8. The integrated circuit of claim 1, wherein the storage electrode is disposed at an angle of 89 to 91 degrees with respect to a substrate surface, above which the storage capacitor is formed at least partially.

9. The integrated circuit of claim 1, wherein the second portion of at least one of the counter electrodes is parallel with a substrate surface, above which the storage capacitor is formed at least partially.

10. The integrated circuit of claim 5, wherein at least one of the first portions of any of the counter electrodes is parallel with the storage electrode.

11. An integrated circuit comprising a memory cell array comprising:
   transistors and storage capacitors, individual ones of the storage capacitors comprising respectively:

a storage electrode comprising a first section and a second section;

a first counter electrode comprising a first portion adjacent to the first section of the storage electrode, and a second portion, which does not extend along the storage electrode;

a first dielectric layer being disposed between the first portion of the first counter electrode and the storage electrode;

a second counter electrode comprising a first portion adjacent to a second section of the storage electrode and a second portion which does not extend along the storage electrode; and a second dielectric layer being disposed between the first portion of the second counter electrode and the storage electrode, wherein the first and the second counter electrodes are electrically connected with each other, the first counter electrode is disposed in a first layer and the second counter electrode is disposed in a second layer above the first layer, and the first and second dielectric layers are not connected with each other.

12. An integrated circuit comprising a storage capacitor, comprising:

a storage electrode comprising a first section and a second section;

a first counter electrode comprising a first portion adjacent to the first section of the storage electrode, and a second portion, which does not extend along the storage electrode;

a first dielectric layer being disposed between the first portion of the first counter electrode and the storage electrode;

a second counter electrode comprising a first portion adjacent to a second section of the storage electrode, and a second portion which does not extend along the storage electrode; and a second dielectric layer being disposed between the first portion of the second counter electrode and the storage electrode, wherein the first and the second counter electrodes are electrically connected with each other and the first and the second dielectric layers are not connected with each other.

13. The integrated circuit of claim 12, wherein
the first portion of the first counter electrode extends in a first direction;
the first portion of the second counter electrode extends in a second direction; and
the first direction is equal to the second direction.

14. The integrated circuit of claim 12, wherein at least one of the second portions of the first counter electrode and the second portion of the second counter electrode is parallel with the substrate surface.

15. The integrated circuit of claim 12, wherein the first portion of at least one of the first and second counter electrodes is parallel with the storage electrode.

16. The integrated circuit of claim 12, further comprising
n further counter electrodes, disposed in a (n+2)-th layer above the (n+1)-th layer respectively, each of the n counter electrodes comprising a first portion adjacent to a (n+2)-th section of the storage electrode, and a second portion which does not extend along the storage electrode; and a (n+2)-th dielectric layer being disposed between the first portion of the (n+2)-th counter electrode and the storage electrode;

wherein all of the first, second and (n+2)-th counter electrodes are electrically connected with each other.

17. The integrated circuit of claim 12, wherein the second portion of individual ones of the counter electrodes, is disposed closer to the substrate surface than the first portion of the corresponding one of the counter electrodes, respectively.

18. The integrated circuit of claim 12, wherein the storage electrode is at least partially formed above a substrate surface.

19. The integrated circuit of claim 1, wherein the storage electrode is disposed at an angle of 89 to 91 degrees with respect to the substrate surface, above which the storage capacitor is formed at least partially .

20. The integrated circuit of claim 12, wherein the second portion of at least one of the counter electrodes is parallel with a substrate surface, above which the storage capacitor is formed at least partially.

21. The integrated circuit of claim 16, wherein at least one of the first portions of any of the counter electrodes is parallel with the storage electrode.

22. An integrated circuit comprising a memory cell array comprising
transistors and storage capacitors, individual ones of the storage capacitors comprising respectively:

a storage electrode comprising a first section and a second section;

a first counter electrode comprising a first portion adjacent to the first section of the storage electrode, and a second portion, which does not extend along the storage electrode;

a first dielectric layer being disposed between the first portion of the first counter electrode and the storage electrode;

a second counter electrode comprising a first portion adjacent to a second section of the storage electrode, and a second portion which does not extend along the storage electrode; and a second dielectric layer being disposed between the first portion of the second counter electrode and the storage electrode, wherein the first and the second counter electrodes are electrically connected with each other, and the first and the second dielectric layers are not connected with each other.

* * * * *